US012805411B2

(12) United States Patent
Patil et al.

(10) Patent No.: US 12,805,411 B2
(45) Date of Patent: Nov. 17, 2026

(54) PACKAGE COMPRISING A PACKAGE SUBSTRATE THAT INCLUDES AN ENCAPSULATED PORTION WITH INTERCONNECTION PORTION BLOCKS

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 566 days.

(21) Appl. No.: 18/463,882

(22) Filed: Sep. 8, 2023

(65) Prior Publication Data

US 2024/0363513 A1 Oct. 31, 2024

Related U.S. Application Data

(60) Provisional application No. 63/498,487, filed on Apr. 26, 2023.

(51) Int. Cl.
*H10W 90/00* (2026.01)
*H10B 80/00* (2026.01)
(Continued)

(52) U.S. Cl.
CPC .......... *H10W 90/401* (2026.01); *H10B 80/00* (2023.02); *H10W 70/05* (2026.01);
(Continued)

(58) Field of Classification Search
CPC . H10W 90/401; H10W 90/00; H10W 90/722; H10W 90/724; H10W 90/614;
(Continued)

(56) References Cited

U.S. PATENT DOCUMENTS 10,804,204 B2 10/2020 Rubin et al.
10,923,429 B2 2/2021 Braunisch et al.
(Continued)

FOREIGN PATENT DOCUMENTS

JP 4380130 B2 12/2009

OTHER PUBLICATIONS

International Search Report and Written Opinion—PCT/US2024/024652—ISA/EPO—Aug. 27, 2024.

*Primary Examiner* — Dao H Nguyen
(74) *Attorney, Agent, or Firm* — Loza & Loza, LLP

(57) ABSTRACT

A package comprising a package substrate and a first integrated device coupled to the package substrate through a first plurality of solder interconnects. The package substrate comprises a bridge and/or an interposer, an encapsulated portion, a first metallization portion coupled to a first surface of the encapsulated portion, and a second metallization portion coupled to a second surface of the encapsulated portion. The encapsulated portion comprises a first interconnection portion block, a second interconnection portion block, a plurality of pillar interconnects, and an encapsulation layer encapsulating the first interconnection portion block, the second interconnection portion block, and the plurality of pillar interconnects. The plurality of pillar interconnects comprises a first plurality of pillar interconnects coupled to the first interconnection portion block and a second plurality of pillar interconnects coupled to the second interconnection portion block.

25 Claims, 40 Drawing Sheets

CROSS SECTIONAL PROFILE VIEW

(51) Int. Cl.

| | |
|---|---|
| ***H10W 70/05*** | (2026.01) |
| ***H10W 70/60*** | (2026.01) |
| ***H10W 70/685*** | (2026.01) |
| ***H10W 72/00*** | (2026.01) |
| ***H10W 72/20*** | (2026.01) |

(52) U.S. Cl.
CPC ........ *H10W 70/095* (2026.01); *H10W 70/611* (2026.01); *H10W 70/685* (2026.01); *H10W 90/00* (2026.01); *H10W 72/07236* (2026.01); *H10W 72/07254* (2026.01); *H10W 72/247* (2026.01); *H10W 90/722* (2026.01); *H10W 90/724* (2026.01)

(58) Field of Classification Search
CPC . H10W 90/635; H10W 70/05; H10W 70/095; H10W 70/611; H10W 70/685; H10W 70/615; H10W 70/635; H10W 72/07236; H10W 72/07254; H10W 72/247; H10B 80/00
See application file for complete search history.

(56) References Cited

U.S. PATENT DOCUMENTS

| | | | | |
|---|---|---|---|---|
| 11,004,792 | B2 | 5/2021 | Chavali | |
| 11,276,635 | B2 | 3/2022 | Sharan et al. | |
| 2017/0263518 | A1* | 9/2017 | Yu | H10W 72/071 |
| 2019/0385977 | A1* | 12/2019 | Elsherbini | H10W 90/00 |
| 2019/0393153 | A1 | 12/2019 | Wang et al. | |
| 2021/0005542 | A1 | 1/2021 | Mallik et al. | |
| 2021/0098421 | A1* | 4/2021 | Wu | H10W 74/473 |
| 2022/0302003 | A1 | 9/2022 | Pan et al. | |
| 2022/0310577 | A1* | 9/2022 | Lee | H10W 90/00 |
| 2023/0086691 | A1 | 3/2023 | Srinivasan et al. | |
| 2023/0290746 | A1* | 9/2023 | Su | H10D 1/042 |
| 2024/0363514 | A1 | 10/2024 | Patil et al. | |

* cited by examiner

CROSS SECTIONAL PROFILE VIEW

CROSS SECTIONAL PROFILE VIEW

PLAN VIEW

CROSS SECTIONAL PROFILE VIEW

CROSS SECTIONAL PROFILE VIEW

CROSS SECTIONAL PROFILE VIEW

CROSS SECTIONAL PROFILE VIEW

*CROSS SECTIONAL PROFILE VIEW*

*CROSS SECTIONAL PROFILE VIEW*

*CROSS SECTIONAL PROFILE VIEW*

*CROSS SECTIONAL PROFILE VIEW*

*CROSS SECTIONAL PROFILE VIEW*

CROSS SECTIONAL PROFILE VIEW

PACKAGE COMPRISING A PACKAGE SUBSTRATE THAT INCLUDES AN ENCAPSULATED PORTION WITH INTERCONNECTION PORTION BLOCKS

CROSS-REFERENCE TO RELATED APPLICATION

This application claims priority to and the benefit of Provisional Application Ser. No. 63/498,487 filed in the United States Patent and Trademark Office on Apr. 26, 2023, the entire content of which is incorporated herein by reference as if fully set forth below in its entirety and for all applicable purposes.

FIELD

Various features relate to a package comprising an integrated device and a package substrate.

BACKGROUND

A package may include a package substrate and an integrated device. These components are coupled together to provide a package that may perform various electrical functions. How the integrated device and the package substrate are coupled together affects how the package performs overall. There is an ongoing need to provide packages with improved performances.

SUMMARY

Various features relate to a package comprising an integrated device and a package substrate.

One example provides a package that includes a package substrate and an integrated device. The package substrate comprises a bridge and/or an interposer, an encapsulated portion, a first metallization portion coupled to a first surface of the encapsulated portion, a second metallization portion coupled to a second surface of the encapsulated portion, and a first integrated device coupled to the package substrate through a first plurality of solder interconnects. The encapsulated portion comprises a first interconnection portion block, a second interconnection portion block, a plurality of pillar interconnects, and an encapsulation layer encapsulating the first interconnection portion block, the second interconnection portion block, and the plurality of pillar interconnects. The second interconnection portion block is a different type of interconnection portion block from the first interconnection portion block. The plurality of pillar interconnects comprises a first plurality of pillar interconnects coupled to the first interconnection portion block; and a second plurality of pillar interconnects coupled to the second interconnection portion block.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a package substrate and a first integrated device coupled to the package substrate through a first plurality of solder interconnects. The package substrate comprises an encapsulated portion, a first metallization portion coupled to a first surface of the encapsulated portion, and a second metallization portion coupled to a second surface of the encapsulated portion. The encapsulated portion comprises a first interconnection portion block, a second interconnection portion block, a plurality of pillar interconnects, and an encapsulation layer encapsulating the first interconnection portion block, the second interconnection portion block, and the plurality of pillar interconnects. The second interconnection portion block is a different type of interconnection portion block from the first interconnection portion block. The plurality of pillar interconnects comprises a first plurality of pillar interconnects coupled to the first interconnection portion block, and a second plurality of pillar interconnects coupled to the second interconnection portion block. The package substrate may include a bridge and/or an interposer. As will be further described below, the use of an encapsulated portion that includes different types of interconnection portion blocks provides several technical advantages, including the ability to customize and optimize the interconnects in order to provide a package with improved performance and lower overall fabrication costs.

Figure 1:
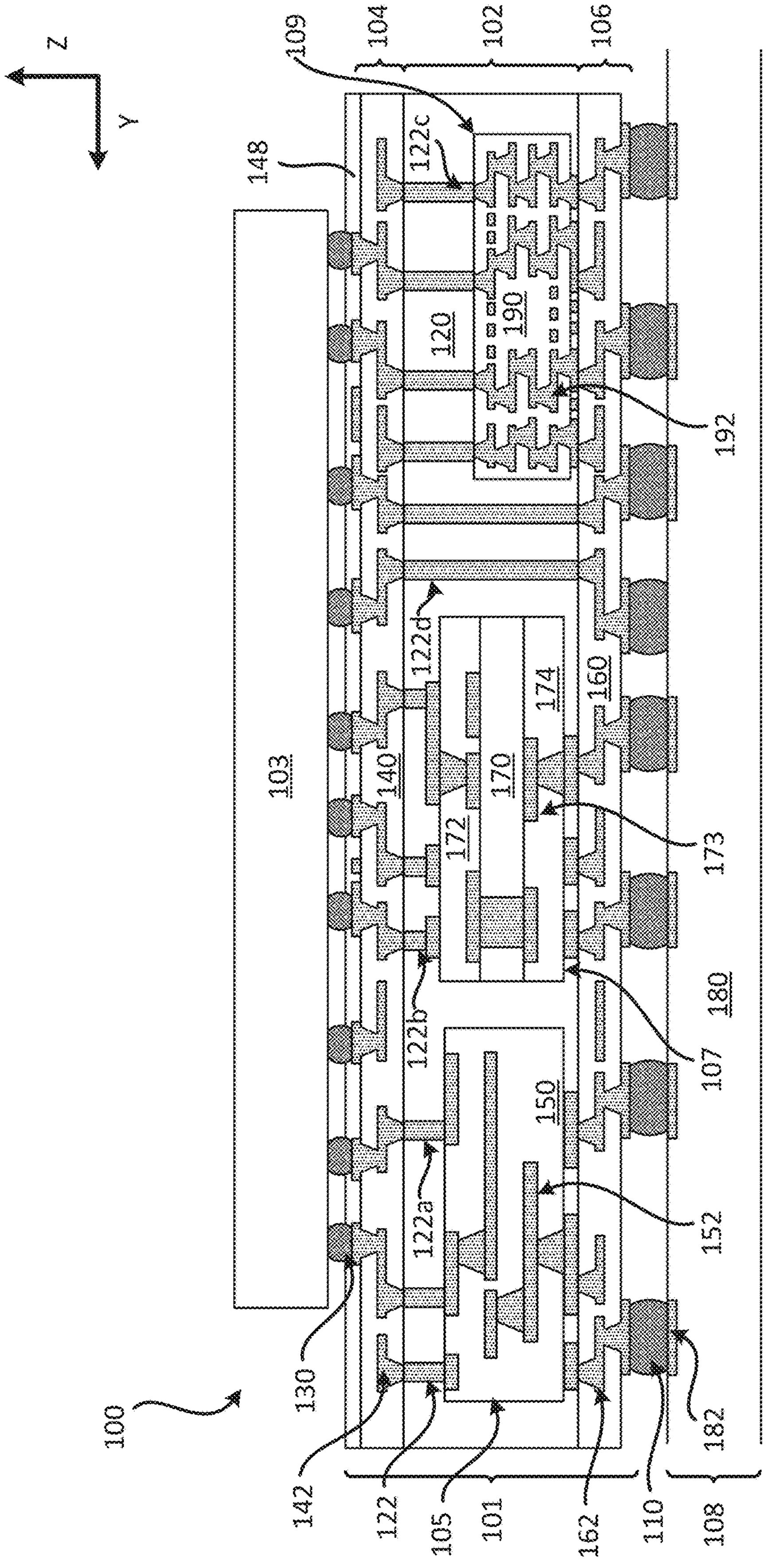
FIG. 1 illustrates a cross sectional profile view of an exemplary package comprising a package substrate with encapsulated portion with several interconnection portion blocks.

Exemplary Package Comprising a Package Substrate that Includes an Encapsulated Portion with Interconnection Portion Blocks FIG. 1 illustrates a cross sectional profile view of a package 100 that includes a package substrate with an encapsulated portion comprising several interconnection portion blocks. The package 100 is coupled to a board 108 through a plurality of solder interconnects 110. The board 108 includes at least one board dielectric layer 180 and a plurality of board interconnects 182. The board 108 may include a printed circuit board (PCB). The package 100 includes a package substrate 101 and an integrated device 103. The integrated device 103 is coupled to the package substrate 101 through a plurality of solder interconnects 130. There may be a plurality of pillar interconnects (not shown) between the integrated device 103 and the plurality of solder interconnects 130. In some implementations, the plurality of pillar interconnects (not shown) coupled to the integrated device 103 and the plurality of solder interconnects 130, are considered part of the integrated device 103. The integrated device 103 may be a first integrated device.

The package substrate 101 includes an encapsulated portion 102, a metallization portion 104 (e.g., first metallization portion) and a metallization portion 106 (e.g., second metallization portion). The metallization portion 104 may be coupled to a first surface (e.g., top surface) of the encapsulated portion 102. The metallization portion 104 includes at least one dielectric layer 140 and a plurality of metallization interconnects 142 (e.g., first plurality of metallization interconnects). The metallization portion 104 may include a redistribution portion. The plurality of metallization interconnects 142 may include a plurality of redistribution interconnects (e.g., first plurality of redistribution interconnects). The integrated device 103 is coupled to the plurality of metallization interconnects 142 through the plurality of solder interconnects 130. A solder resist layer 148 is coupled to the metallization portion 104. The solder resist layer 148 may be part of the metallization portion 104.

The metallization portion 106 may be coupled to a second surface (e.g., bottom surface) of the encapsulated portion 102. The metallization portion 106 includes at least one dielectric layer 160 and a plurality of metallization interconnects 162 (e.g., second plurality of metallization interconnects). The metallization portion 106 may include a redistribution portion. The plurality of metallization interconnects 162 may include a plurality of redistribution interconnects (e.g., second plurality of redistribution interconnects).

The encapsulated portion 102 is located between the metallization portion 104 and the metallization portion 106. The encapsulated portion 102 includes an interconnection portion block 105 (e.g., first interconnection portion block, second interconnection portion block, third interconnection portion block), an interconnection portion block 107 (e.g., first interconnection portion block, second interconnection portion block, third interconnection portion block), an interconnection portion block 109 (e.g., first interconnection portion block, second interconnection portion block, third interconnection portion block), a plurality of pillar interconnects 122 and an encapsulation layer 120. The encapsulation layer 120 encapsulates the interconnection portion block 105, the interconnection portion block 107, the interconnection portion block 109 and the plurality of pillar interconnects 122. An encapsulation layer (e.g., 120) may include a mold, a resin and/or an epoxy. The encapsulation layer may be a means for encapsulation. The encapsulation layer may be provided by using a compression and transfer molding process, a sheet molding process, or a liquid molding process. In some implementations, the encapsulation layer 120 may include a different material than the at least one dielectric layer 140 of the metallization portion 104 and the at least one dielectric layer 160 of the metallization portion 106. In some implementations, the encapsulation layer 120 may include a different material than the at least one dielectric layer 150 of the interconnection portion block 105, the dielectric layers (e.g., 170, 172, 174) of the interconnection portion block 107, and the at least one dielectric layer 190 of the interconnection portion block 109.

As will be further described below, the interconnection portion block 105, the interconnection portion block 107 and/or the interconnection portion block 109 may include different types of interconnection portion block. Examples of types of interconnection portion blocks include a coreless substrate block, a cored substrate block, a metallization portion block, a redistribution portion block and/or a die block comprising through substrate vias. The different types of interconnection portion blocks may have different properties. For example, different types of interconnection portion blocks may include interconnects with different minimum width (e.g., minimum line width), minimum spacing and/or minimum pitch.

The interconnection portion block 105 includes at least one dielectric layer 150 and a plurality of interconnects 152. The interconnection portion block 105 may include a coreless substrate block (e.g., embedded trace substrate block).

The interconnection portion block 107 includes a core layer 170, at least one dielectric layer 172, at least one dielectric layer 174 and a plurality of interconnects 173. The interconnection portion block 107 may include a cored substrate block.

The interconnection portion block 109 includes at least one dielectric layer 190 and a plurality of interconnects 192. The interconnection portion block 109 may include a metallization portion block (e.g., redistribution portion block).

The plurality of pillar interconnects 122 may include a first plurality of pillar interconnects 122*a*, a second plurality of pillar interconnects 122*b*, a third plurality of pillar interconnects 122*c*, and a fourth plurality of pillar interconnects 122*d*.

The first plurality of pillar interconnects 122*a* may be coupled to the metallization portion 104 and the interconnection portion block 105. The second plurality of pillar interconnects 122*b* may be coupled to the metallization portion 104 and the interconnection portion block 107. The third plurality of pillar interconnects 122*c* may be coupled to the metallization portion 104 and the interconnection portion block 109. The fourth plurality of pillar interconnects 122*d* may be coupled to the metallization portion 104 and the metallization portion 106.

The interconnection portion block 105 is coupled to the metallization portion 106. One or more interconnects from the plurality of interconnects 152 may be coupled to and touching metallization interconnects from the plurality of metallization interconnects 162 of the metallization portion 106. The interconnection portion block 107 is coupled to the metallization portion 106. One or more interconnects from the plurality of interconnects 173 may be coupled to and touching metallization interconnects from the plurality of metallization interconnects 162 of the metallization portion 106. The interconnection portion block 109 is coupled to the metallization portion 106. One or more interconnects from the plurality of interconnects 192 may be coupled to and touching metallization interconnects from the plurality of metallization interconnects 162 of the metallization portion 106.

An interconnection portion block may be a structure that is configured to provide one or more electrical paths through interconnects (e.g., block interconnects) that are at least located partially in the interconnection portion block.

As will be further described below, power, ground and/or different signals (e.g., input/output signals) may extend through the different interconnection portion blocks to and/or from the integrated device 103.

Figure 2:
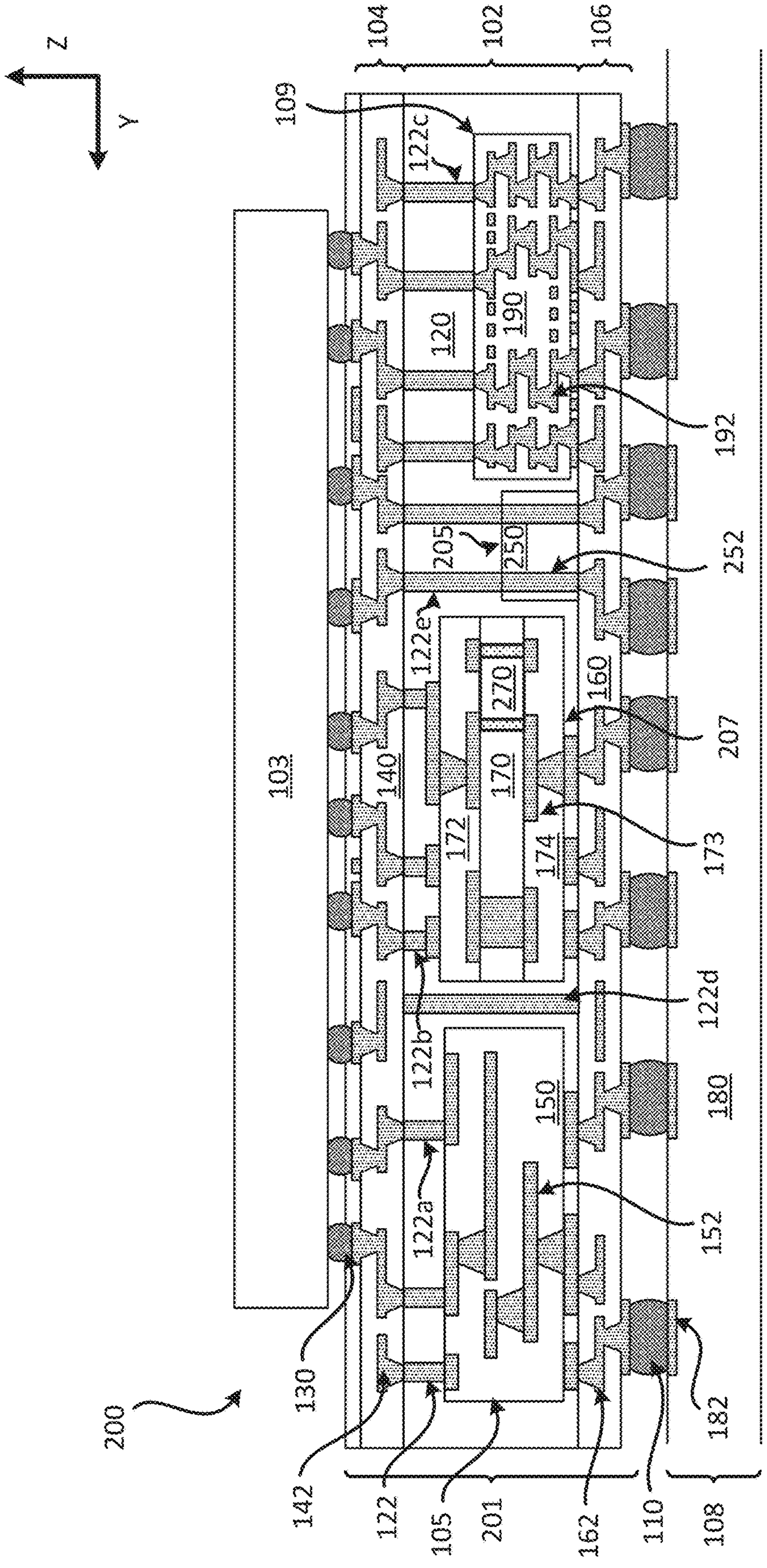
FIG. 2 illustrates a cross sectional profile view of another exemplary package comprising a package substrate with an encapsulated portion with several interconnection portion blocks.

FIG. 2 illustrates a cross sectional profile view of a package 200 that includes a package substrate with an encapsulated portion comprising several interconnection portion blocks. The package 200 is similar to the package 100, and includes similar components as the package 100. One difference is that the package 200 includes a different combination of types of interconnection portion blocks.

The package 200 includes a package substrate 201 and the integrated device 103. The integrated device 103 is coupled to the package substrate 201 through a plurality of solder interconnects 130. There may be a plurality of pillar interconnects (not shown) between the integrated device 103 and the plurality of solder interconnects 130. In some implementations, the plurality of pillar interconnects (not shown) coupled to the integrated device 103 and the plurality of solder interconnects 130, are considered part of the integrated device 103.

The package substrate 201 includes an encapsulated portion 102, a metallization portion 104 (e.g., first metallization portion) and a metallization portion 106 (e.g., second metallization portion). The metallization portion 104 may be coupled to a first surface (e.g., top surface) of the encapsulated portion 102. The metallization portion 104 includes at least one dielectric layer 140 and a plurality of metallization interconnects 142 (e.g., first plurality of metallization interconnects). The metallization portion 104 may include a redistribution portion. The plurality of metallization interconnects 142 may include a plurality of redistribution interconnects (e.g., first plurality of redistribution interconnects). The integrated device 103 is coupled to the plurality of metallization interconnects 142 through the plurality of solder interconnects 130. A solder resist layer 148 is coupled to the metallization portion 104. The solder resist layer 148 may be part of the metallization portion 104.

The metallization portion 106 may be coupled to a second surface (e.g., bottom surface) of the encapsulated portion 102. The metallization portion 106 includes at least one dielectric layer 160 and a plurality of metallization interconnects 162 (e.g., second plurality of metallization interconnects). The metallization portion 106 may include a redistribution portion. The plurality of metallization interconnects 162 may include a plurality of redistribution interconnects (e.g., second plurality of redistribution interconnects).

The encapsulated portion 102 is located between the metallization portion 104 and the metallization portion 106. The metallization portion 104 may be coupled to a first surface of the encapsulated portion 102. The metallization portion 106 may be coupled to a second surface of the encapsulated portion 102. The encapsulated portion 102 includes an interconnection portion block 105 (e.g., first interconnection portion block, second interconnection portion block, third interconnection portion block, fourth interconnection portion block), an interconnection portion block 109 (e.g., first interconnection portion block, second interconnection portion block, third interconnection portion block, fourth interconnection portion block), an interconnection portion block 205 (e.g., first interconnection portion block, second interconnection portion block, third interconnection portion block, fourth interconnection portion block), an interconnection portion block 207 (e.g., first interconnection portion block, second interconnection portion block, third interconnection portion block, fourth interconnection portion block), a plurality of pillar interconnects 122 and an encapsulation layer 120. The encapsulation layer 120 encapsulates the interconnection portion block 105, the interconnection portion block 109, the interconnection portion block 205, the interconnection portion block 207 and the plurality of pillar interconnects 122. In some implementations, the encapsulation layer 120 may include a different material than the at least one dielectric layer 140 of the metallization portion 104 and the at least one dielectric layer 160 of the metallization portion 106. In some implementations, the encapsulation layer 120 may include a different material than the at least one dielectric layer 150 of the interconnection portion block 105, the dielectric layers (e.g., 170, 172, 174) of the interconnection portion block 207, and the at least one dielectric layer 190 of the interconnection portion block 109.

The interconnection portion block 105 includes at least one dielectric layer 150 and a plurality of interconnects 152. The interconnection portion block 105 may include a coreless substrate block (e.g., embedded trace substrate block).

The interconnection portion block 109 includes at least one dielectric layer 190 and a plurality of interconnects 192. The interconnection portion block 109 may include a metallization portion block (e.g., redistribution portion block).

The interconnection portion block 205 includes a die substrate (e.g., silicon substrate) and a plurality of interconnects 252. The plurality of interconnects 252 may include through substrate vias (e.g., through silicon vias). The interconnection portion block 205 may include die that includes vias.

The interconnection portion block 207 includes a core layer 170, at least one dielectric layer 172, at least one dielectric layer 174, a plurality of interconnects 173 and a passive device 270. The interconnection portion block 207 may include an embedded passive substrate block. The passive device 270 may be a capacitor that is embedded in a cored substrate. The passive device 270 may be a discrete passive device.

The plurality of pillar interconnects 122 may include a first plurality of pillar interconnects 122*a*, a second plurality of pillar interconnects 122*b*, a third plurality of pillar interconnects 122*c*, a fourth plurality of pillar interconnects 122*d*, and a plurality of pillar interconnects 122*e*.

The first plurality of pillar interconnects 122*a* may be coupled to the metallization portion 104 and the interconnection portion block 105. The second plurality of pillar interconnects 122*b* may be coupled to the metallization portion 104 and the interconnection portion block 207. The third plurality of pillar interconnects 122*c* may be coupled to the metallization portion 104 and the interconnection portion block 109. The fourth plurality of pillar interconnects 122*d* may be coupled to the metallization portion 104 and the metallization portion 106. The fifth plurality of pillar interconnects 122*e* may be coupled to the metallization portion 104 and the interconnection portion block 205.

The interconnection portion block 105 is coupled to the metallization portion 106. One or more interconnects from the plurality of interconnects 152 may be coupled to and touching metallization interconnects from the plurality of metallization interconnects 162 of the metallization portion 106. The interconnection portion block 109 is coupled to the metallization portion 106. One or more interconnects from the plurality of interconnects 192 may be coupled to and touching metallization interconnects from the plurality of metallization interconnects 162 of the metallization portion 106. The interconnection portion block 205 is coupled to the metallization portion 106. One or more interconnects from the plurality of interconnects 252 may be coupled to and touching metallization interconnects from the plurality of metallization interconnects 162 of the metallization portion 106. The interconnection portion block 207 is coupled to the metallization portion 106. One or more interconnects from the plurality of interconnects 173 may be coupled to and touching metallization interconnects from the plurality of metallization interconnects 162 of the metallization portion 106.

Figure 3:
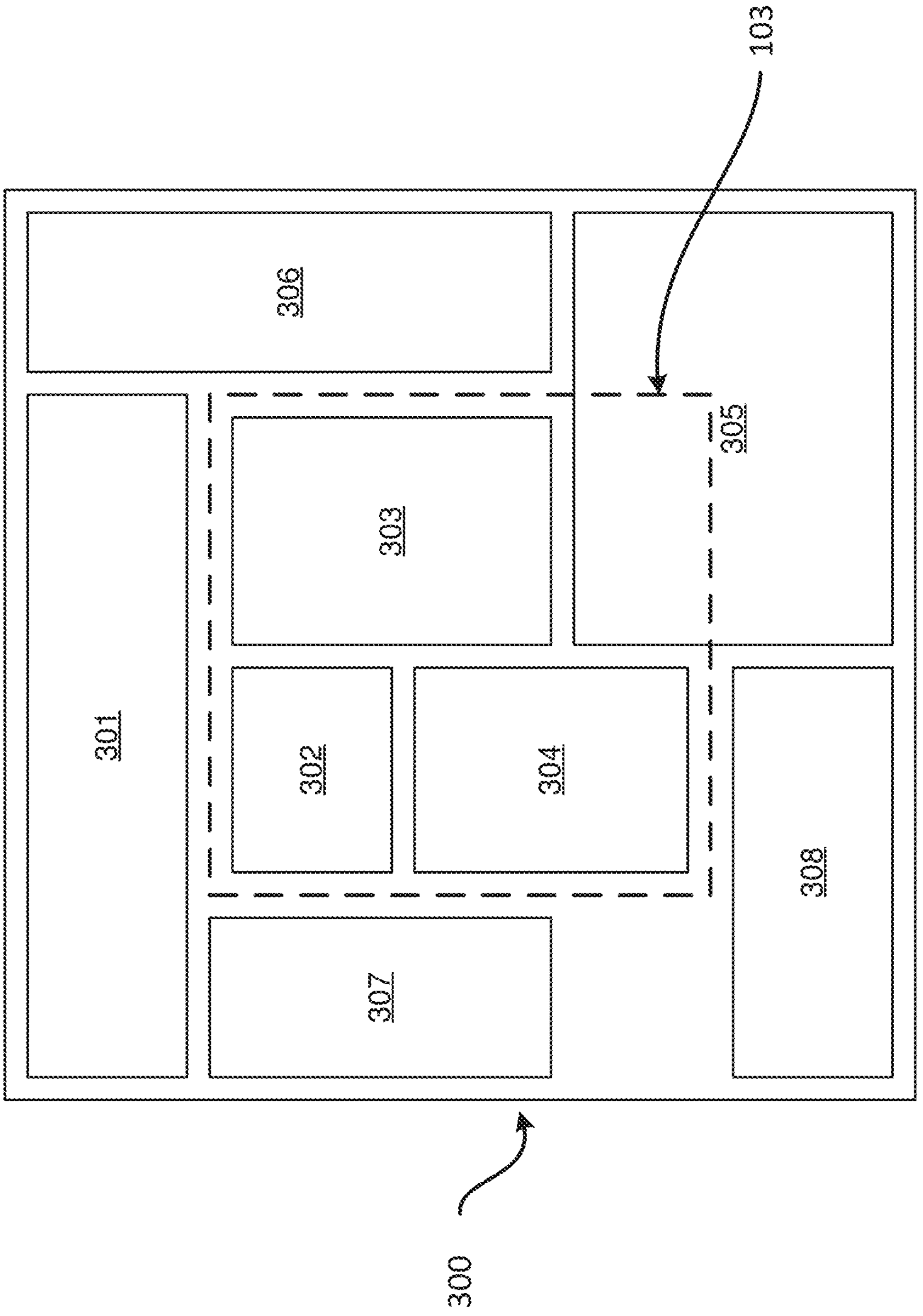
FIG. 3 illustrates a plan view of an exemplary package substrate with an encapsulated portion with several interconnection portion blocks.

FIG. 3 illustrates a plan view of a package substrate 300 that includes various interconnection portion blocks. The package substrate 300 may represent the package substrate 101, the package substrate 201 and/or any of the package substrate described in the disclosure. The package substrate 300 includes an interconnection portion block 301, an interconnection portion block 302, an interconnection portion block 303, an interconnection portion block 304, an interconnection portion block 305, an interconnection portion block 306, an interconnection portion block 307, and an interconnection portion block 308. Each interconnection portion block may be located in an encapsulated portion (e.g., 102) of the package substrate 300. An interconnection portion block may include a coreless substrate block, a cored substrate block, a metallization portion block, a redistribution portion block and/or a die block comprising through substrate vias. A cored substrate block may include a passive device located in the cored substrate block, as described in FIG. 2. Examples of different types of interconnection portion blocks are further described below in at least FIGS. 5-9.

FIG. 3 illustrates an example of how an integrated device 103 may vertically overlap with the package substrate 300. As shown in FIG. 3, the integrated device 103 may vertically overlap (e.g., partial vertical overlap, complete vertical overlap) with the interconnection portion block 302, the interconnection portion block 303, the interconnection portion block 304 and the interconnection portion block 305. Different implementations may have the integrated device 103 vertically overlap differently with a package substrate and/or interconnection portion blocks of a package substrate.

Power, ground and/or input/output signals to and/or from the integrated device 103 may extend through one or more electrical paths that include the interconnection portion block 301, the interconnection portion block 302, the interconnection portion block 303, an interconnection portion block 304, the interconnection portion block 305, the interconnection portion block 306, the interconnection portion block 307, and/or the interconnection portion block 308. Examples of electrical paths for packages are further described below in detail in at least FIGS. 10-11.

In one example, the interconnection portion block 301 may be configured for providing electrical paths for high speed input/output signals to and/from memory of one or more integrated devices, which may require fine line width and spacing, and thin dielectric layers between metal layers. The interconnection portion block 301 may be implemented as a metallization portion block (e.g., redistribution portion block).

In one example, the interconnection portion block 302 and/or the interconnection portion block 304 may be configured for providing power to one or more integrated devices, which may require thick interconnects for efficient power delivery to the integrated device 103. The interconnection portion block 302 and/or the interconnection portion block 304 may be implemented as a laminate substate block (e.g., coreless substrate block, cored substrate block).

In one example, the interconnection portion block 303 may be configured to provide electrical paths for a power distribution network (PDN) (e.g., PDN power rails). The interconnection portion block 303 may be implemented as a die block comprising through substrate vias.

In one example, the interconnection portion block 305 may be configured to provide electrical paths for input/output signals (e.g., I/O signals). The interconnection portion block 305 may be implemented as a partial integrated device shadow block and a peripheral region block for a package. As an example, the interconnection portion block 305 may be implemented as a metallization portion block (e.g., redistribution portion block).

In one example, the interconnection portion block 306 and/or the interconnection portion block 308 may be configured for providing electrical paths for high speed input/output signals to and/from one or more integrated devices, which may require fine line width and spacing, and thick dielectric layers between metal layers. The interconnection portion block 306 and/or the interconnection portion block 308 may be implemented as a metallization portion block (e.g., redistribution portion block).

In one example, the interconnection portion block 307 may be configured for providing electrical paths for high speed input/output signals to and/from memory of one or more integrated devices, which may require ultra-fine line width and spacing. The interconnection portion block 307 may be implemented as a die block or a metallization portion block (e.g., redistribution portion block).

The use of various types of interconnection portion blocks allows a package substrate to be customized and/or optimized in such a way that electrical paths for different portions of one or more integrated device includes interconnects that are fabricated and/or formed using an optimal substrate fabrication technology that provides the best possible performance for the integrated devices. An integrated device may include several cores that are configured for different functions. Different interconnection portion blocks may be used to provide electrical paths for different cores of the integrated device. FIG. 3 illustrates one integrated device. However, in some implementations, two or more integrated device may be coupled to the package substrate 300. In some implementations, one interconnection portion block may be used to provide (i) a first electrical path for a first integrated device and (ii) a second electrical path for a second integrated device. FIG. 3 is merely an example of a possible configuration of a package substrate. Different implementations of a package substrate may include a different number of interconnection portion blocks, a different combination of interconnection portion blocks and/or interconnection portion blocks with different sizes and/or shapes.

Figure 4:
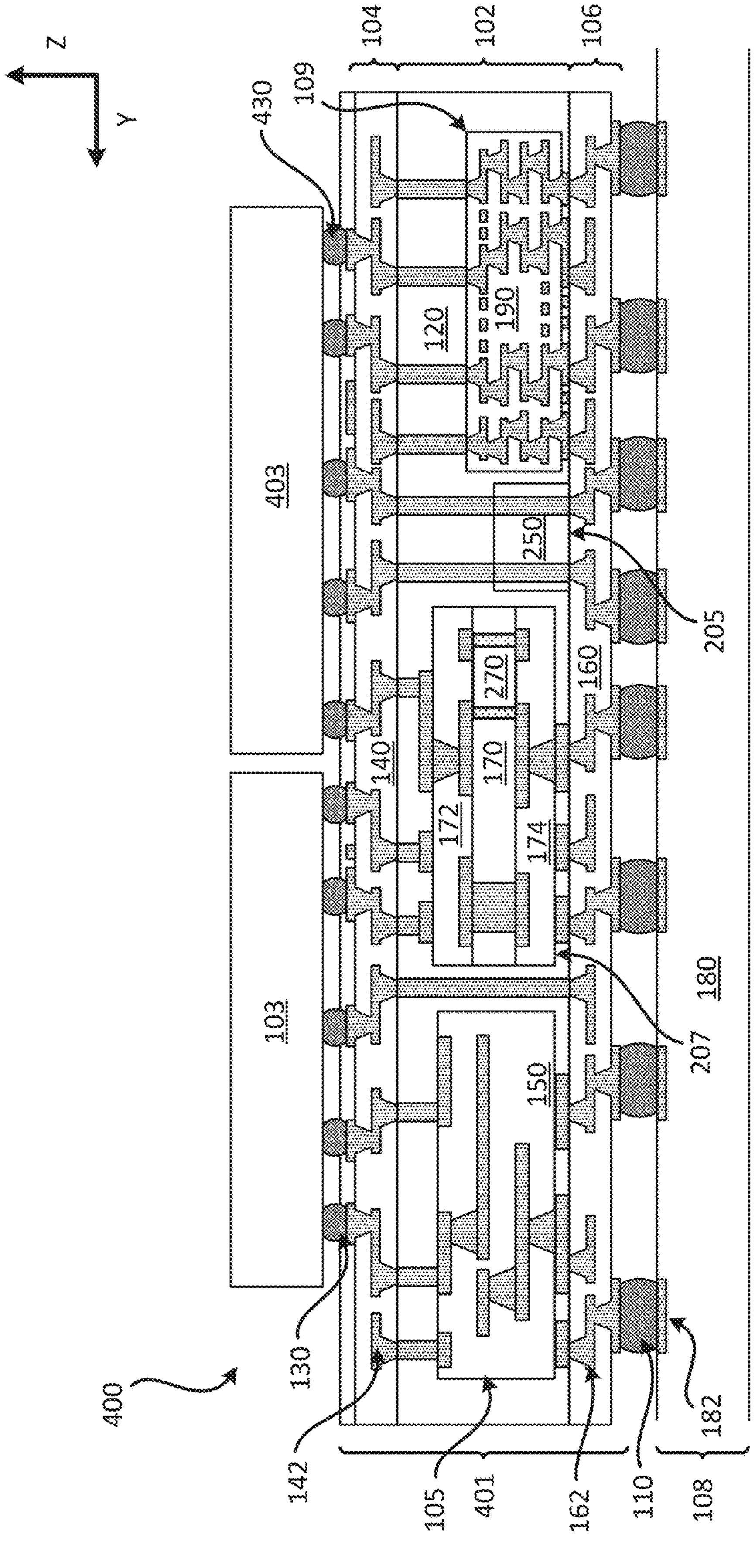
FIG. 4 illustrates a cross sectional profile view of another exemplary package comprising a package substrate with an encapsulated portion with several interconnection portion blocks.

FIG. 4 illustrates a cross sectional profile view of a package 400 that includes a package substrate with an encapsulated portion comprising several interconnection portion blocks. The package 400 is similar to the package 200, and includes similar components as the package 200. One difference is that the package 400 includes several integrated devices coupled to a package substrate.

The package 400 includes a package substrate 401, an integrated device 103 and an integrated device 403. The integrated device 103 is coupled to the package substrate 401 through a plurality of solder interconnects 130. There may be a plurality of pillar interconnects (not shown) between the integrated device 103 and the plurality of solder interconnects 130. In some implementations, the plurality of pillar interconnects (not shown) coupled to the integrated device 103 and the plurality of solder interconnects 130, are considered part of the integrated device 103.

The integrated device 403 is coupled to the package substrate 401 through a plurality of solder interconnects 430. There may be a plurality of pillar interconnects (not shown) between the integrated device 403 and the plurality of solder interconnects 430. In some implementations, the plurality of pillar interconnects (not shown) coupled to the integrated device 403 and the plurality of solder interconnects 430, are considered part of the integrated device 403.

The package substrate 401 includes an encapsulated portion 102, a metallization portion 104 (e.g., first metallization portion) and a metallization portion 106 (e.g., second metallization portion). The metallization portion 104 may be coupled to a first surface (e.g., top surface) of the encapsulated portion 102. The metallization portion 104 includes at least one dielectric layer 140 and a plurality of metallization interconnects 142 (e.g., first plurality of metallization interconnects). The metallization portion 104 may include a redistribution portion. The plurality of metallization interconnects 142 may include a plurality of redistribution interconnects (e.g., first plurality of redistribution interconnects). The integrated device 103 is coupled to the plurality of metallization interconnects 142 through the plurality of solder interconnects 130. The integrated device 403 is coupled to the plurality of metallization interconnects 142 through the plurality of solder interconnects 430.

The metallization portion 106 may be coupled to a second surface (e.g., bottom surface) of the encapsulated portion 102. The metallization portion 106 includes at least one dielectric layer 160 and a plurality of metallization interconnects 162 (e.g., second plurality of metallization interconnects). The metallization portion 106 may include a redistribution portion. The plurality of metallization interconnects 162 may include a plurality of redistribution interconnects (e.g., second plurality of redistribution interconnects).

The encapsulated portion 102 is located between the metallization portion 104 and the metallization portion 106. The metallization portion 104 may be coupled to a first surface of the encapsulated portion 102. The metallization portion 106 may be coupled to a second surface of the encapsulated portion 102. The encapsulated portion 102 includes an interconnection portion block 105 (e.g., first interconnection portion block, second interconnection portion block, third interconnection portion block, fourth interconnection portion block), an interconnection portion block 109 (e.g., first interconnection portion block, second interconnection portion block, third interconnection portion block, fourth interconnection portion block), an interconnection portion block 205 (e.g., first interconnection portion block, second interconnection portion block, third interconnection portion block, fourth interconnection portion block), an interconnection portion block 207 (e.g., first interconnection portion block, second interconnection portion block, third interconnection portion block, fourth interconnection portion block), a plurality of pillar interconnects 122 and an encapsulation layer 120. The encapsulation layer 120 encapsulates the interconnection portion block 105, the interconnection portion block 109, the interconnection portion block 205, the interconnection portion block 207 and the plurality of pillar interconnects 122. Examples of electrical paths through interconnection portion blocks for the package 400 are further described below in detail in at least FIG. 11.

In some implementations, one of more of integrated devices (e.g., 103, 403) described in the disclosure may be fabricated using the same technology node or two or more different technology nodes. For example, an integrated device (e.g., 103) may be fabricated using a first technology node, and another chiplet (e.g., 403) may be fabricated using a second technology node that is not as advanced as the first technology node. In such an example, the integrated device (e.g., 103) may include components (e.g., interconnects, transistors) that have a first minimum size, and the other chiplet (e.g., 403) may include components (e.g., interconnects, transistors) that have a second minimum size, where the second minimum size is greater than the first minimum size. In some implementations, the integrated device 103 and the integrated device 403 of a package, may be fabricated using the same technology node or different technology nodes. In some implementations, a chiplet (e.g., 103) and another chiplet (e.g., 403) of a package, may be fabricated using the same technology node or different technology nodes.

FIGS. 5-9 illustrate various types of interconnection portion blocks that may be implemented in a package substrate. It is noted that the interconnection portion blocks shown are merely examples. Different implementations may include interconnection portion blocks with different sizes, shapes, configurations, and numbers of metal layers.

Figure 5:
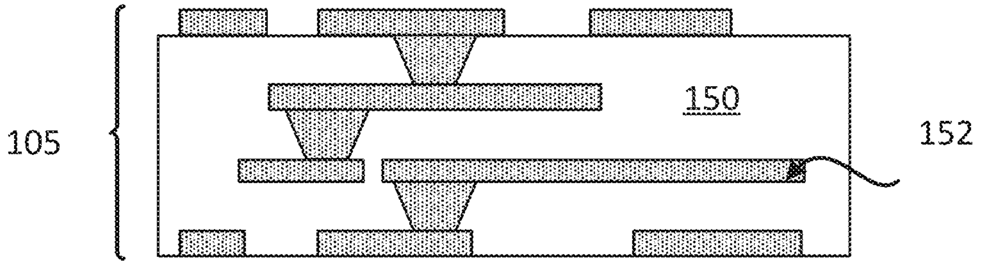
FIG. 5 illustrates a cross sectional profile view of an exemplary interconnection portion block.

FIG. 5 illustrates the interconnection portion block 105 that includes at least one dielectric layer 150 and a plurality of interconnects 152. The interconnection portion block 105 may include a coreless substrate block (e.g., embedded trace substrate block). The interconnection portion block 105 may be a laminated substrate block. The interconnection portion block 105 may have different numbers of metal layers. The interconnection portion block 105 includes interconnects that are embedded in the at least one dielectric layer 150 and surface interconnects that are located on a surface of the at least one dielectric layer 150.

Figure 6:
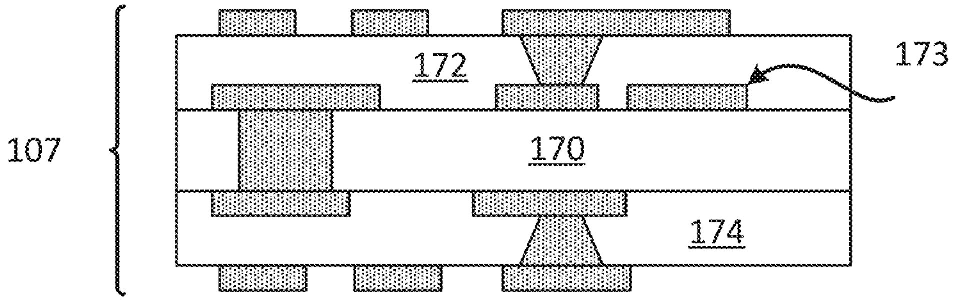
FIG. 6 illustrates a cross sectional profile view of another exemplary interconnection portion block.

FIG. 6 illustrates the interconnection portion block 107 that includes a core layer 170, at least one dielectric layer 172, at least one dielectric layer 174 and a plurality of interconnects 173. The core layer 170 may be dielectric layer. The core layer 170 may include a different dielectric material or a same dielectric material, as the at least one dielectric layer 172 and/or the at least one dielectric layer 174. The interconnection portion block 107 may include a cored substrate block. The interconnection portion block 107 may be a laminated substrate block. The interconnection portion block 107 may have different numbers of metal layers.

Figure 7:
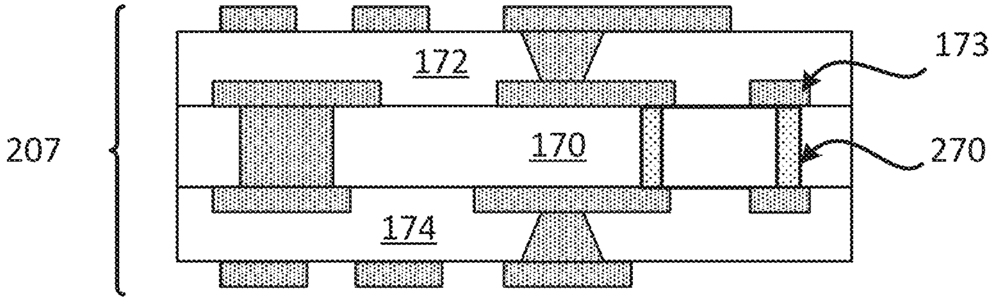
FIG. 7 illustrates a cross sectional profile view of another exemplary interconnection portion block.

FIG. 7 illustrates the interconnection portion block 207 that includes a core layer 170, at least one dielectric layer 172, at least one dielectric layer 174, a plurality of interconnects 173 and a passive device 270. The interconnection portion block 207 may be similar to the interconnection portion block 107. The core layer 170 may be dielectric layer. The core layer 170 may include a different dielectric material or a same dielectric material, as the at least one dielectric layer 172 and/or the at least one dielectric layer 174. The passive device 270 may be a capacitor. The passive device 270 may be located in the core layer 170 of the interconnection portion block 207. The passive device 270 may be laterally surrounded by the core layer 170 of the interconnection portion block 207. Terminals of the passive device 270 may be coupled to interconnects of the plurality of interconnects 173. The interconnection portion block 207 may include a cored substrate block. The interconnection portion block 207 may be a laminated substrate block. The interconnection portion block 207 may be a cored substrate block comprising a passive device. The interconnection portion block 207 may be an embedded passive substrate. The interconnection portion block 207 may have different numbers of metal layers.

Figure 8:
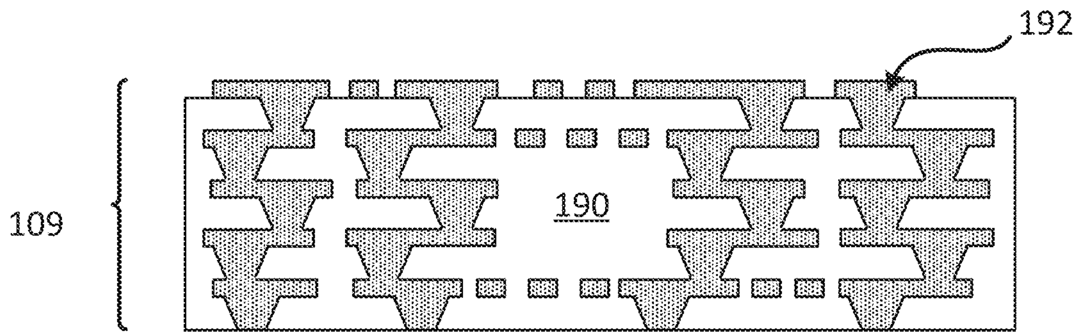
FIG. 8 illustrates a cross sectional profile view of another exemplary interconnection portion block.

FIG. 8 illustrates the interconnection portion block 109 that includes at least one dielectric layer 190 and a plurality of interconnects 192. The interconnection portion block 109 may include a metallization portion block. A metallization portion block may include a redistribution portion that includes redistribution interconnects (e.g., redistribution layer (RDL) interconnects). A redistribution interconnect may include portions that have a U-shape or V-shape. The terms "U-shape" and "V-shape" shall be interchangeable. The terms "U-shape" and "V-shape" may refer to the side profile shape of the interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect). The interconnection portion block 109 may have different numbers of metal layers.

Figure 9:
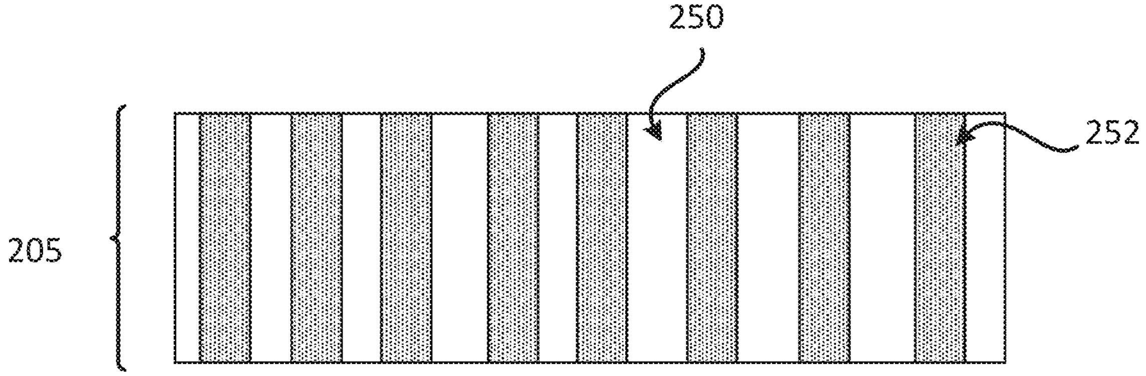
FIG. 9 illustrates a cross sectional profile view of another exemplary interconnection portion block.

FIG. 9 illustrates the interconnection portion block 205 that includes a die substrate 250 (e.g., silicon substrate) and a plurality of interconnects 252. The plurality of interconnects 252 may include through substrate vias (e.g., through silicon vias). The interconnection portion block 205 may include die that includes vias. Although not shown, the interconnection portion block 205 may be include interconnects located on the first surface and/or the second surface of the die substrate 250. These interconnects may be pads that may be coupled to the through substrate vias of the interconnection portion block 205.

The above interconnection portion blocks may be fabricated differently and may have different minimum interconnects sizes. The above interconnection portion blocks may be ideally suited for providing interconnects as electrical paths for different types of current, signals, power and/or ground. Different implementations may use different combinations of the above interconnection portion blocks in an encapsulated portion. In some implementations, two or more of the same type of interconnection portion blocks may be implemented in an encapsulated portion of a package substrate. In such instances, the same type of interconnection portion blocks may have different designs, such as having a different number of metal layers, while still considered to be the same type of interconnection portion block.

Moreover, the above interconnection portion blocks may have different costs associated with them and/or fabrication yields associated with them. Fabrication yields for an interconnection portion blocks affects the overall cost of the interconnection portion block. In some implementations, these costs and/or yields may be considered when determining which interconnection portion blocks to implement in the package substrate of a package.

Different types of interconnection portion blocks may have similar thicknesses or different thicknesses, depending on the design of the interconnection portion blocks. For example, in some implementations, an interconnection portion block that is implemented as a metallization portion block may have more metal layers than another interconnection portion block implemented as a laminate substrate block, but still have an overall thickness that is less than the thickness of the laminate substrate block.

Table 1 below illustrates exemplary values for interconnects and dielectric layers for different types of interconnection portion blocks.

TABLE 1

Exemplary values of features for different interconnection portion blocks.

| TYPE | LAMINATE CORELESS SUBSTRATE | LAMINATE CORED SUBSTRATE | METAL-LIZATION PORTION/ REDIS-TRBUTION PORTION |
|---|---|---|---|
| MINIMUM WIDTH/MINIMUM SPACING OF INTERCONNECTS | 6/8-12/12 (micrometers) | 8/10-15/15 (micrometers) | 2/2-5/5 (micrometers) |
| MINIMUM TRACE INTERCONNECT AND/OR PAD INTERCONNECT THICKNESS | 12-16 (micrometers) | 15-25 (micrometers) | 3-5 (micrometers) |
| MINIMUM DIELECTRIC LAYER THICKNESS BETWEEN METAL LAYERS | 10-50 (micrometers) | 10-50 (micrometers) | 5-15 (micrometers) |
| MINIMUM VIA SIZE (DIAMETER) | 40-60 (micrometers) | 60-300 (micrometers) | 20-40 (micrometers) |

As shown above, interconnects from a metallization portion/redistribution portion have the smallest minimum line width and spacing (2/2 means a minimum line width of 2 micrometers and a minimum spacing of 2 micrometers). Thus, interconnection portion blocks that implement metallization layer/redistribution layer properties may be well suited for high density interconnects that are configured to provide electrical paths for input/output signals (I/O signals). Laminate coreless substrate technology and/or laminate cored substrate technology have higher minimum line width, minimum spacing and minimum interconnect thickness (e.g., relative to a metallization portion) that may be more suited for interconnects that are configured to provide electrical paths for power and/or ground. A cored substrate that includes a passive device, may include the same features and/or properties as the laminate cored substrate. Thus, an interconnection portion block that is implemented as an embedded passive substrate may have a minimum line width, a minimum spacing and/or a minimum interconnect thickness that are similar to those of the laminate cored substrate.

The range in minimum dimensions (e.g., 2/2-5/5) for a particular type of interconnection portion blocks may mean that a type of interconnection portion blocks may be fabricated several ways and the minimum dimensions may be dependent on the type of fabrication process that is used for that particular type of interconnection portion block. Using the example above, a range of 2/2-5/5 means that in some instances, a minimum line width of 2 micrometers and a minimum spacing of 2 micrometers is possible, and in some instances, a minimum line width of 5 micrometers and a minimum spacing of 5 micrometers is possible.

An interconnection portion block that is implemented as a die block that includes through substrate vias may a minimum line width in a range of about 5-150 micrometers and/or a minimum spacing in a range of about 5-150 micrometers. An interconnection portion block that is implemented as a die block with through substrate vias may a minimum height for the vias in a range of about 20-200 micrometers.

There are several advantages to using different types of interconnection portion blocks. One, this type of package substrate may provide better yields compared to other package substrates, which helps reduce the overall cost of the package. Two, this type of package substrate enables different substrate technology to be used and/or selected for different regional routing, which also helps provide better yield. Thus, for example, more expensive substrate technology is used for regions where it is needed, and more cost effective substrate technology is used for regions where the more expensive substrate technology is not needed. Three, this type of package substrate can be easily redesigned, by replacing one of more of the interconnection portion blocks with a different type of interconnection portion blocks, thus avoiding the need to completely redesign the package substrate from scratch. Interconnects on the same metal layer of the package substrate can have different thicknesses by using different types of interconnection portion blocks. Using different interconnect technologies enables a package substrate to be highly customizable and still be cost effective (or not cost prohibitive).

Figure 10:
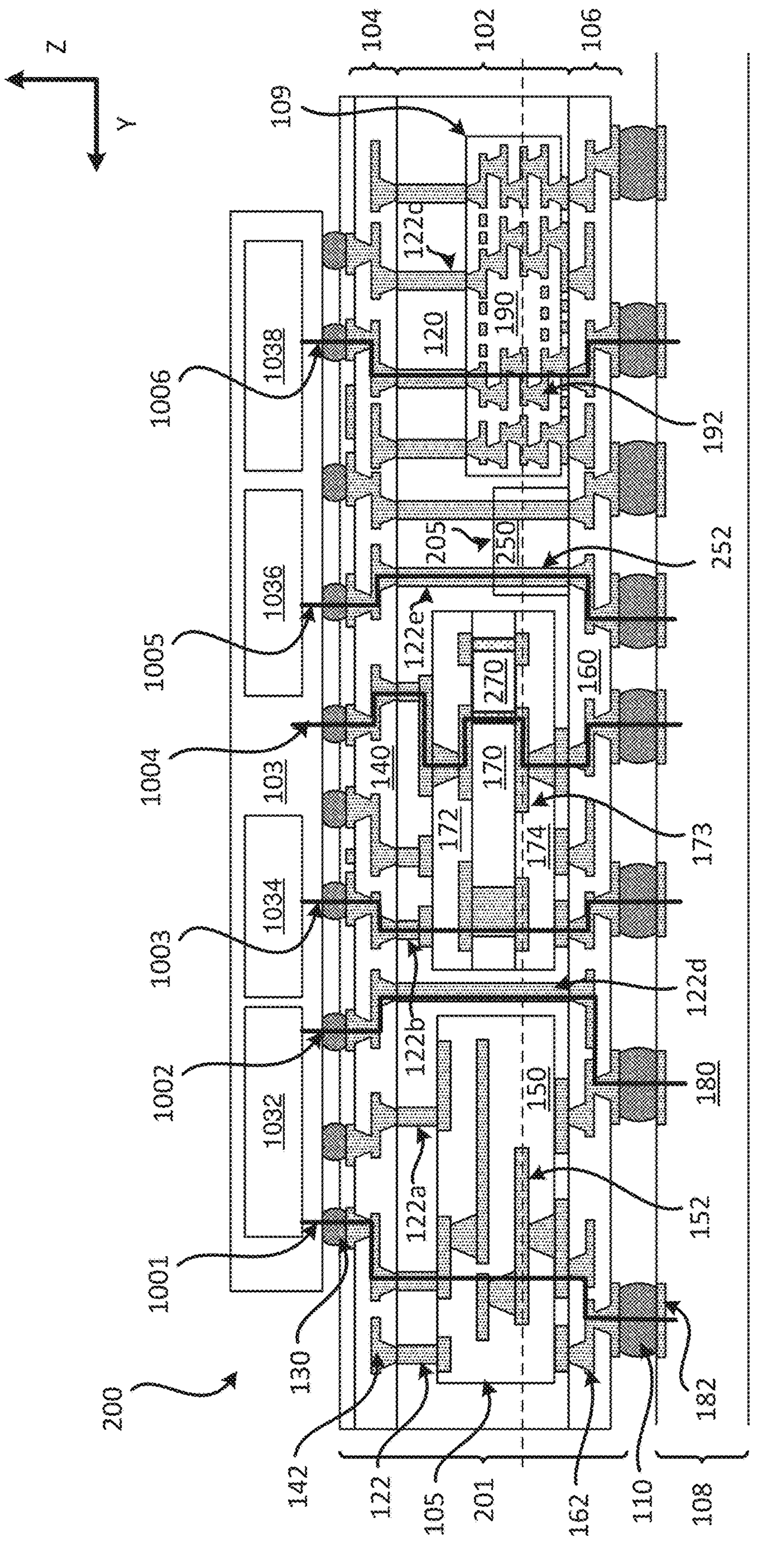
FIG. 10 illustrates examples of electrical paths for a package comprising a package substrate with an encapsulated portion with several interconnection portion blocks.
Figure 11:
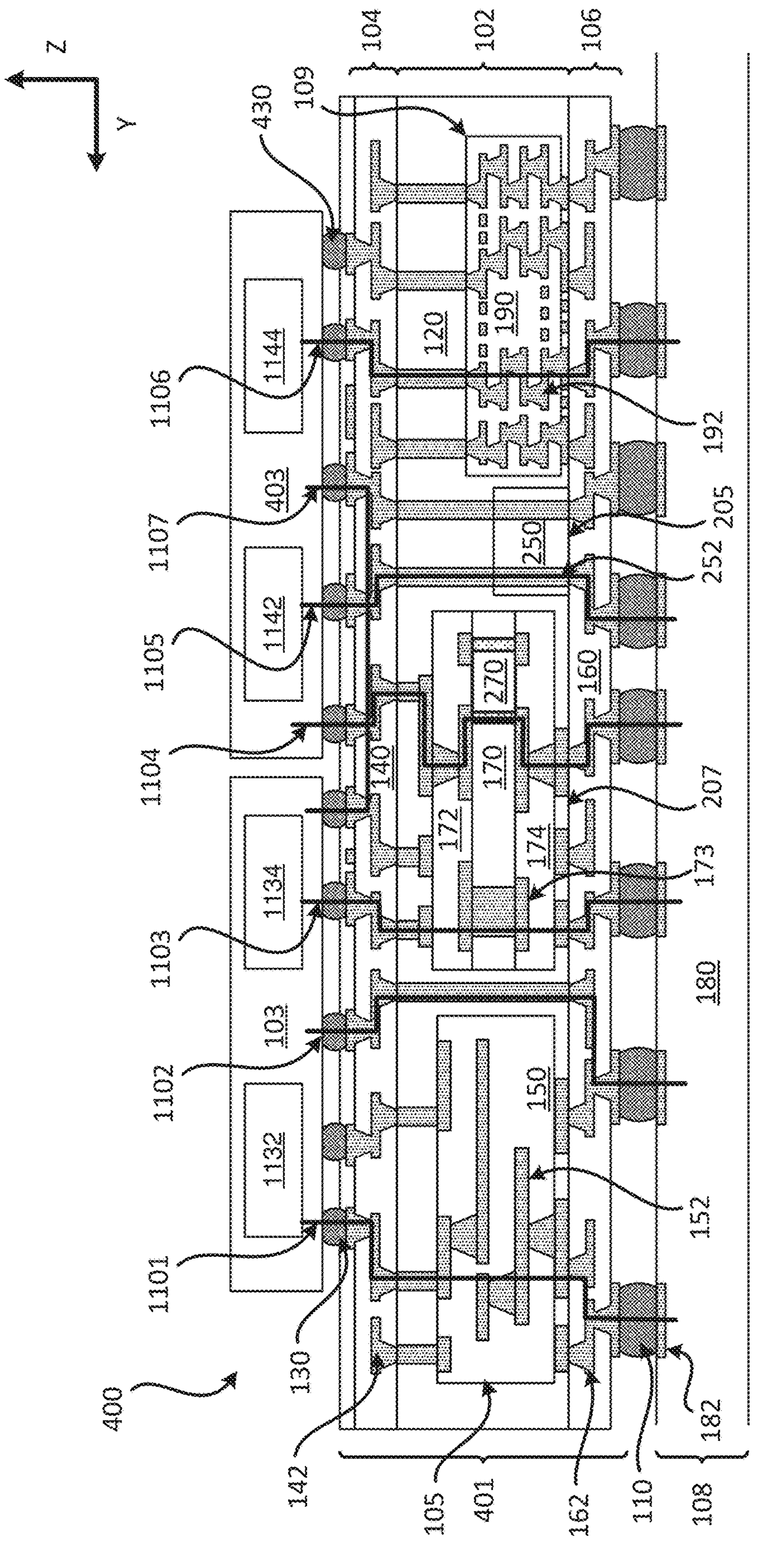
FIG. 11 illustrates examples of electrical paths for another package comprising a package substrate with an encapsulated portion with several interconnection portion blocks.

FIGS. 10 and 11 illustrate exemplary electrical paths between (i) one or more integrated devices of a package and (ii) a board. FIG. 10 illustrates exemplary electrical paths for the package 200 that includes the integrated device 103. The integrated device 103 includes a core 1032, a core 1034, a core 1036 and a core 1038. Each core may be configured to perform one or more functions. A core may include a memory, a processing unit (e.g., central processing unit, graphics processing unit), and/or a modem. FIG. 10 illustrates an electrical path 1001, an electrical path 1002, an electrical path 1003, an electrical path 1004, an electrical path 1005 and an electrical path 1006.

The electrical path 1001 may include an electrical path between the core 1032 of the integrated device 103 and the board 108. However, it is noted that the electrical path 1001 may extend to other components beyond the board 108. The electrical path 1001 between the core 1032 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 152 of the interconnection portion block 105, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1002 may include an electrical path between the core 1032 of the integrated device 103 and the board 108. However, it is noted that the electrical path 1002 may extend to other components beyond the board 108. The electrical path 1002 between the core 1032 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) metallization interconnects from the plurality of metallization interconnects 162 of the metallization portion 106, (v) a solder interconnect from the plurality of solder interconnects 110, and (vi) a board interconnect from the plurality of board interconnects 182.

The electrical path 1003 may include an electrical path between the core 1034 of the integrated device 103 and the board 108. However, it is noted that the electrical path 1003 may extend to other components beyond the board 108. The electrical path 1003 between the core 1034 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1004 may include an electrical path between the integrated device 103 and the board 108. However, it is noted that the electrical path 1004 may extend to other components beyond the board 108. The electrical path 1004 between the integrated device 103 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) the passive device 270, (vi) more interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 1005 may include an electrical path between the core 1036 of the integrated device 103 and the board 108. However, it is noted that the electrical path 1005 may extend to other components beyond the board 108. The electrical path 1005 between the core 1036 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) an interconnect from the plurality of interconnects 252 of the interconnection portion block 205, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1006 may include an electrical path between the core 1038 of the integrated device 103 and the board 108. However, it is noted that the electrical path 1006 may extend to other components beyond the board 108. The electrical path 1006 between the core 1038 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 192 of the interconnection portion block 109, (v) metallization interconnects from the plurality of metallization interconnects 162 of the metallization portion 106, (vi) a solder interconnect from the plurality of solder interconnects 110, and (vii) a board interconnect from the plurality of board interconnects 182.

FIG. 11 illustrates exemplary electrical paths for the package 400 that includes the integrated device 103 and the integrated device 403. The integrated device 103 includes a core 1132 and a core 1134. The integrated device 403 includes a core 1142 and a core 1144. Each core may be configured to perform one or more functions. A core may include a memory, a processing unit (e.g., central processing unit, graphics processing unit), and/or a modem. FIG. 11 illustrates an electrical path 1101, an electrical path 1102, an electrical path 1103, an electrical path 1104, an electrical path 1105, an electrical path 1106, and an electrical path 1107.

The electrical path 1101 may include an electrical path between the core 1132 of the integrated device 103 and the board 108. However, it is noted that the electrical path 1101 may extend to other components beyond the board 108. The electrical path 1101 between the core 1132 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 152 of the interconnection portion block 105, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1102 may include an electrical path between the integrated device 103 and the board 108. However, it is noted that the electrical path 1102 may extend to other components beyond the board 108. The electrical path 1102 between the integrated device 103 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) metallization interconnects from the plurality of metallization interconnects 162 of the metallization portion 106, (v) a solder interconnect from the plurality of solder interconnects 110, and (vi) a board interconnect from the plurality of board interconnects 182.

The electrical path 1103 may include an electrical path between the core 1034 of the integrated device 103 and the board 108. However, it is noted that the electrical path 1103 may extend to other components beyond the board 108. The electrical path 1103 between the core 1034 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1104 may include an electrical path between the integrated device 403 and the board 108. However, it is noted that the electrical path 1104 may extend to other components beyond the board 108. The electrical path 1104 between the integrated device 403 and the board 108 may include (i) a solder interconnect from the plurality of solder interconnects 430, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) the passive device 270, (vi) more interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 1105 may include an electrical path between the core 1142 of the integrated device 403 and the board 108. However, it is noted that the electrical path 1105 may extend to other components beyond the board 108. The electrical path 1105 between the core 1142 and the board 108 may include (i) a solder interconnect from the plurality of solder interconnects 430, (ii) metallization interconnects from the plurality of metallization interconnects 142 of the metallization portion 104, (iii) a pillar interconnect from the plurality of pillar interconnects 122, (iv) an interconnect from the plurality of interconnects 252 of the interconnection portion block 205, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1106 may include an electrical path between the core 1144 of the integrated device 403 and the board 108. However, it is noted that the electrical path 1106 may extend to other components beyond the board 108. The electrical path 1106 between the core 1144 and the board 108 may include (i) a solder interconnect from the plurality of solder interconnects 430, (ii) metallization interconnects from the plurality of metallization interconnects 142 of the metallization portion 104, (iii) a pillar interconnect from the plurality of pillar interconnects 122, (iv) interconnects from the plurality of interconnects 192 of the interconnection portion block 109, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 1107 may include an electrical path between the integrated device 103 and the integrated device 403. The electrical path 1107 between the integrated device 103 and the integrated device 403 may include (i) a solder interconnect from the plurality of solder interconnects 130, (ii) metallization interconnects from the plurality of metallization interconnects 142 of the metallization portion 104, and (iii) a solder interconnect from the plurality of solder interconnects 430.

An integrated device (e.g., 103, 403) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 403) may include at least one electronic circuit (e.g., first electronic circuit, second electronic circuit, etc. . . . ). An integrated device may include an input/output (I/O) hub. An integrated device may include transistors. An integrated device may be an example of an electrical component and/or electrical device.

In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 103, 403) described in the disclosure may be fabricated using the same technology node or two or more different technology nodes. For example, an integrated device (e.g., 103) may be fabricated using a first technology node, and a chiplet may be fabricated using a second technology node that is not as advanced as the first technology node. In such an example, the integrated device (e.g., 103) may include components (e.g., interconnects, transistors) that have a first minimum size, and the chiplet may include components (e.g., interconnects, transistors) that have a second minimum size, where the second minimum size is greater than the first minimum size. In some implementations, the integrated device 103 and the integrated device 403 of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Table 2 below illustrates how different chiplets may be paired and/or configured with blocks of a package substrate. It is noted that Table 2 is merely an example of possible chiplets and pairing with blocks of a package substrate, and that other implementations may have different pairings, use different chiplets and/or use different combinations of chiplets.

TABLE 2

Chiplet Configurations and Pairing with Blocks

| | CHIPLET 1 | CHIPLET 2 | EXAMPLARY PAIRING WITH BLOCK |
|---|---|---|---|
| POWER CONSUMPTION | High Power Consumption (Central Processing Unit (CPU), Graphical Processing Unit (GPU), Neural Processing Unit (NPU), Neural Secure Processor (NSP) | Medium or Low Power Consumption (DDR_SS, Multimedia) | The high power consumption chiplet may be paired with a block that has thicker and/or bigger interconnects to provide an efficient power distribution network. The medium or low power consumption chiplet may be paired with a block that has thinner and/or smaller interconnects. However, the medium or low power consumption may also be paired with a block that has thicker and/or bigger interconnects. |
| INPUT/OUTPUT (I/O) SPEED | High Speed I/O (DDR_PHY, USB, Universal Flash Storage (UFS), PCIE, Modem Interface) | Low Speed I/O | The high speed I/O chiplet may be paired with a block that has smaller minimum line and width interconnects, while the low speed I/O chiplet may be paired with a block that has bigger minimum line and width interconnects. |
| TECHNOLOGY NODES | 2-7 nanometers technology nodes (Advanced Technology node) | 10 or greater nanometers technology nodes (Relaxed technology node) | The advanced node chiplet may be paired with a block that has smaller minimum line and width interconnects, while the relaxed node chiplet may be paired with a block that has bigger minimum line and width interconnects. |
| TYPE | Active integrated device (Active System on Chip) | Active integrated device and/or passive integrated device (Passive Silicon with entangling interconnects) | The active chiplet may be paired with a block that has smaller minimum line and width interconnects, while the passive chiplet may be paired with a block that has bigger minimum line and width interconnects. |
| PLACEMENT | Top Chiplet in Stacked Chiplets | Bottom Chiplet in Stacked Chiplet | Stacked Chiplets may be placed and/or located over one or more blocks of a package substrate |

Table 2 illustrates examples of how different chiplets and/or different pairs of chiplets may be paired with different blocks of a package substrate. For example, a high power consumption chiplet may be paired with a block that has thicker and/or bigger interconnects (e.g., coreless substrate block, cored substrate block), and a medium or low power consumption chiplet may be paired with a block that has thinner and/or smaller interconnects (e.g., coreless substrate block, cored substrate block, redistribution portion block). In another example, a high I/O speed chiplet may be paired with a block that has smaller line and spacing interconnects (e.g., redistribution portion block, embedded trace substrate block), and a low speed chiplet may be paired with a block that has larger line and spacing interconnects (e.g., coreless substrate block, cored substrate block, redistribution portion block). In another example, an advanced technology node chiplet may be paired with a block that has smaller line and spacing interconnects (e.g., redistribution portion block, embedded trace substrate block), and a relaxed technology node chiplet may be paired with a block that has larger line and spacing interconnects (e.g., coreless substrate block, cored substrate block, redistribution portion block). The term pairing a chiplet with a block may mean that the block is configured to provide at least one electrical path for the chiplet. A chiplet may be paired with more than one block and/or more than one type of block. As such, when a chiplet is paired with a block of a package substrate, it does not necessarily mean that the chiplet cannot be paired with another block of the package substrate. Similarly, two or more chiplets may be paired with the same block and/or the same type of block. Thus, a block may be configured to provide at least two separate electrical paths for two or more chiplets. Table 2 illustrates how different technology nodes for integrated devices and/or chiplets may be implemented with different technology nodes for package substrates and/or blocks, to reduce costs, improve and/or optimize the performance of the package that includes integrated devices and/or chiplets.

A metallization portion (e.g., 104, 106) may include a redistribution portion that includes redistribution interconnects (e.g., redistribution layer (RDL) interconnects). A redistribution interconnect may include portions that have a U-shape or V-shape. The terms "U-shape" and "V-shape" shall be interchangeable. The terms "U-shape" and "V-shape" may refer to the side profile shape of the interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect).

An encapsulation layer (e.g., 120) may include a mold, a resin and/or an epoxy. The encapsulation layer may be a means for encapsulation. The encapsulation layer may be provided by using a compression and transfer molding process, a sheet molding process, or a liquid molding process.

As mentioned above, a package may include several metallization portions. Any of the metallization portions may be a first metallization portion, and/or any of the metallization portions may be a second metallization portion. For example, in some implementations, the metallization portion 104 may be considered a first metallization portion, and the metallization portion 106 may be considered a second metallization portion. In some implementations, the metallization portion 106 may be considered a first metallization portion, and the metallization portion 104 may be considered a second metallization portion.

Exemplary Sequence for Fabricating a Package Comprising a Package Substrate with an Encapsulated Portion Comprising Interconnection Portion Blocks FIGS. 12A-12F illustrate an exemplary sequence for providing or fabricating a package that includes a package substrate with an encapsulated portion with several interconnection portion blocks. In some implementations, the sequence of FIGS. 12A-12F may be used to provide or fabricate the package 100 of FIG. 1, or any of the packages described in the disclosure.

It should be noted that the sequence of FIGS. 12A-12F may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 12A-12F may be used to fabricate one package or several packages at a time (as part of a wafer).

Figure 12A:
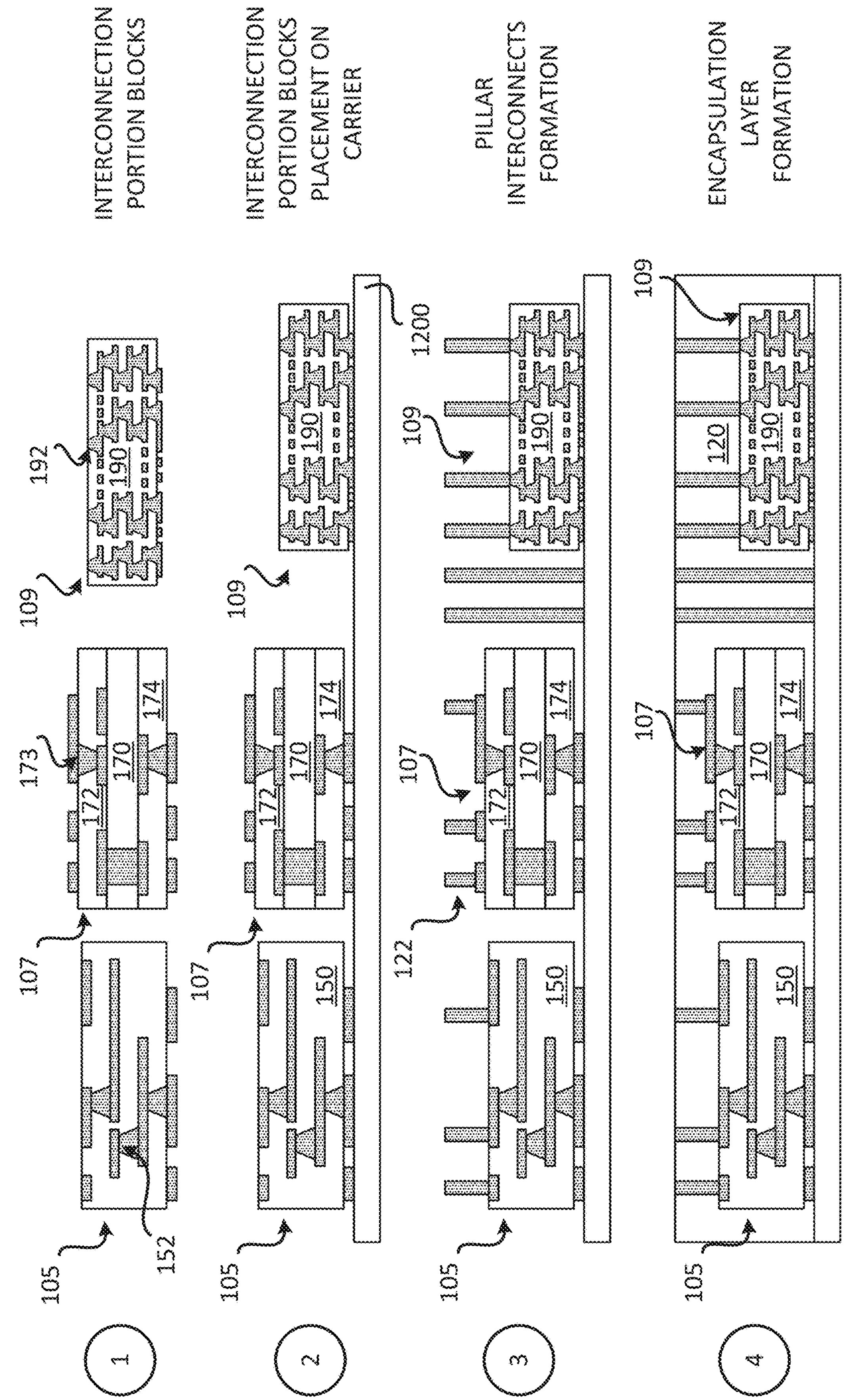
FIGS. 12A-12F illustrate an exemplary sequence for fabricating a package comprising a package substrate with an encapsulated portion with several interconnection portion blocks.

Stage 1, as shown in FIG. 12A, illustrates a state after several interconnection portion blocks are provided. Examples of interconnection portion blocks include the interconnection portion block 105, the interconnection portion block 107 and the interconnection portion block 109. Different implementations may use different combinations and/or numbers of interconnection portion blocks. Providing interconnection portion blocks may include fabricating interconnection portion blocks. Examples of how different types of interconnection portion blocks may be fabricated are illustrated and described below in at least FIGS. 14A-14C, FIGS. 16A-16B and FIGS. 18A-18B.

Stage 2 illustrates a state after the interconnection portion block 105, the interconnection portion block 107 and the interconnection portion block 109 are placed on a carrier 1200. In some implementations, an adhesive may be used to place the interconnection portion blocks on the carrier 1200. A carrier may include a substrate, glass, quartz and/or carrier tape.

Stage 3 illustrates a state after a plurality of pillar interconnects 122 are formed and coupled to the interconnection portion blocks (e.g., 105, 107, 109) and the carrier 1200. A plating process may be used to form the plurality of pillar interconnects 122. Some of the plurality of pillar interconnects 122 may be formed and coupled to interconnects of the interconnection portion blocks.

Stage 4 illustrates a state after an encapsulation layer 120 is formed over the carrier 1200 and the interconnection portion blocks. The encapsulation layer 120 may encapsulate the interconnection portion block 105, the interconnection portion block 107, the interconnection portion block 109 and the plurality of pillar interconnects 122. The encapsulation layer 120 may include a mold, a resin and/or an epoxy. The encapsulation layer 120 may be a means for encapsulation. The encapsulation layer 120 may be provided by using a compression and transfer molding process, a sheet molding process, or a liquid molding process.

Figure 12B:
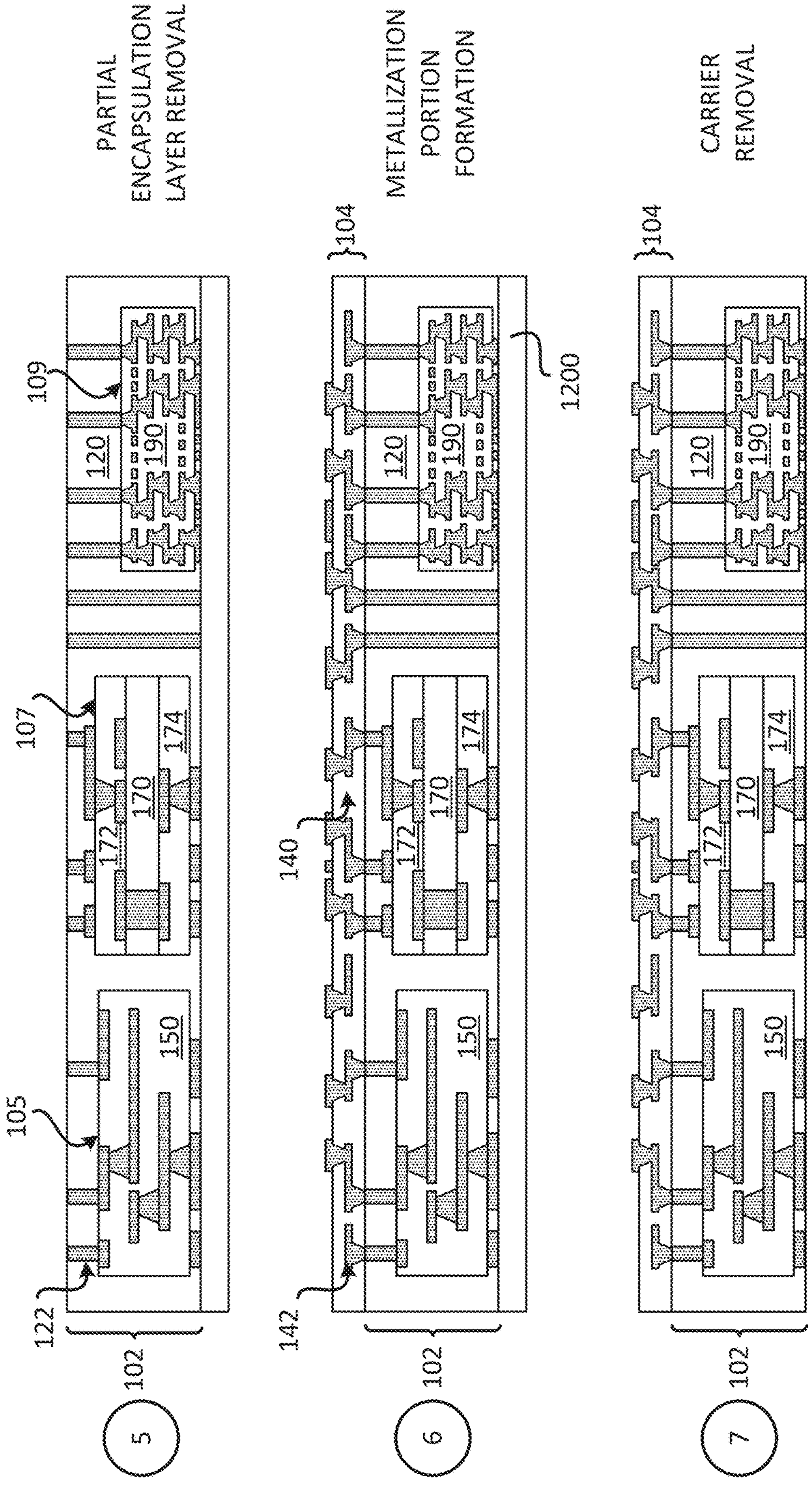

Stage 5, as shown in FIG. 12B, illustrates a state after portion of the encapsulation layer 120 and portions of the plurality of pillar interconnects 122 are removed. A grinding process may be used to remove a top portion of the encapsulation layer 120 and a top portion of the plurality of pillar interconnects 122 to reduce the thickness of the encapsulation layer 120 and/or reduce the height of the plurality of pillar interconnects 122. Stage 5 may illustrate an encapsulated portion 102 that includes the encapsulation layer 120, the plurality of pillar interconnects 122 and several interconnection portion blocks.

Stage 6 illustrates a state after the metallization portion 104 is formed and coupled to the encapsulation layer 120 and the plurality of pillar interconnects 122. The metallization portion 104 is coupled to the encapsulated portion 102. The metallization portion 104 includes at least one dielectric layer 140 and a plurality of metallization interconnects 142. The plurality of metallization interconnects 142 may include a plurality of redistribution interconnects. The plurality of metallization interconnects 142 may be coupled to the plurality of pillar interconnects 122. In some implementations, the metallization portion 104 may be formed using the sequence shown in at least FIGS. 18A-18B. The metallization portion 104 may have different numbers of metal layers. For example, in some implementations, the metallization portion 104 may have one or two metal layers. In some implementations, the metallization portion 104 may have properties that are the same or similar as described in Table 1 for the redistribution layer.

Stage 7 illustrates a state after the carrier 1200 is decoupled from the encapsulated portion 102. The carrier 1200 may be removed and/or detached from the encapsulated portion 102.

Figure 12C:
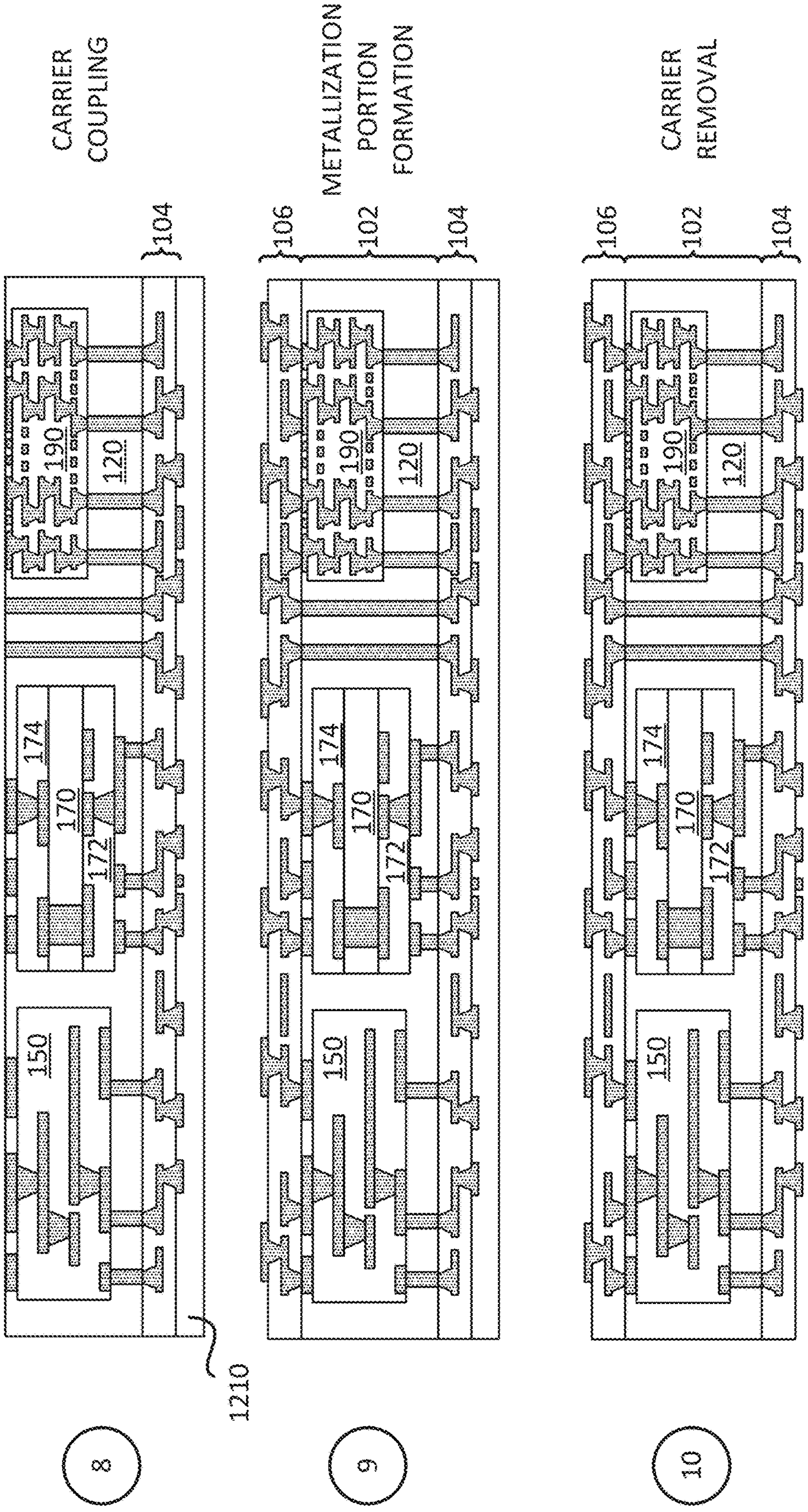

Stage 8, as shown in FIG. 12C, illustrates a state after the encapsulated portion 102 and the metallization portion 104 are placed on a carrier 1210. In some implementations, an adhesive may be used to place the encapsulated portion 102 and the metallization portion 104 on the carrier 1210. The metallization portion 104 may be coupled to the carrier 1210. The carrier 1210 may be similar to the carrier 1200.

Stage 9 illustrates a state after the metallization portion 106 is formed and coupled to the encapsulation layer 120, the plurality of pillar interconnects 122 and the interconnection portion blocks (e.g., 105, 107, 109). The metallization portion 106 is coupled to the encapsulated portion 102 such that the encapsulated portion 102 is located between the metallization portion 104 and the metallization portion 106. The metallization portion 106 includes at least one dielectric layer 160 and a plurality of metallization interconnects 162. The plurality of metallization interconnects 162 may include a plurality of redistribution interconnects. The plurality of metallization interconnects 162 may be coupled to the plurality of pillar interconnects 122 and interconnects from the interconnection portion blocks (e.g., 105, 107, 109). In some implementations, the metallization portion 106 may be formed using the sequence shown in at least FIGS. 18A-18B. The metallization portion 106 may have different numbers of metal layers. For example, in some implementations, the metallization portion 106 may have one or two metal layers. In some implementations, the metallization portion 106 may have properties that are the same or similar as described in Table 1 for the redistribution layer.

Stage 10 illustrates a state after the carrier 1210 is decoupled from the metallization portion 104. The carrier 1210 may be removed and/or detached from the metallization portion 104.

Figure 12D:
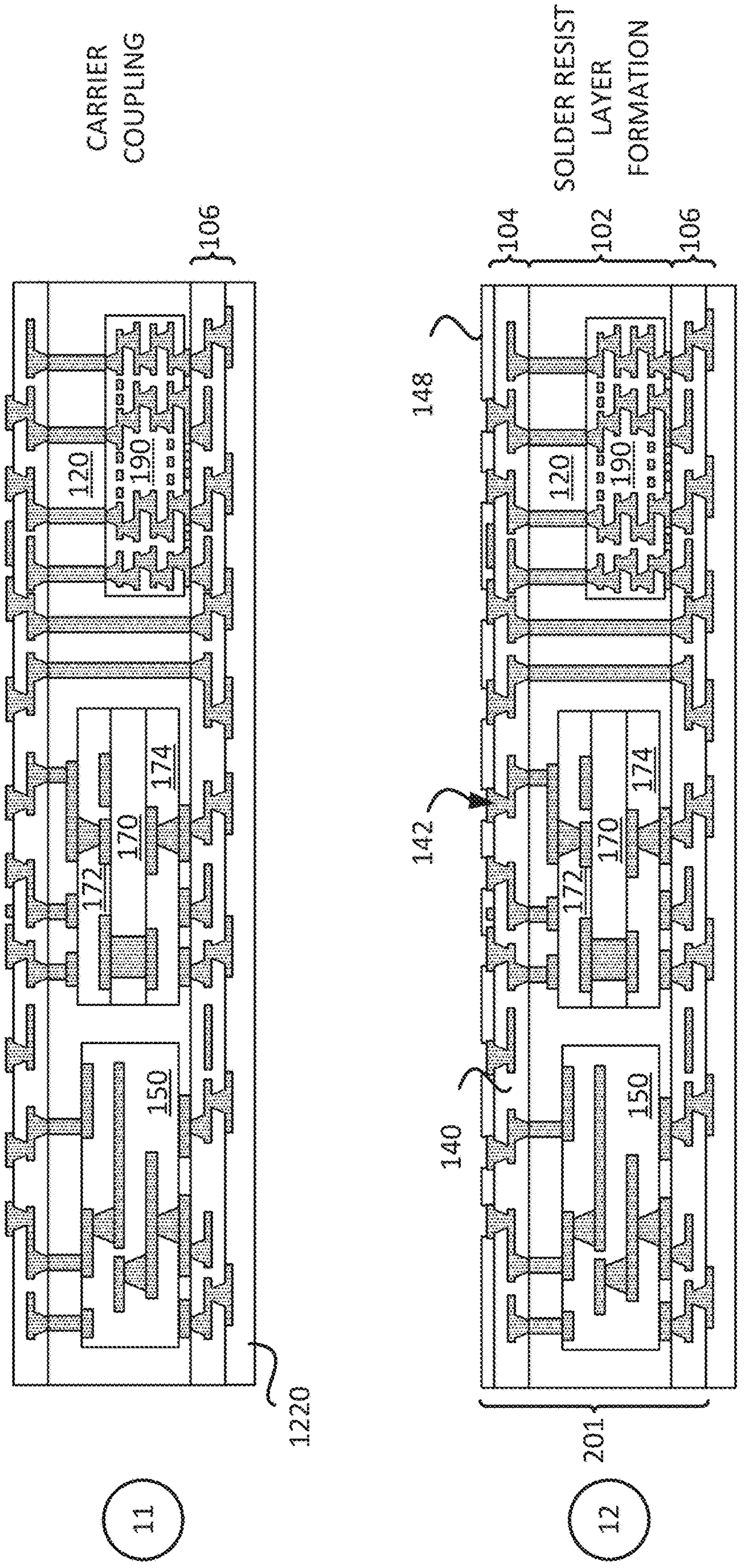

Stage 11, as shown in FIG. 12D, illustrates a state after the encapsulated portion 102, the metallization portion 104 and the metallization portion 106 are placed on a carrier 1220. In some implementations, an adhesive may be used to place the encapsulated portion 102, the metallization portion 104 and the metallization portion 106 on the carrier 1220. The metallization portion 106 may be coupled to the carrier 1220. The carrier 1220 may be similar to the carrier 1200 and/or the carrier 1210.

Stage 12 illustrates a state after a solder resist layer 148 is formed on the metallization portion 104. The solder resist layer 148 may include several openings over one or more metallization interconnects from the plurality of metallization interconnects 142. A deposition and/or lamination process may be used to form the solder resist layer 148. Stage 12 may illustrate a package substrate 201 that includes the encapsulated portion 102, the metallization portion 104 and the metallization portion 106.

Figure 12E:
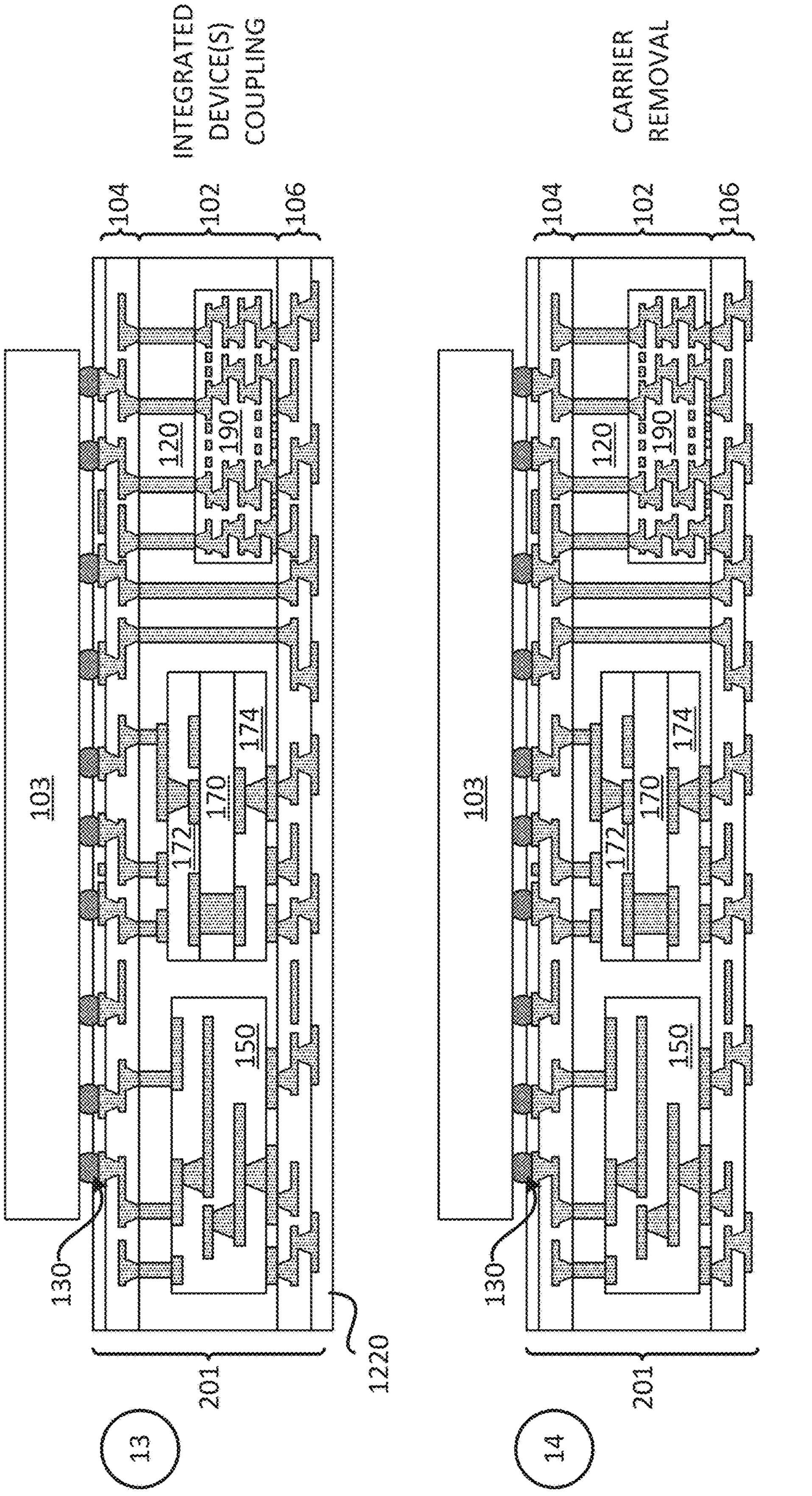

Stage 13, as shown in FIG. 12E, illustrates a state after an integrated device 103 is coupled to the metallization portion 104 through a plurality of solder interconnects 130. A solder reflow process may be used to couple the plurality of solder interconnects 130 to the metallization interconnects of the metallization portion 104.

Stage 14 illustrates a state after the carrier 1220 is decoupled from the metallization portion 106. The carrier 1220 may be removed and/or detached from the metallization portion 106.

Figure 12F:
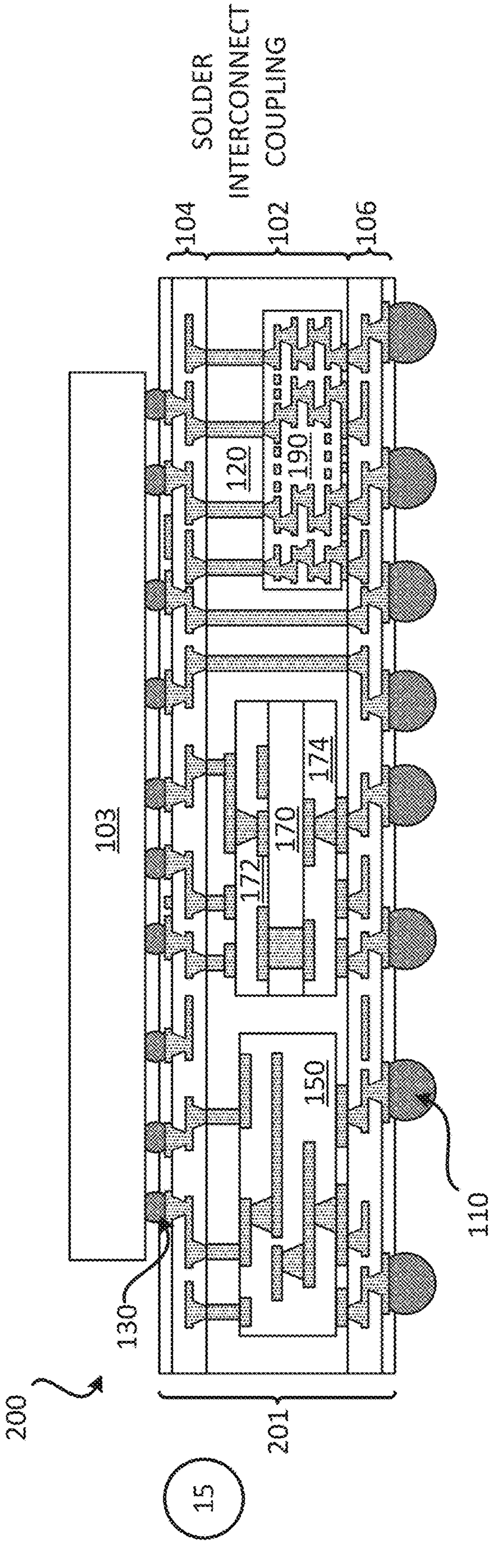

Stage 15, as shown in FIG. 12F, illustrates a state after a plurality of solder interconnects 110 are coupled to the package substrate 201. A solder reflow process may be used to couple the plurality of solder interconnects 110 to the plurality of metallization interconnects 162 of the metallization portion 106. Stage 15 may illustrate a package 200 that includes an integrated device 103 and a package substrate 201 that includes an encapsulated portion 102 with several interconnection portion blocks.

Figure 13:
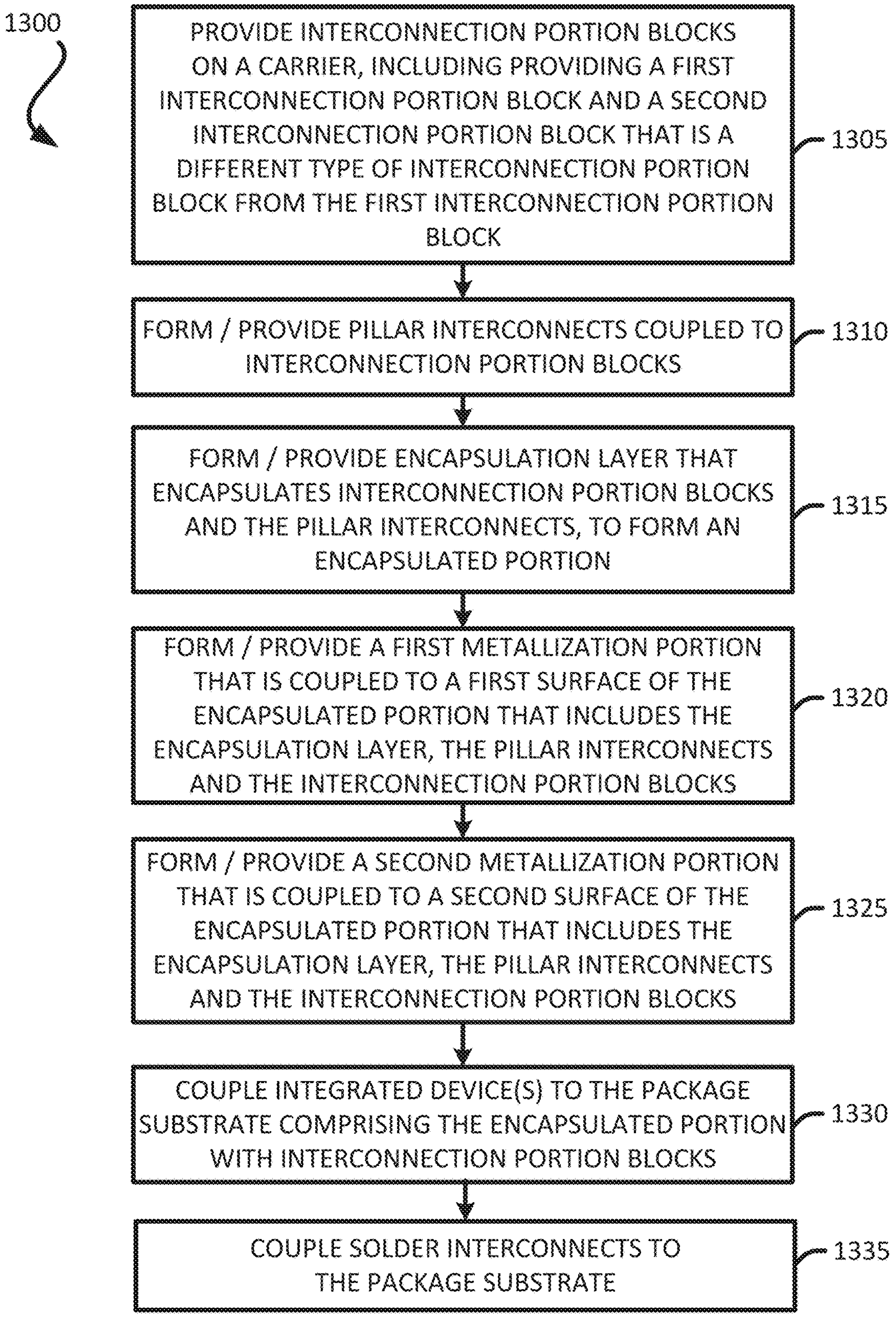
FIG. 13 illustrates an exemplary flow diagram of a method for fabricating a package comprising a package substrate with an encapsulated portion with several interconnection portion blocks.

Exemplary Flow Diagram of a Method for Fabricating a Package Comprising a Package Substrate with an Encapsulated Portion Comprising Interconnection Portion Blocks In some implementations, fabricating a package includes several processes. FIG. 13 illustrates an exemplary flow diagram of a method 1300 for providing or fabricating a package. In some implementations, the method 1300 of FIG. 13 may be used to provide or fabricate any of the packages of the disclosure. For example, the method 1300 of FIG. 13 may be used to fabricate the package 100.

It should be noted that the method 1300 of FIG. 13 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 1300 of FIG. 13 may be used to fabricate one package or several packages at a time (as part of a wafer).

The method provides (at 1305) several interconnection portion blocks on a carrier. For example, several interconnection portion blocks may be provided and/or fabricated and placed on a carrier. A carrier may include a substrate, glass, quartz and/or carrier tape. Stage 1 of FIG. 12A, illustrates and describes an example several interconnection portion blocks. Examples of interconnection portion blocks include an interconnection portion block 105, an interconnection portion block 107 and an interconnection portion block 109. Different implementations may use different types of interconnection portion blocks, different combinations interconnection portion blocks and/or numbers of interconnection portion blocks. Providing interconnection portion blocks may include fabricating interconnection portion blocks. Examples of how different types of interconnection portion blocks may be fabricated are illustrated and described below in at least FIGS. 14A-14C, FIGS. 16A-16B and FIGS. 18A-18B.

Stage 2 of FIG. 12A, illustrates and describes an example of the interconnection portion block 105, the interconnection portion block 107 and the interconnection portion block 109 placed on a carrier 1200. In some implementations, an adhesive may be used to place the interconnection portion blocks on the carrier 1200.

The method forms and couples (at 1310) a plurality of pillar interconnects to interconnection portion blocks. Stage 3 of FIG. 12A, illustrates and describes an example of a plurality of pillar interconnects 122 that are formed and coupled to the interconnection portion blocks (e.g., 105, 107, 109) and the carrier 1200. A plating process may be used to form the plurality of pillar interconnects 122. Some of the plurality of pillar interconnects 122 may be formed and coupled to interconnects of the interconnection portion blocks.

The method forms (at 1315) an encapsulation layer that encapsulates the interconnection portion blocks and the plurality of pillar interconnects. Stage 4 of FIG. 12A, illustrates and describes an example of an encapsulation layer 120 that is formed over the carrier 1200 and the interconnection portion blocks. The encapsulation layer 120 may encapsulate the interconnection portion block 105, the interconnection portion block 107, the interconnection portion block 109 and the plurality of pillar interconnects 122. The encapsulation layer 120 may include a mold, a resin and/or an epoxy. The encapsulation layer 120 may be a means for encapsulation. The encapsulation layer 120 may be provided by using a compression and transfer molding process, a sheet molding process, or a liquid molding process.

Forming an encapsulation layer may also include removing portion of the encapsulation layer. Stage 5 of FIG. 12B, illustrates and describes an example of portions of the encapsulation layer 120 and portions of the plurality of pillar interconnects 122 that are removed. A grinding process may be used to remove a top portion of the encapsulation layer 120 and a top portion of the plurality of pillar interconnects 122 to reduce the thickness of the encapsulation layer 120 and/or reduce the height of the plurality of pillar interconnects 122. Stage 5 of FIG. 12B, may illustrate an encapsulated portion 102 that includes the encapsulation layer 120, the plurality of pillar interconnects 122 and several interconnection portion blocks. Forming the encapsulation layer that encapsulates the interconnection portion blocks and the plurality of pillars interconnects may form an encapsulated portion 102.

The method forms (at 1320) a first metallization portion that is coupled to the encapsulation layer and the plurality of pillar interconnects. Stage 6 of FIG. 12B, illustrates and describes an example of the metallization portion 104 that is formed and coupled to the encapsulation layer 120 and the plurality of pillar interconnects 122. The metallization portion 104 is coupled to the encapsulated portion 102. The metallization portion 104 includes at least one dielectric layer 140 and a plurality of metallization interconnects 142. The plurality of metallization interconnects 142 may include a plurality of redistribution interconnects. The plurality of metallization interconnects 142 may be coupled to the plurality of pillar interconnects 122. In some implementations, the metallization portion 104 may be formed using the sequence shown in at least FIGS. 18A-18B. The metallization portion 104 may have different numbers of metal layers. In some implementations, the metallization portion 104 may have properties that are the same or similar as described in Table 1 for the redistribution layer.

After the metallization portion 104 is formed, a carrier may be removed. Stage 7 of FIG. 12B, illustrates a state after the carrier 1200 is decoupled from the encapsulated portion 102. The carrier 1200 may be removed and/or detached from the encapsulated portion 102.

The method forms (at 1325) a second metallization portion that is coupled to the encapsulation layer, the plurality of pillar interconnects and the interconnection portion blocks. The second metallization portion may be formed after the encapsulation layer, the plurality of pillar interconnects and the interconnection portion blocks are placed on another carrier. Stage 8 of FIG. 12C, illustrates and describes an example of the encapsulated portion 102 and the metallization portion 104 that are placed on a carrier 1210. In some implementations, an adhesive may be used to place the encapsulated portion 102 and the metallization portion 104 on the carrier 1210. The metallization portion 104 may be coupled to the carrier 1210.

Stage 9 of FIG. 12C, illustrates and describes an example of the metallization portion 106 that is formed and coupled to the encapsulation layer 120, the plurality of pillar interconnects 122 and the interconnection portion blocks (e.g., 105, 107, 109). The metallization portion 106 is coupled to the encapsulated portion 102 such that the encapsulated portion 102 is located between the metallization portion 104 and the metallization portion 106. The metallization portion 106 includes at least one dielectric layer 160 and a plurality of metallization interconnects 162. The plurality of metallization interconnects 162 may include a plurality of redistribution interconnects. The plurality of metallization interconnects 162 may be coupled to the plurality of pillar interconnects 122 and interconnects from the interconnection portion blocks (e.g., 105, 107, 109). In some implementations, the metallization portion 106 may be formed using the sequence shown in at least FIGS. 18A-18B. The metallization portion 106 may have different numbers of metal layers. In some implementations, the metallization portion 106 may have properties that are the same or similar as described in Table 1 for the redistribution layer.

After the metallization portion 106 is formed, a carrier may be removed. Stage 10 of FIG. 12C, illustrates a state after the carrier 1210 is decoupled from the metallization portion 104. The carrier 1210 may be removed and/or detached from the metallization portion 104. Forming and/or providing the encapsulated portion 102, the metallization portion 104 and the metallization portion 106 may form a package substrate (e.g., 101, 201, 401).

After the carrier is removed, the encapsulated portion 102, the metallization portion 104 and the metallization portion 106 may be placed on another carrier. Stage 11 of FIG. 12D, illustrates and describes an example of the encapsulated portion 102, the metallization portion 104 and the metallization portion 106 that are placed on a carrier 1220. In some implementations, an adhesive may be used to place the encapsulated portion 102, the metallization portion 104 and the metallization portion 106 on the carrier 1220. The metallization portion 106 may be coupled to the carrier 1220.

In some implementations, a solder resist layer may be formed on the metallization portion 104. Stage 12 of FIG. 12D, illustrates and describes an example of a solder resist layer 148 that is formed on the metallization portion 104. The solder resist layer 148 may include several openings over one or more metallization interconnects from the plurality of metallization interconnects 142. Stage 12 of FIG. 12D, may illustrate a package substrate 201 that includes the encapsulated portion 102, the metallization portion 104 and the metallization portion 106.

The method couples (at 1330) one or more integrated devices to the package substrate. Stage 13 of FIG. 12E, illustrates and describes an example of an integrated device 103 that is coupled to the metallization portion 104 through a plurality of solder interconnects 130. A solder reflow process may be used to couple the plurality of solder interconnects 130 to the metallization interconnects of the metallization portion 104.

Once the integrated device is coupled to the package substrate, a carrier may be removed. Stage 14 of FIG. 12E, illustrates and describes the carrier 1220 that is decoupled from the metallization portion 106. The carrier 1220 may be removed and/or detached from the metallization portion 106.

The method couples (at 1335) a plurality of solder interconnects to the package substrate. Stage 15 of FIG. 12F, illustrates and describes an example of a plurality of solder interconnects 110 that are coupled to the package substrate 201. A solder reflow process may be used to couple the plurality of solder interconnects 110 to the plurality of metallization interconnects 162 of the metallization portion 106. Stage 15 of FIG. 12F, may illustrate a package 200 that includes an integrated device 103 and a package substrate 201 that includes an encapsulated portion 102 with several interconnection portion blocks.

Exemplary Sequence for Fabricating a Coreless Substrate

Figure 14A:
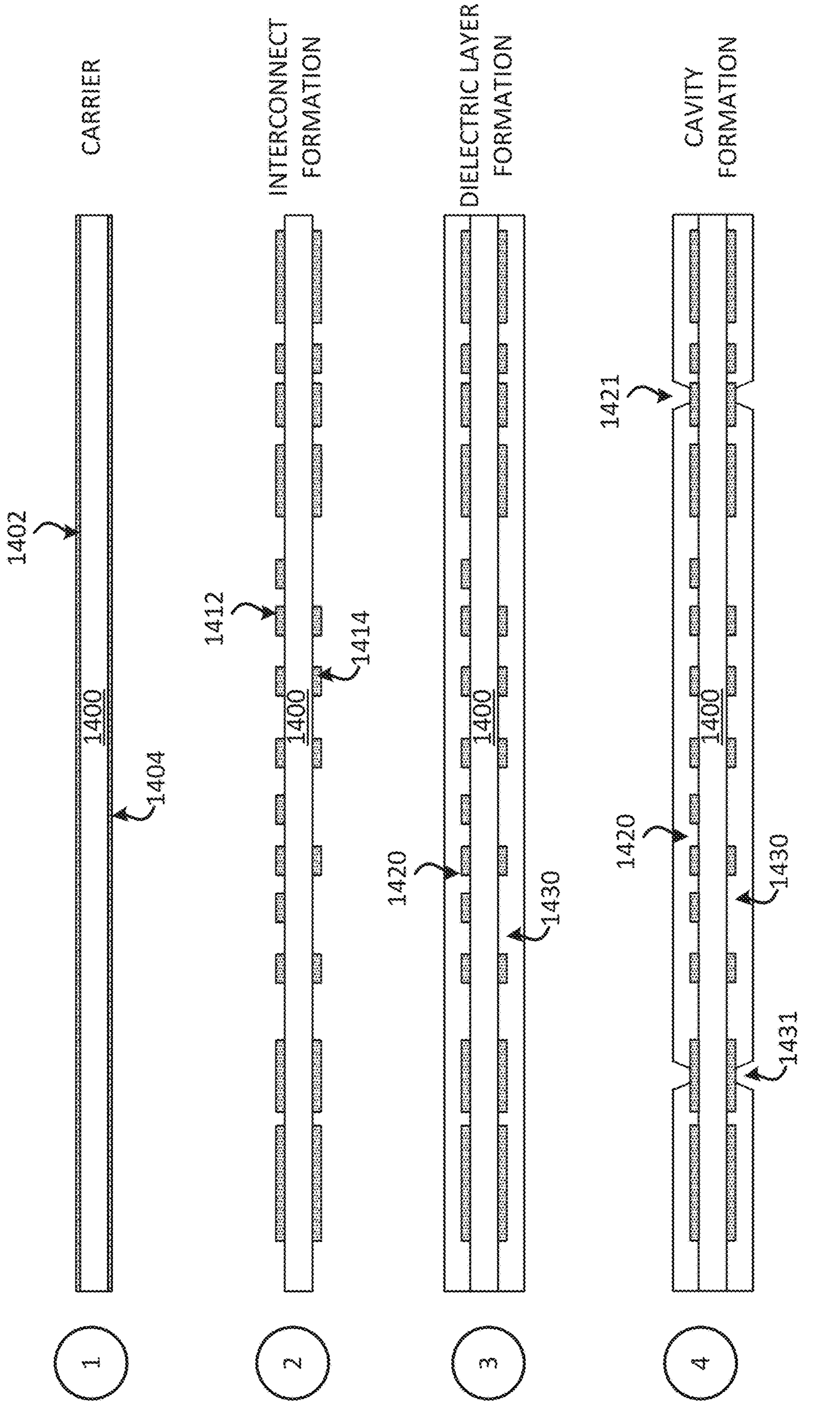
FIGS. 14A-14C illustrate an example of a sequence for fabricating a coreless substrate.
Figure 14B:
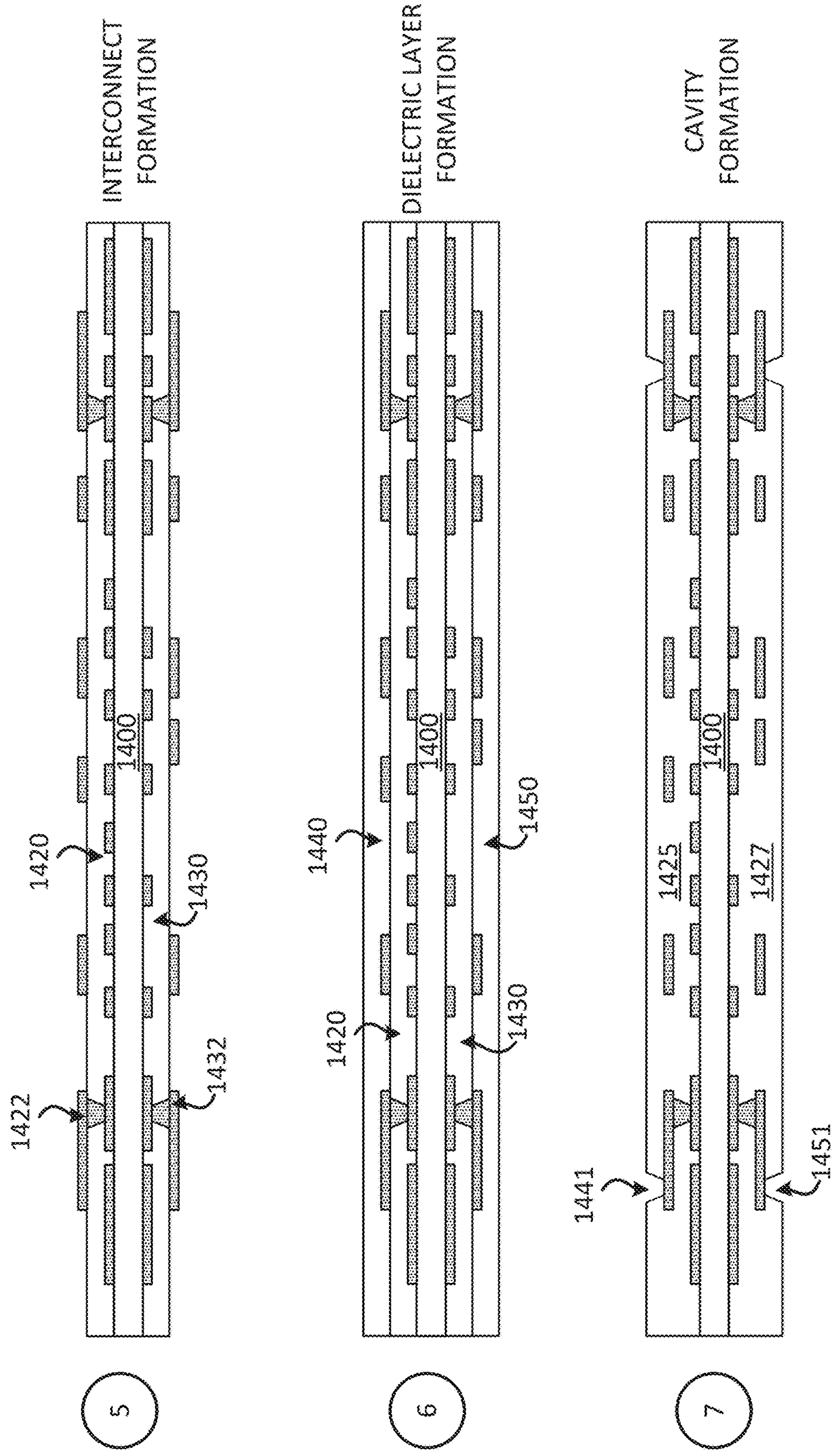
Figure 14C:
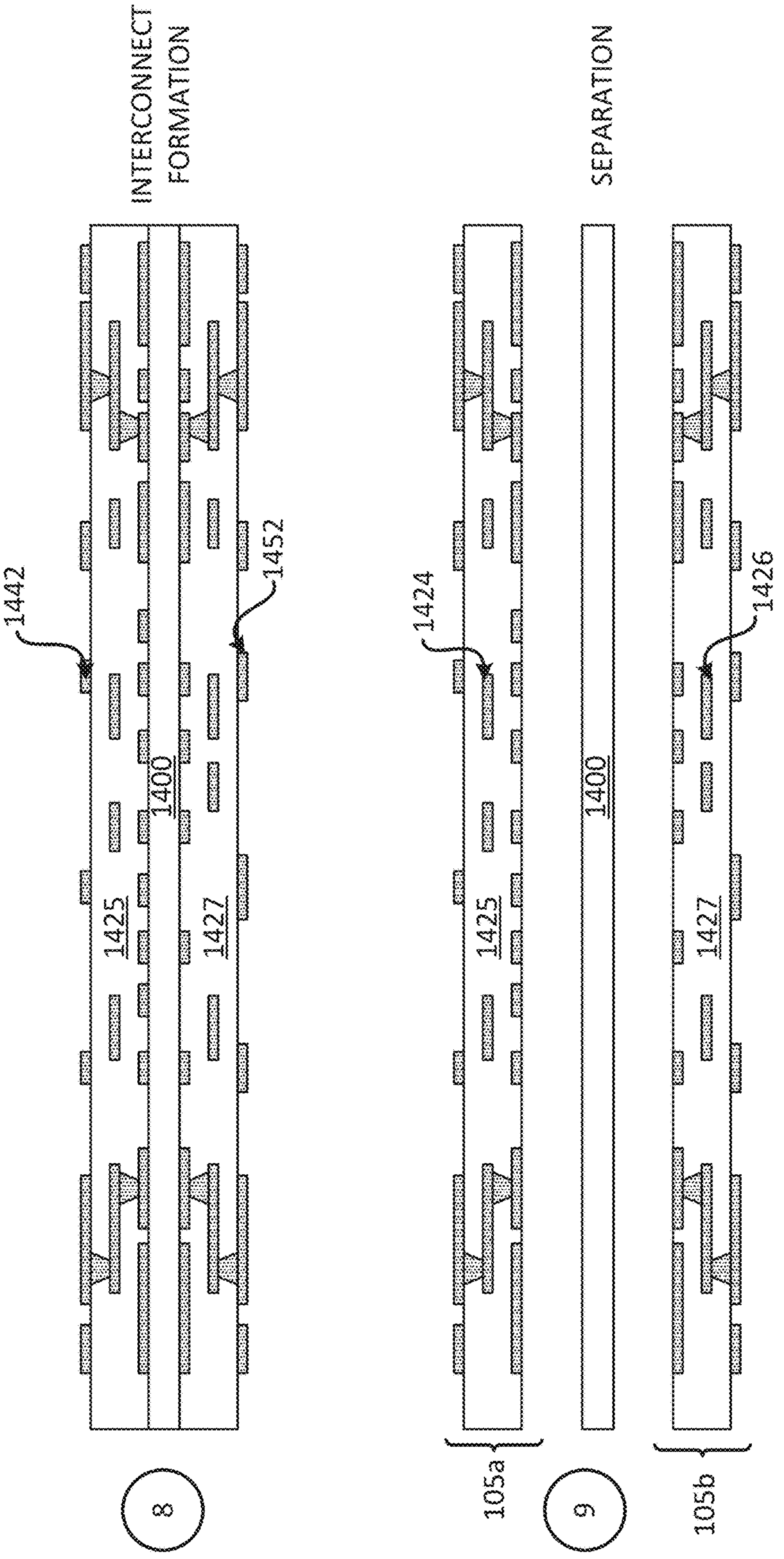

In some implementations, fabricating a coreless substrate includes several processes. FIGS. 14A-14C illustrate an exemplary sequence for providing or fabricating a coreless substrate. The coreless substrate may be implemented as a coreless substrate block. In some implementations, the sequence of FIGS. 14A-14C may be used to provide or fabricate the interconnection portion block 105. However, the process of FIGS. 14A-14C may be used to fabricate other interconnection portion blocks described in the disclosure.

It should be noted that the sequence of FIGS. 14A-14C may combine one or more stages in order to simplify and/or clarify the sequence for providing or fabricating a coreless substrate. In some implementations, the order of the processes may be changed or modified. In some implementations, one or more of processes may be replaced or substituted without departing from the scope of the disclosure.

Stage 1, as shown in FIG. 14A, illustrates a state after a carrier 1400 is provided. The carrier 1400 may include a substrate. The carrier 1400 may include a seed layer 1402 located on a first surface of the carrier 1400 and a seed layer 1404 located on a second surface of the carrier 1400. The carrier 1400 may be a dielectric.

Stage 2 illustrates a state after interconnects are formed in and over surfaces of the carrier 1400. A plurality of interconnects 1412 may be formed over (e.g., above) a first surface of the c carrier 1400. The seed layer 1402 may be part of the plurality of interconnects 1412. A plurality of interconnects 1414 may be formed over (e.g., below) a second surface of the carrier 1400. The seed layer 1404 may be part of the plurality of interconnects 1414. A masking, a plating and/or an etching process may be used to form the plurality of interconnects 1412 and/or the plurality of interconnects 1414.

Stage 3 illustrates a state after a dielectric layer 1420 is formed over (e.g., above) the first surface of the carrier 1400 and the plurality of interconnects 1412. Stage 3 also illustrates a state after a dielectric layer 1430 is formed over (e.g., below) the second surface of the carrier 1400 and the plurality of interconnects 1414. A deposition and/or a lamination process may be used to form the dielectric layer 1420 and the dielectric layer 1430. The dielectric layer 1420 and the dielectric layer 1430 may be a different material than the carrier 1400.

Stage 4 illustrates a state after a plurality of cavities 1421 are formed in the dielectric layer 1420 and a plurality of cavities 1431 are formed in the dielectric layer 1430. The plurality of cavities 1421 and the plurality of cavities 1431 may be formed using an etching process (e.g., photo etching process). A masking, an exposure and/or a development process may be used to form the plurality of cavities 1421 and the plurality of cavities 1431.

Stage 5, as shown in FIG. 14B, illustrates a state after interconnects are formed in and over surfaces of the dielectric layer 1420 and the dielectric layer 1430. A plurality of interconnects 1422 may be formed over (e.g., above) a first surface of the dielectric layer 1420 and the plurality of cavities 1421. A plurality of interconnects 1432 may be formed over (e.g., below) a second surface of the dielectric layer 1430 and the plurality of cavities 1431. A masking, a plating and/or an etching process may be used to form the plurality of interconnects 1422 and/or the plurality of interconnects 1432.

Stage 6 illustrates a state after a dielectric layer 1440 is formed over (e.g., above) the first surface of the dielectric layer 1420 and the plurality of interconnects 1422. Stage 6 also illustrates a state after a dielectric layer 1450 is formed over (e.g., below) the second surface of the dielectric layer 1430 and the plurality of interconnects 1432. A deposition and/or a lamination process may be used to form the dielectric layer 1440 and the dielectric layer 1440. The dielectric layer 1440 and/or the dielectric layer 1450 may be the same dielectric layer as the dielectric layer 1420 and/or the dielectric layer 1430.

Stage 7 illustrates a state after a plurality of cavities 1441 are formed in the dielectric layer 1440 (which is shown as being part of the dielectric layer 1425) and a plurality of cavities 1451 are formed in the dielectric layer 1450 (which is shown as being part of the dielectric layer 1427). The plurality of cavities 1441 and the plurality of cavities 1451 may be formed using an etching process (e.g., photo etching process). A masking, an exposure and/or a development process may be used to form the plurality of cavities 1441 and the plurality of cavities 1451. The dielectric layer 1425 may represent the dielectric layer 1420 and/or the dielectric layer 1440. The dielectric layer 1427 may represent the dielectric layer 1430 and/or the dielectric layer 1450.

Stage 8, as shown in FIG. 14C, illustrates a state after interconnects are formed in and over surfaces of the dielectric layer 1425 and the dielectric layer 1427. A plurality of interconnects 1442 may be formed over (e.g., above) a first surface of the dielectric layer 1425 and the plurality of cavities 1041. A plurality of interconnects 1452 may be formed over (e.g., below) a second surface of the dielectric layer 1427 and the plurality of cavities 1451. A masking, a plating and/or an etching process may be used to form the plurality of interconnects 1442 and/or the plurality of interconnects 1452. The plurality of interconnects 1422 and/or the plurality of interconnects 1442 may be represented by a plurality of interconnects 1424, as shown at stage 9. The plurality of interconnects 1432 and/or the plurality of interconnects 1452 may be represented by a plurality of interconnects 1426, as shown at stage 9.

Stage 9 illustrates a state after (i) the interconnection portion block 105*a* is decoupled from the carrier 1400, and (ii) the interconnection portion block 105*b* is decoupled from the carrier 1400. The interconnection portion block 105*a* may be implemented as a coreless substrate or a coreless substrate block. The interconnection portion block 105*b* may be implemented as a coreless substrate or a coreless substrate block.

Exemplary Flow Diagram of a Method for Fabricating a Coreless Substrate

Figure 15:
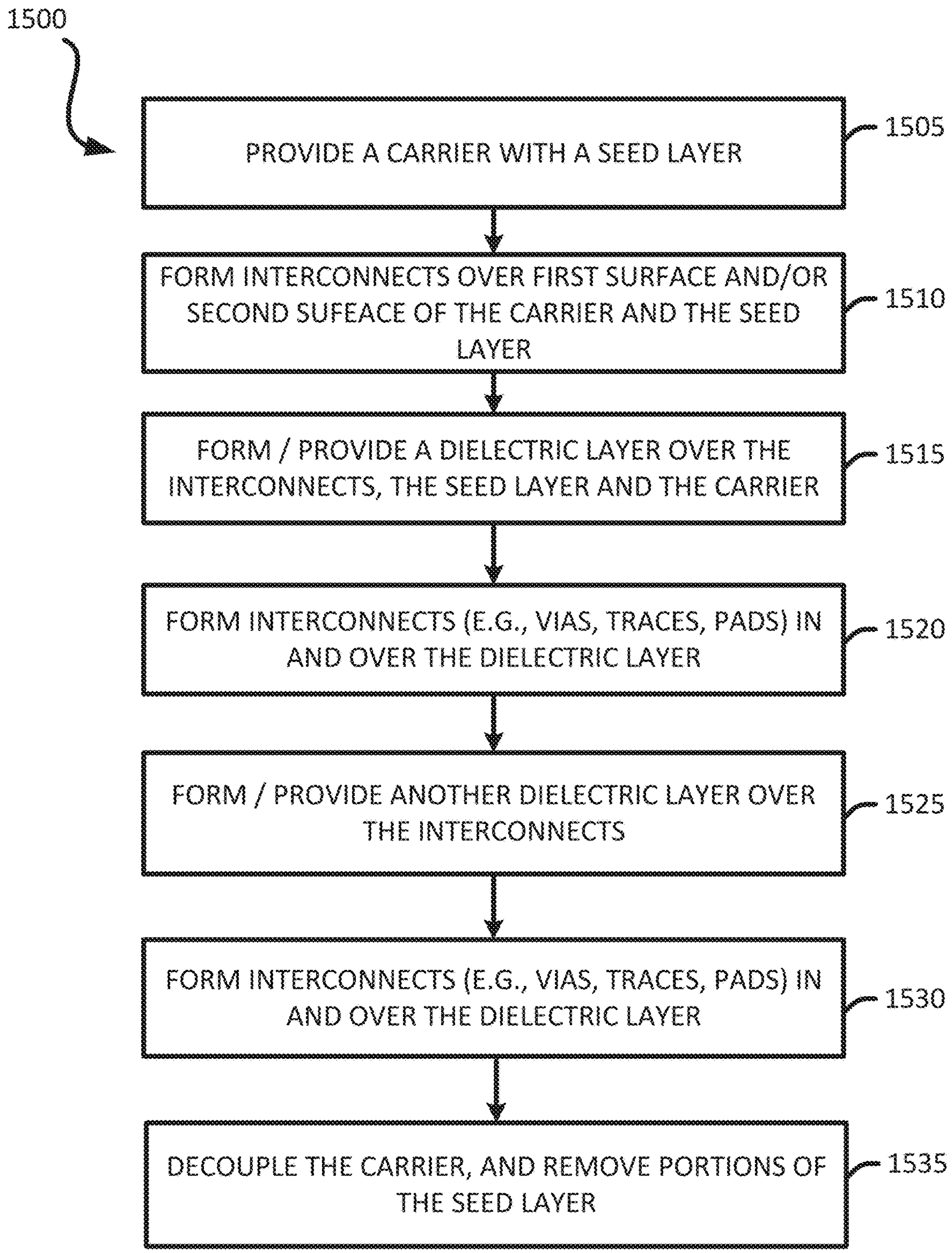
FIG. 15 illustrates an exemplary flow diagram of a method for fabricating a coreless substrate.

In some implementations, fabricating a coreless substrate includes several processes. FIG. 15 illustrates an exemplary flow diagram of a method 1500 for providing or fabricating a coreless substrate. In some implementations, the method 1500 of FIG. 15 may be used to provide or fabricate any of the coreless substrate and/or coreless substrate block of the disclosure. For example, the method 1500 of FIG. 15 may be used to fabricate the interconnection portion block 105.

It should be noted that the method 1500 of FIG. 15 may combine one or more processes in order to simplify and/or clarify the method for providing or fabricating a coreless substrate. In some implementations, the order of the processes may be changed or modified. In some implementations, one or more of processes may be replaced or substituted without departing from the scope of the disclosure. The method 1500 of FIG. 15 may be used to fabricate one substrate or several substrates at a time (as part of a wafer).

The method provides (at 1505) a carrier with a seed layer. Stage 1 of FIG. 14A illustrates and describes an example of a carrier 1400 that is provided. The carrier 1400 may include a substrate. The carrier 1400 may include a seed layer 1402 located on a first surface of the carrier 1400 and a seed layer 1404 located on a second surface of the carrier 1400. The carrier 1400 may be a dielectric.

The method forms (at 1510) interconnects on one or both sides of the carrier. Stage 2 of FIG. 14A, illustrates and describes an example of interconnects that are formed in and over surfaces of the carrier 1400. A plurality of interconnects 1412 may be formed over (e.g., above) a first surface of the c carrier 1400. The seed layer 1402 may be part of the plurality of interconnects 1412. A plurality of interconnects 1414 may be formed over (e.g., below) a second surface of the carrier 1400. The seed layer 1404 may be part of the plurality of interconnects 1414. A masking, a plating and/or an etching process may be used to form the plurality of interconnects 1412 and/or the plurality of interconnects 1414.

The method forms (at 1515) at least one dielectric layer over the interconnects, the seed layer and the carrier. Stage 3 of FIG. 14A illustrates and describes an example of a dielectric layer 1420 that is formed over (e.g., above) the first surface of the carrier 1400 and the plurality of interconnects 1412. Stage 3 of FIG. 14A also illustrates and describes a dielectric layer 1430 that is formed over (e.g., below) the second surface of the carrier 1400 and the plurality of interconnects 1414. A deposition and/or a lamination process may be used to form the dielectric layer 1420 and the dielectric layer 1430. The dielectric layer 1420 and the dielectric layer 1430 may be a different material than the carrier 1400. Forming the at least one dielectric layer may also include forming cavities in the dielectric layer. Stage 4 of FIG. 14A, illustrates and describes a plurality of cavities 1421 that are formed in the dielectric layer 1420 and a plurality of cavities 1431 that are formed in the dielectric layer 1430. The plurality of cavities 1421 and the plurality of cavities 1431 may be formed using an etching process (e.g., photo etching process). A masking, an exposure and/or a development process may be used to form the plurality of cavities 1421 and the plurality of cavities 1431.

The method forms (at 1520) interconnects in and over the dielectric layer(s). Stage 5 of FIG. 14B, illustrates and describes an example of interconnects that are formed in and over surfaces of the dielectric layer 1420 and the dielectric layer 1430. A plurality of interconnects 1422 may be formed over (e.g., above) a first surface of the dielectric layer 1420 and the plurality of cavities 1421. A plurality of interconnects 1432 may be formed over (e.g., below) a second surface of the dielectric layer 1430 and the plurality of cavities 1431. A masking, a plating and/or an etching process may be used to form the plurality of interconnects 1422 and/or the plurality of interconnects 1432.

The method forms (at 1525) at least one dielectric layer over the interconnects and dielectric layer. Stage 6 of FIG. 14B illustrates and describes an example of a dielectric layer 1440 that is formed over (e.g., above) the first surface of the dielectric layer 1420 and the plurality of interconnects 1422. Stage 6 of FIG. 14B also illustrates and describes an example of a dielectric layer 1450 that is formed over (e.g., below) the second surface of the dielectric layer 1430 and the plurality of interconnects 1432. A deposition and/or a lamination process may be used to form the dielectric layer 1440 and the dielectric layer 1440. The dielectric layer 1440 and/or the dielectric layer 1450 may be the same dielectric layer as the dielectric layer 1420 and/or the dielectric layer 1430. Forming the at least one dielectric layer may also include forming cavities in the dielectric layer. Stage 7 of FIG. 14B illustrates and describes an example of a plurality of cavities 1441 that are formed in the dielectric layer 1440 (which is shown as being part of the dielectric layer 1425) and a plurality of cavities 1451 are formed in the dielectric layer 1450 (which is shown as being part of the dielectric layer 1427). The plurality of cavities 1441 and the plurality of cavities 1451 may be formed using an etching process (e.g., photo etching process). A masking, an exposure and/or a development process may be used to form the plurality of cavities 1441 and the plurality of cavities 1451. The dielectric layer 1425 may represent the dielectric layer 1420 and/or the dielectric layer 1440. The dielectric layer 1427 may represent the dielectric layer 1430 and/or the dielectric layer 1450.

The method forms (at 1530) interconnects in and over the dielectric layer(s). Stage 8 of FIG. 14C, illustrates and describes interconnects that are formed in and over surfaces of the dielectric layer 1440 and the dielectric layer 1450. A plurality of interconnects 1442 may be formed over (e.g., above) a first surface of the dielectric layer 1440 and the plurality of cavities 1041. A plurality of interconnects 1452 may be formed over (e.g., below) a second surface of the dielectric layer 1450 and the plurality of cavities 1451. A masking, a plating and/or an etching process may be used to form the plurality of interconnects 1442 and/or the plurality of interconnects 1452. The plurality of interconnects 1422 and/or the plurality of interconnects 1442 may be represented by a plurality of interconnects 1424, as shown at stage 9. The plurality of interconnects 1432 and/or the plurality of interconnects 1452 may be represented by a plurality of interconnects 1426, as shown at stage 9 of FIG. 14C.

The method decouples (at 1535) the carrier and removes portions of a seed layer. Stage 9 of FIG. 14C illustrates and describes an example of (i) the interconnection portion block 105*a* that decoupled from the carrier 1400, and (ii) the interconnection portion block 105*b* is decoupled from the carrier 1400. The interconnection portion block 105*a* may be implemented as a coreless substrate or a coreless substrate block. The interconnection portion block 105*b* may be implemented as a coreless substrate or a coreless substrate block.

Exemplary Sequence for Fabricating a Cored Substrate

Figure 16A:
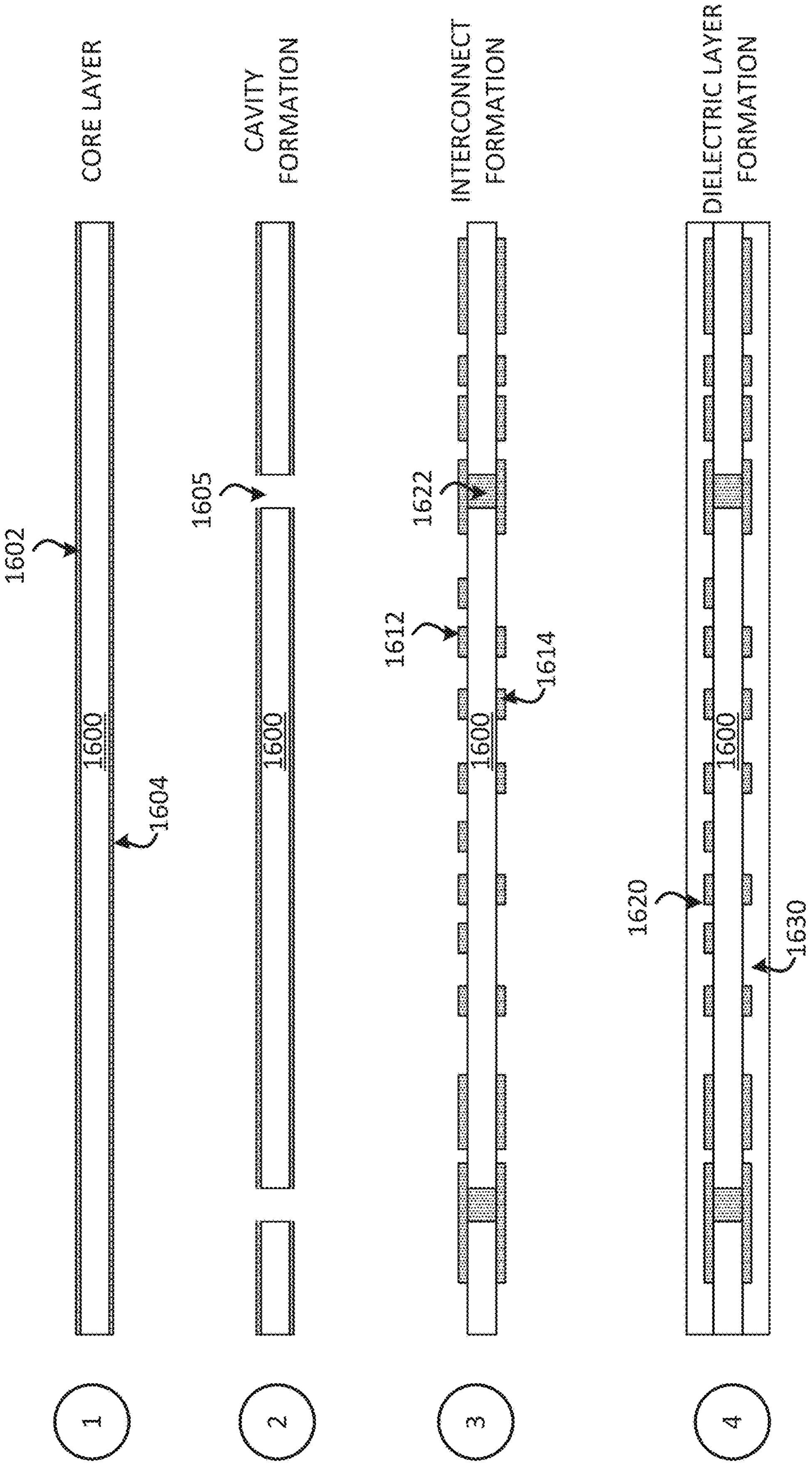
FIGS. 16A-16B illustrate an example of a sequence for fabricating a cored substrate.
Figure 16B:
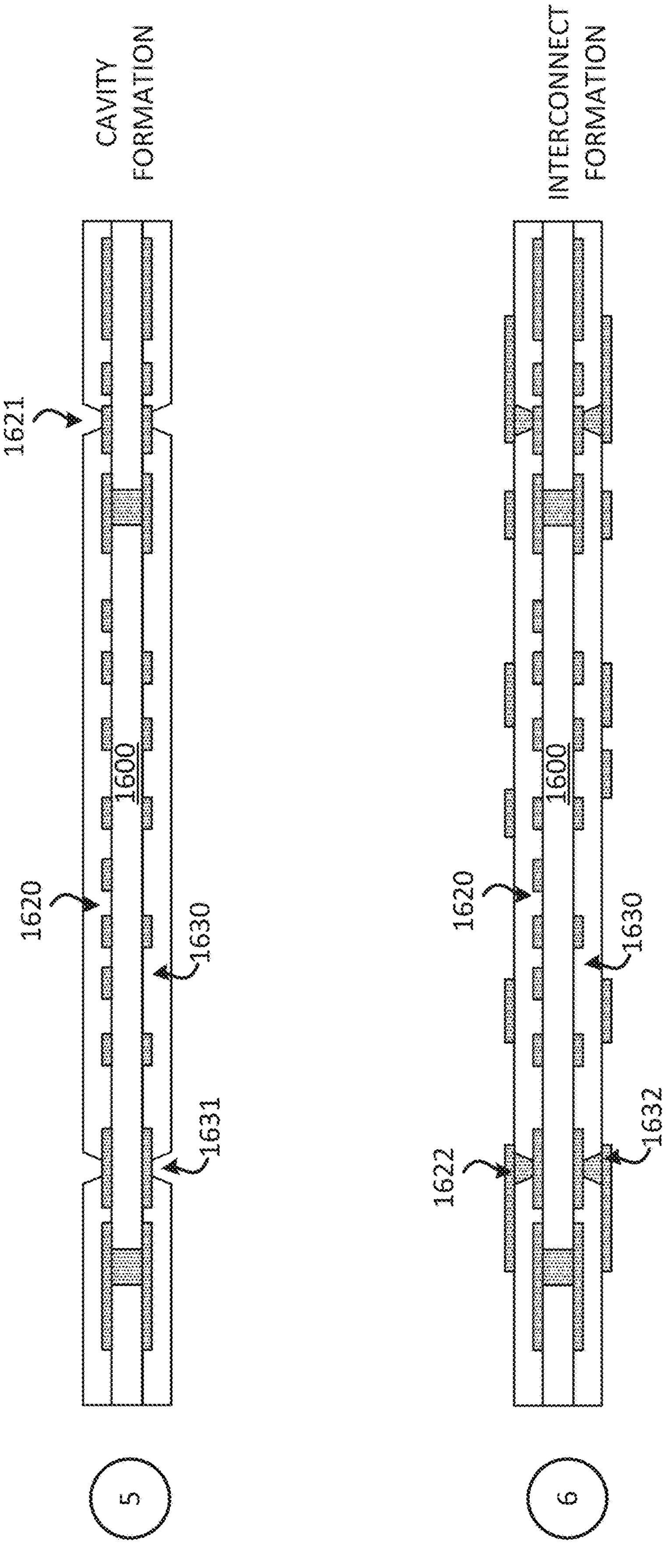

In some implementations, fabricating a cored substrate includes several processes. FIGS. 16A-16B illustrate an exemplary sequence for providing or fabricating a cored substrate. The cored substrate may be implemented as a cored substrate block. In some implementations, the cored substrate may include a passive device. In some implementations, the sequence of FIGS. 16A-16B may be used to provide or fabricate the interconnection portion block 107 and/or the interconnection portion block 207. However, the process of FIGS. 16A-16B may be used to fabricate other interconnection portion blocks described in the disclosure.

It should be noted that the sequence of FIGS. 16A-16B may combine one or more stages in order to simplify and/or clarify the sequence for providing or fabricating a cored substrate. In some implementations, the order of the processes may be changed or modified. In some implementations, one or more of processes may be replaced or substituted without departing from the scope of the disclosure.

Stage 1, as shown in FIG. 16A, illustrates a state after a core layer 1600 is provided. The core layer 1600 may include a seed layer 1602 located on a first surface of the core layer 1600 and a seed layer 1604 located on a second surface of the core layer 1600. The core layer 1600 may be a dielectric.

Stage 2 illustrates a state after a plurality of cavities 1605 are formed through the core layer 1600, the seed layer 1602 and the seed layer 1604. The plurality of cavities 1605 may be formed using an etching process and/or laser process.

Stage 3 illustrates a state after interconnects are formed in and over surfaces of the core layer 1600. A plurality of core interconnects 1622 may be formed in the plurality of cavities 1605. A plurality of interconnects 1612 may be formed over (e.g., above) a first surface of the core layer 1600. The seed layer 1602 may be part of the plurality of interconnects 1612. A plurality of interconnects 1614 may be formed over (e.g., below) a second surface of the core layer 1600. The seed layer 1604 may be part of the plurality of interconnects 1614. A masking, a plating and/or an etching process may be used to form the plurality of core interconnects 1622, the plurality of interconnects 1612 and/or the plurality of interconnects 1614. In some implementations, a passive device (e.g., 270) may be placed in one of the cavities from the plurality of cavities 1605 before the interconnects are formed. When a passive device is placed in a cavity, a dielectric layer may be formed around the passive device before interconnects are formed. In some implementations, interconnects may be formed such that some interconnects touch terminals of the passive device.

Stage 4 illustrates a state after a dielectric layer 1620 is formed over (e.g., above) the first surface of the core layer 1600 and the plurality of interconnects 1612. Stage 4 also illustrates a state after a dielectric layer 1630 is formed over (e.g., below) the second surface of the core layer 1600 and the plurality of interconnects 1614. A deposition and/or a lamination process may be used to form the dielectric layer 1620 and the dielectric layer 1630. The dielectric layer 1620 and the dielectric layer 1630 may be a different material than the core layer 1600.

Stage 5, as shown in FIG. 16B, illustrates a state after a plurality of cavities 1621 are formed in the dielectric layer 1620 and a plurality of cavities 1631 are formed in the dielectric layer 1630. The plurality of cavities 1621 and the plurality of cavities 1631 may be formed using an etching process (e.g., photo etching process). A masking, an exposure and/or a development process may be used to form the plurality of cavities 1621 and the plurality of cavities 1631.

Stage 6 illustrates a state after interconnects are formed in and over surfaces of the dielectric layer 1620 and the dielectric layer 1630. A plurality of core interconnects 1622 may be formed over (e.g., above) a first surface of the dielectric layer 1620 and the plurality of cavities 1621. A plurality of interconnects 1632 may be formed over (e.g., below) a second surface of the dielectric layer 1630 and the plurality of cavities 1631. A masking, a plating and/or an etching process may be used to form the plurality of core interconnects 1622 and/or the plurality of interconnects 1632.

Stage 6 may illustrate an interconnection portion block that is implemented as a cored substrate. Stage 6 may illustrate an example of the interconnection portion block 107. Different implementations may use different processes for forming the metal layer(s) and/or interconnects. It is noted that Stages 4-6 of FIGS. 16A-16B may be iteratively repeated to form additional metal layers.

Exemplary Flow Diagram of a Method for Fabricating a Cored Substrate

Figure 17:
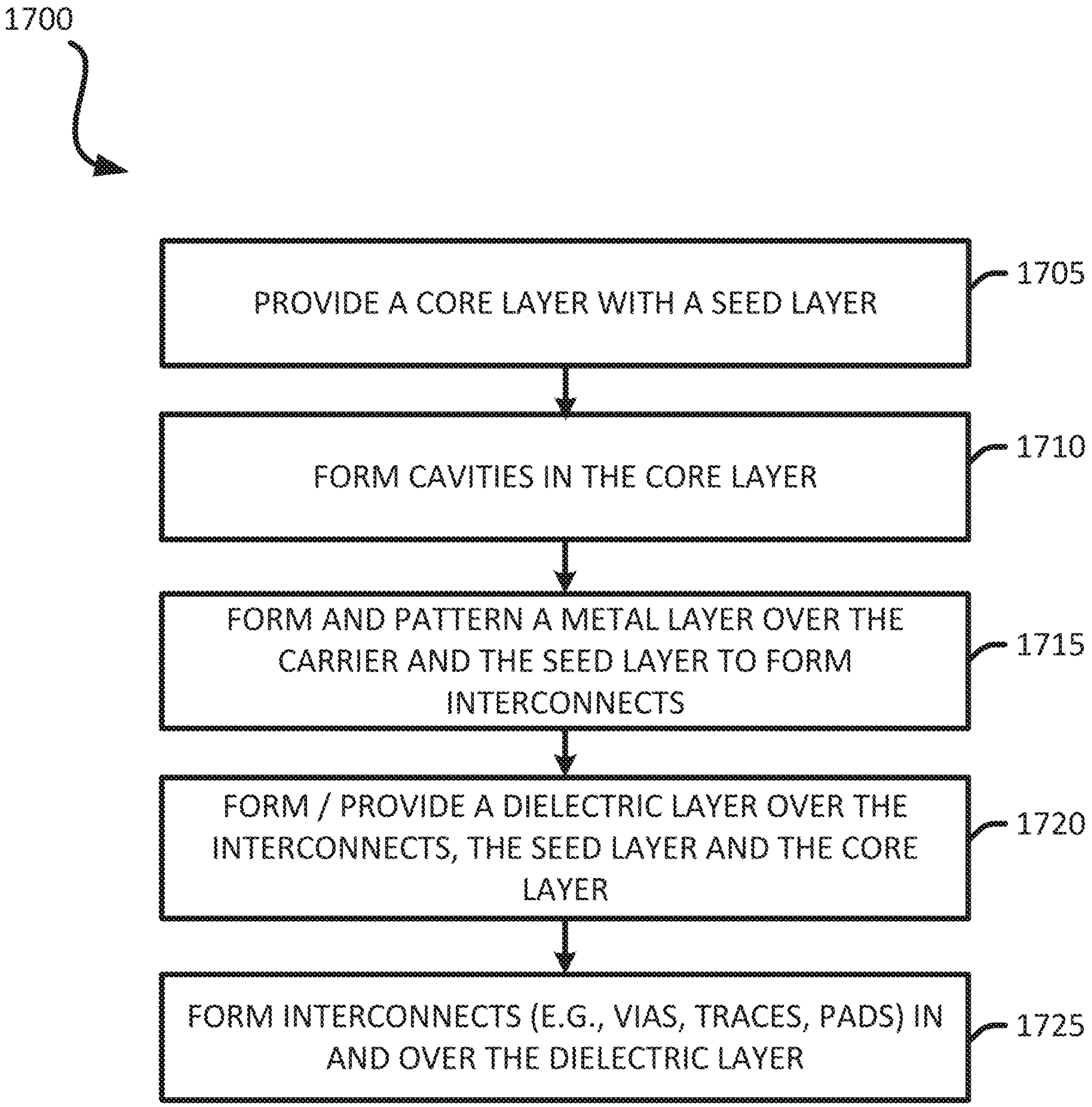
FIG. 17 illustrates an exemplary flow diagram of a method for fabricating a cored substrate.

In some implementations, fabricating a cored substrate includes several processes. FIG. 17 illustrates an exemplary flow diagram of a method 1700 for providing or fabricating a cored substrate. In some implementations, the method 1700 of FIG. 17 may be used to provide or fabricate any of the cored substrate and/or cored substrate block of the disclosure. For example, the method 1700 of FIG. 17 may be used to fabricate the interconnection portion block 107 and/or the interconnection portion block 207.

It should be noted that the method 1700 of FIG. 17 may combine one or more processes in order to simplify and/or clarify the method for providing or fabricating a cored substrate. In some implementations, the order of the processes may be changed or modified. In some implementations, one or more of processes may be replaced or substituted without departing from the scope of the disclosure. The method 1700 of FIG. 17 may be used to fabricate one substrate or several substrates at a time (as part of a wafer).

The method provides (at 1705) a core layer with at least one seed layer. Stage 1 of FIG. 16A, illustrates and describes an example of a core layer 1600 is provided. The core layer 1600 may include a seed layer 1602 located on a first surface of the core layer 1600 and a seed layer 1604 located on a second surface of the core layer 1600. The core layer 1600 may be a dielectric.

The method forms (at 1710) cavities in the core layer. Stage 2 of FIG. 16A illustrates and describes an example of a plurality of cavities 1605 that are formed through the core layer 1600, the seed layer 1602 and the seed layer 1604. The plurality of cavities 1605 may be formed using an etching process and/or laser process.

The method forms (at 1715) interconnects in/on the core layer. Stage 3 of FIG. 16A, illustrates and describes an example of interconnects that are formed in and over surfaces of the core layer 1600. A plurality of core interconnects 1622 may be formed in the plurality of cavities 1605. A plurality of interconnects 1612 may be formed over (e.g., above) a first surface of the core layer 1600. The seed layer 1602 may be part of the plurality of interconnects 1612. A plurality of interconnects 1614 may be formed over (e.g., below) a second surface of the core layer 1600. The seed layer 1604 may be part of the plurality of interconnects 1614. A masking, a plating and/or an etching process may be used to form the plurality of core interconnects 1622, the plurality of interconnects 1612 and/or the plurality of interconnects 1614. In some implementations, a passive device (e.g., 270) may be placed in one of the cavities from the plurality of cavities 1605 before the interconnects are formed. When a passive device is placed in a cavity, a dielectric layer may be formed around the passive device before interconnects are formed. In some implementations, interconnects may be formed such that some interconnects touch terminals of the passive device.

The method forms (at 1720) at least one dielectric layer. Stage 4 of FIG. 16A, illustrates and describes an example of a dielectric layer 1620 that is formed over (e.g., above) the first surface of the core layer 1600 and the plurality of interconnects 1612. Stage 4 of FIG. 16A, also illustrates and describes an example of a dielectric layer 1630 that is formed over (e.g., below) the second surface of the core layer 1600 and the plurality of interconnects 1614. A deposition and/or a lamination process may be used to form the dielectric layer 1620 and the dielectric layer 1630. The dielectric layer 1620 and the dielectric layer 1630 may be a different material than the core layer 1600. Forming the at least one dielectric layer may include forming cavities in the dielectric layer. Stage 5 of FIG. 16B, illustrates and describes an example of a plurality of cavities 1621 that are formed in the dielectric layer 1620 and a plurality of cavities 1631 are formed in the dielectric layer 1630. The plurality of cavities 1621 and the plurality of cavities 1631 may be formed using an etching process (e.g., photo etching process). A masking, an exposure and/or a development process may be used to form the plurality of cavities 1621 and the plurality of cavities 1631.

The method forms (at 1725) interconnects. Stage 6 of FIG. 16B, illustrates and describes an example of interconnects that are formed in and over surfaces of the dielectric layer 1620 and the dielectric layer 1630. A plurality of core interconnects 1622 may be formed over (e.g., above) a first surface of the dielectric layer 1620 and the plurality of cavities 1621. A plurality of interconnects 1632 may be formed over (e.g., below) a second surface of the dielectric layer 1630 and the plurality of cavities 1631. A masking, a plating and/or an etching process may be used to form the plurality of core interconnects 1622 and/or the plurality of interconnects 1632. It is noted that additional dielectric layers and additional interconnects on additional metal layers may be formed by iteratively repeating the formation of the dielectric layer (at 1720) and the formation of interconnects (at 1725).

Exemplary Sequence for Fabricating a Metallization Portion

Figure 18A:
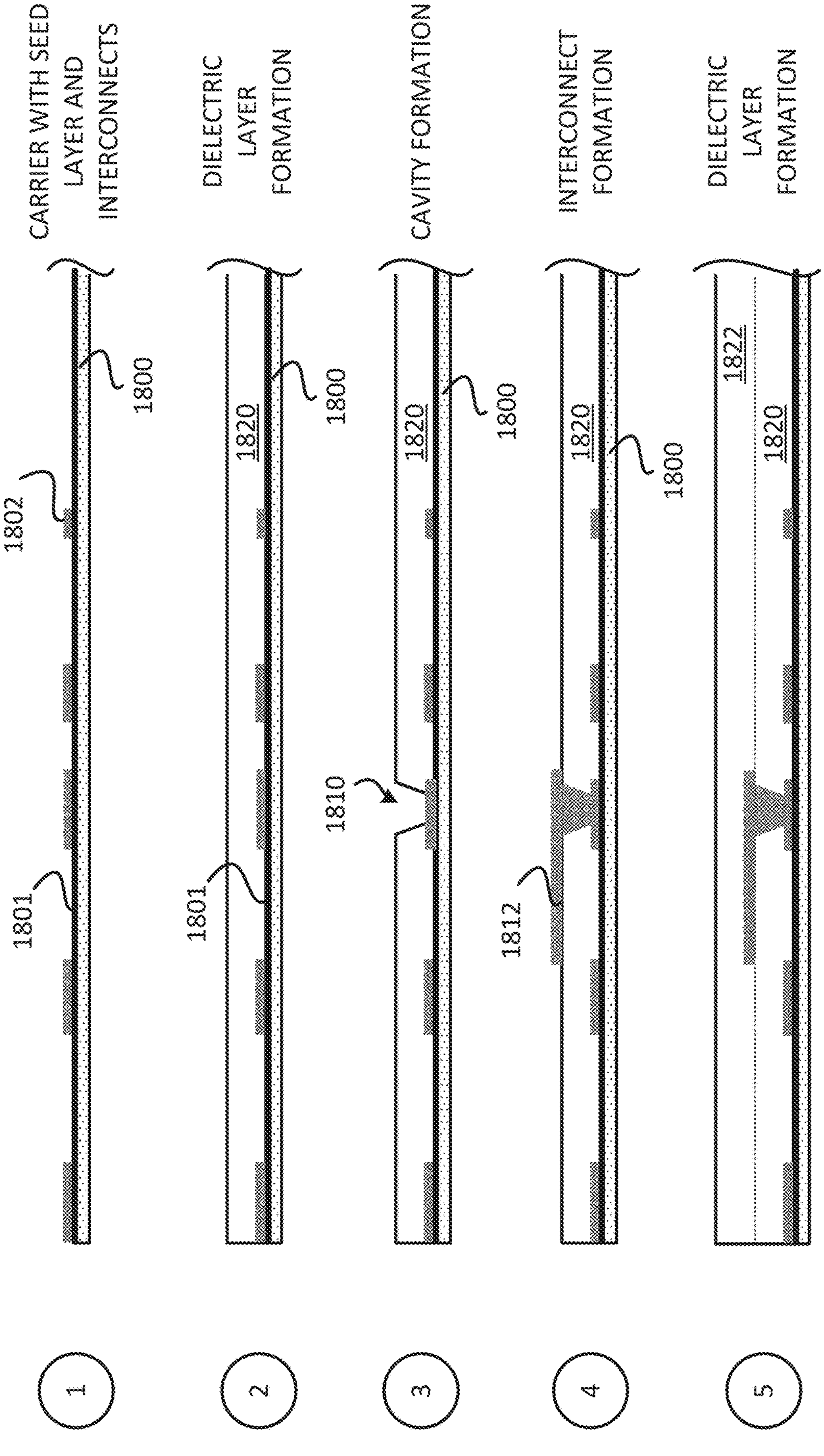
FIGS. 18A-18B illustrate an exemplary sequence for fabricating a metallization portion.
Figure 18B:
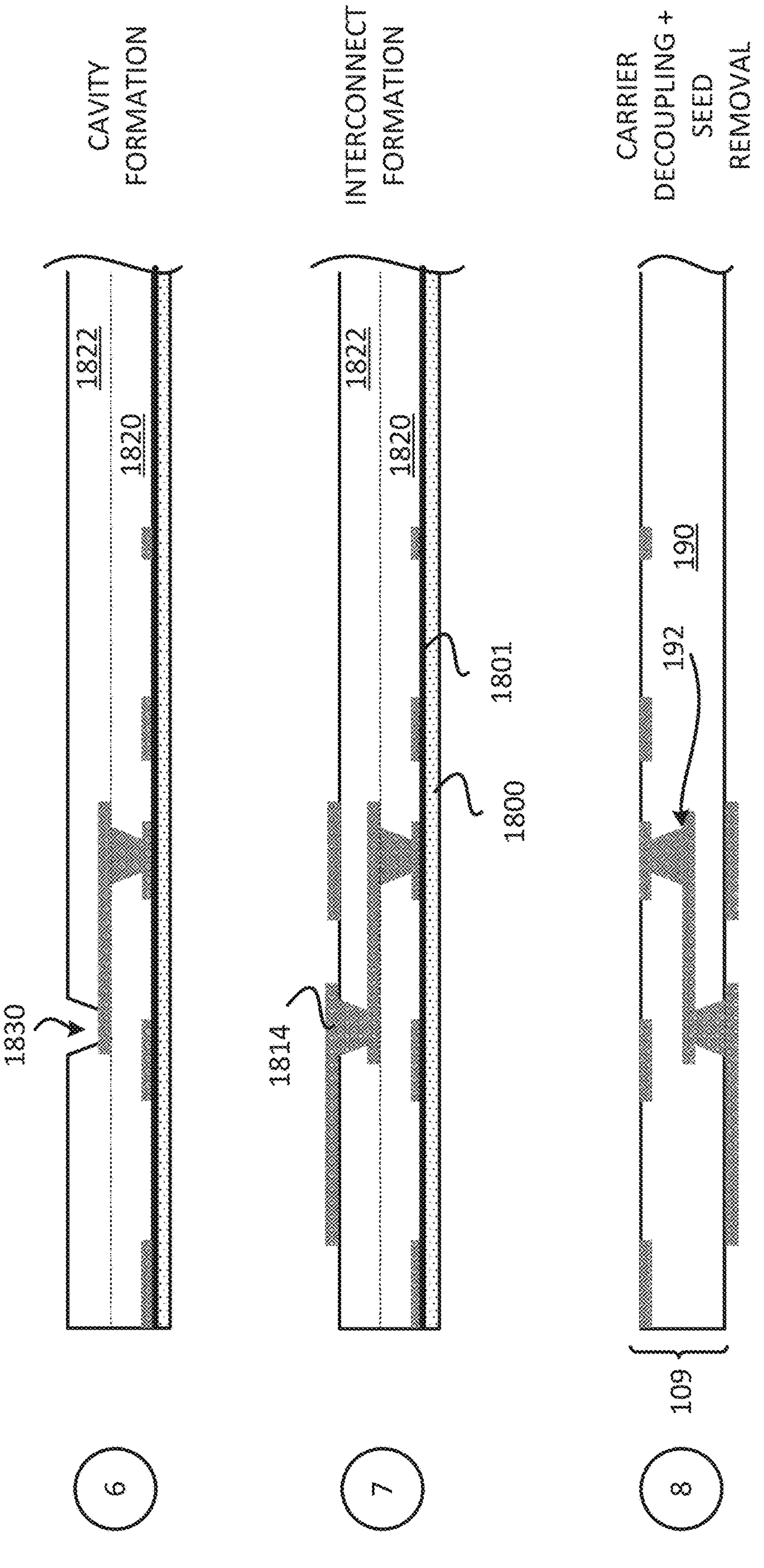

In some implementations, fabricating a metallization portion includes several processes. FIGS. 18A-18B illustrate an exemplary sequence for providing or fabricating a metallization portion and/or a metallization portion block. In some implementations, the sequence of FIGS. 18A-18B may be used to provide or fabricate a metallization portion block and/or a metallization portion (e.g., 104, 106). The process of FIGS. 18A-18B will be described to fabricate the interconnection portion block 109 (e.g., metallization portion block). However, the process of FIGS. 18A-18B may be used to fabricate any of the metallization portions described in the disclosure.

It should be noted that the sequence of FIGS. 18A-18B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 18A, illustrates a state after a carrier 1800 is provided. A seed layer 1801 and interconnects 1802 may be located over the carrier 1800. The interconnects 1802 may be located over the seed layer 1801. A plating process and etching process may be used to form the interconnects 1802. In some implementations, the carrier 1800 may be provided with the seed layer 1801 and a metal layer that is patterned to form the interconnects 1802. The interconnects 1802 may represent at least some of the interconnects from the plurality of interconnects 192.

Stage 2 illustrates a state after a dielectric layer 1820 is formed over the carrier 1800, the seed layer 1801 and the interconnects 1802. A deposition and/or lamination process may be used to form the dielectric layer 1820. The dielectric layer 1820 may include prepreg and/or polyimide. The dielectric layer 1820 may include a photo-imageable dielectric. However, different implementations may use different materials for the dielectric layer.

Stage 3 illustrates a state after a plurality of cavities 1810 are formed in the dielectric layer 1820. The plurality of cavities 1810 may be formed using a photolithography process or laser process. A masking, an exposure and/or a development process may be used to form the plurality of cavities 1810.

Stage 4 illustrates a state after interconnects 1812 are formed in and over the dielectric layer 1820, including in and over the plurality of cavities 1810. For example, a via, pad and/or traces may be formed. A plating process may be used to form the interconnects.

Stage 5 illustrates a state after a dielectric layer 1822 is formed over the dielectric layer 1820 and the interconnects 1812. A deposition and/or lamination process may be used to form the dielectric layer 1822. The dielectric layer 1822 may include prepreg and/or polyimide. The dielectric layer 1822 may include a photo-imageable dielectric. However, different implementations may use different materials for the dielectric layer.

Stage 6, as shown in FIG. 18B, illustrates a state after a plurality of cavities 1830 are formed in the dielectric layer 1822. The plurality of cavities 1830 may be formed using a photolithography process or laser process. A masking, an exposure and/or a development process may be used to form the plurality of cavities 1830.

Stage 7 illustrates a state after interconnects 1814 are formed in and over the dielectric layer 1822, including in and over the plurality of cavities 1830. For example, a via, pad and/or traces may be formed. A plating process may be used to form the interconnects.

Stage 8 illustrates a state after the carrier 1800 is decoupled (e.g., detached, removed, grinded out) from the dielectric layer 1820 and the seed layer 1801, portions of the seed layer 1801 are removed (e.g., etched out), leaving the interconnection portion block 109 (e.g., metallization portion block) that includes at least one dielectric layer 190 and the plurality of interconnects 192. The at least one dielectric layer 190 may represent the dielectric layer 1820 and/or the dielectric layer 1822. The plurality of interconnects 192 may represent the interconnects 1802, 1812 and/or 1814.

FIGS. 18A-18B illustrate the metallization portion being formed on a carrier. In some implementations, the metallization portion and/or the metallization portion block may be fabricated on a surface of an encapsulated portion that includes an encapsulation layer and interconnects, thus bypassing the need for a carrier.

Exemplary Flow Diagram of a Method for Fabricating a Metallization Portion

Figure 19:
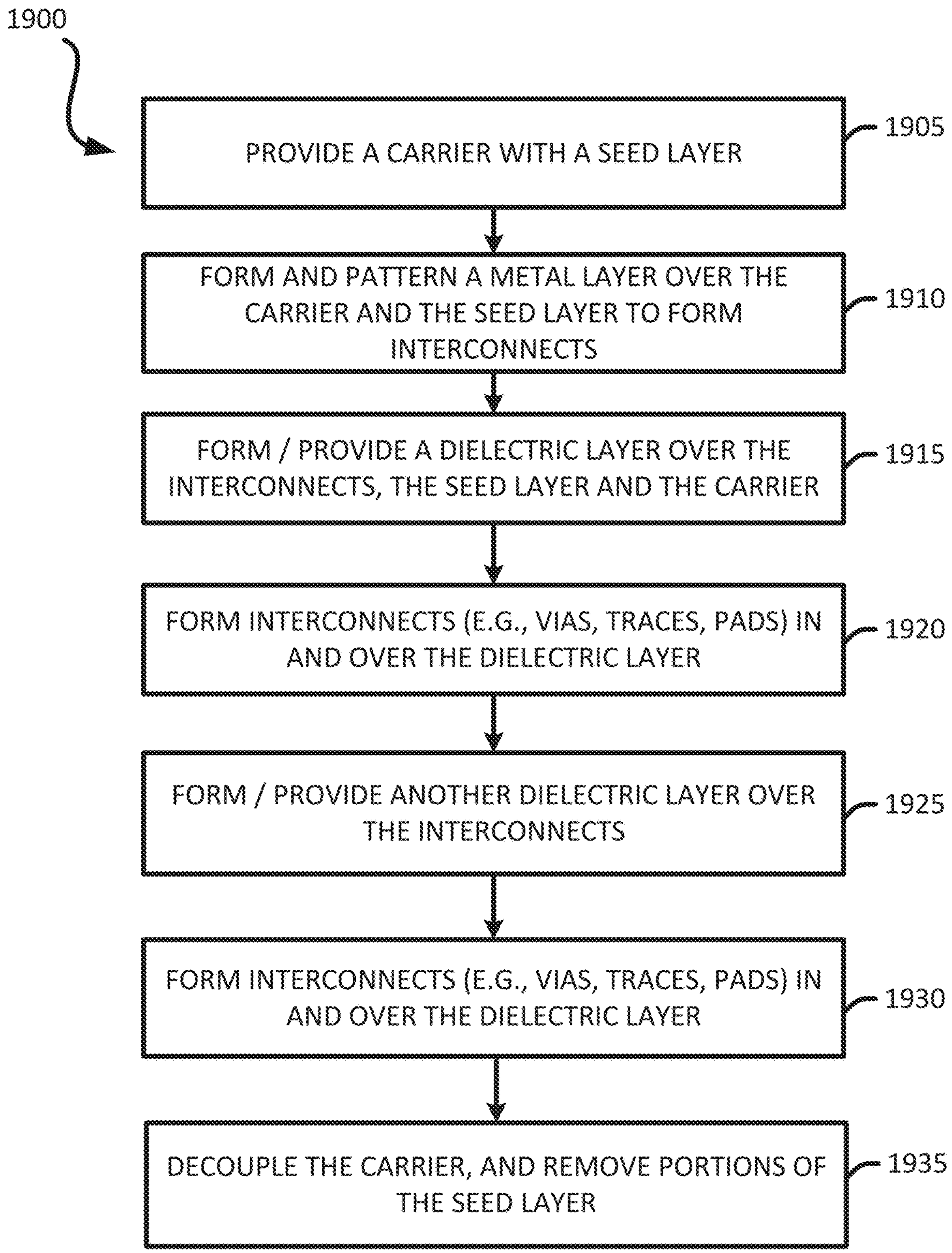
FIG. 19 illustrates an exemplary flow diagram of a method for fabricating a metallization portion.

In some implementations, fabricating a metallization portion includes several processes. FIG. 19 illustrates an exemplary flow diagram of a method 1900 for providing or fabricating a metallization portion. The metallization portion may be implemented as a metallization portion block. In some implementations, the method 1900 of FIG. 19 may be used to provide or fabricate the metallization portion of the disclosure. For example, the method 1900 of FIG. 19 may be used to fabricate the metallization portion 104 and/or the metallization portion 106. However, the method 1900 of FIG. 19 will be described to fabricate the interconnection portion block 109.

It should be noted that the method 1900 of FIG. 19 may combine one or more processes in order to simplify and/or clarify the method for providing or fabricating a metallization portion. In some implementations, the order of the processes may be changed or modified.

The method provides (at 1905) a carrier (e.g., 1800). Different implementations may use different materials for the carrier 1800. The carrier 1800 may include a seed layer (e.g., 1801). The seed layer 1801 may include a metal (e.g., copper). The carrier may include a substrate, glass, quartz and/or carrier tape. Stage 1 of FIG. 18A, illustrates and describes an example of a carrier with a seed layer that is provided.

The method forms and patterns (at 1910) interconnects over the carrier 1800 and the seed layer 1801. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 192). Stage 1 of FIG. 18A, illustrates and describes an example of forming and patterning interconnects over a seed layer and a carrier. It is noted that instead of a carrier, interconnects may be formed over a surface of an encapsulated portion (e.g., 102) that includes an encapsulation layer and interconnects, such as when a metallization portion 104 and/or a metallization portion 106 are fabricated.

The method forms/provides (at 1915) a dielectric layer 1820 over the seed layer 1801, the carrier 1800 and the interconnects 1802. A deposition and/or lamination process may be used to form the dielectric layer 1820. The dielectric layer 1820 may include prepreg and/or polyimide. The dielectric layer 1820 may include a photo-imageable dielectric. Forming the dielectric layer 1820 may also include forming a plurality of cavities (e.g., 1810) in the dielectric layer 1820. The plurality of cavities may be formed using a photolithography or laser process. A masking, an exposure and/or a development process may be used to form the plurality of cavities 1810. Stages 2-3 of FIG. 18A, illustrate and describe an example of forming a dielectric layer and cavities in the dielectric layer.

The method forms (at 1920) interconnects in and over the dielectric layer. For example, the interconnects 1812 may be formed in and over the dielectric layer 1820. A plating process may be used to form the interconnects. Forming interconnects may include providing a patterned metal layer over and/or in the dielectric layer. Forming interconnects may also include forming interconnects in cavities of the dielectric layer. Stage 4 of FIG. 18A, illustrates and describes an example of forming interconnects in and over a dielectric layer.

The method forms/provides (at 1925) a dielectric layer 1822 over the dielectric layer 1820 and the interconnects 1812. A deposition and/or lamination process may be used to form the dielectric layer 1822. The dielectric layer 1822 may include prepreg and/or polyimide. The dielectric layer 1822 may include a photo-imageable dielectric. Forming the dielectric layer 1822 may also include forming a plurality of cavities (e.g., 1830) in the dielectric layer 1822. The plurality of cavities may be formed using a photolithography process or laser process. A masking, an exposure and/or a development process may be used to form the plurality of cavities 1830. Stages 5-6 of FIGS. 18A-18B, illustrate and describe an example of forming a dielectric layer and cavities in the dielectric layer.

The method forms (at 1930) interconnects in and over the dielectric layer. For example, the interconnects 1814 may be formed in and over the dielectric layer 1822. A plating process may be used to form the interconnects. Forming interconnects may include providing a patterned metal layer over and/or in the dielectric layer. Forming interconnects may also include forming interconnects in cavities of the dielectric layer. Stage 7 of FIG. 18B, illustrates and describes an example of forming interconnects in and over a dielectric layer. The method may form additional dielectric layer(s) and additional interconnects as described at 1925 and 1930.

In some implementations, once all the dielectric layer(s) and additional interconnects are formed, the method may decouple (at 1935) the carrier (e.g., 1800) from the seed layer (e.g., 1801). The carrier 1800 may be detached and/or grinded off. The method may also remove (at 1935) portions of the seed layer (e.g., 1801). An etching process may be used to remove portions of the seed layer 1801. Stage 8 of FIG. 18B, illustrates and describes an example of decoupling a carrier and seed layer removal.

Figure 20:
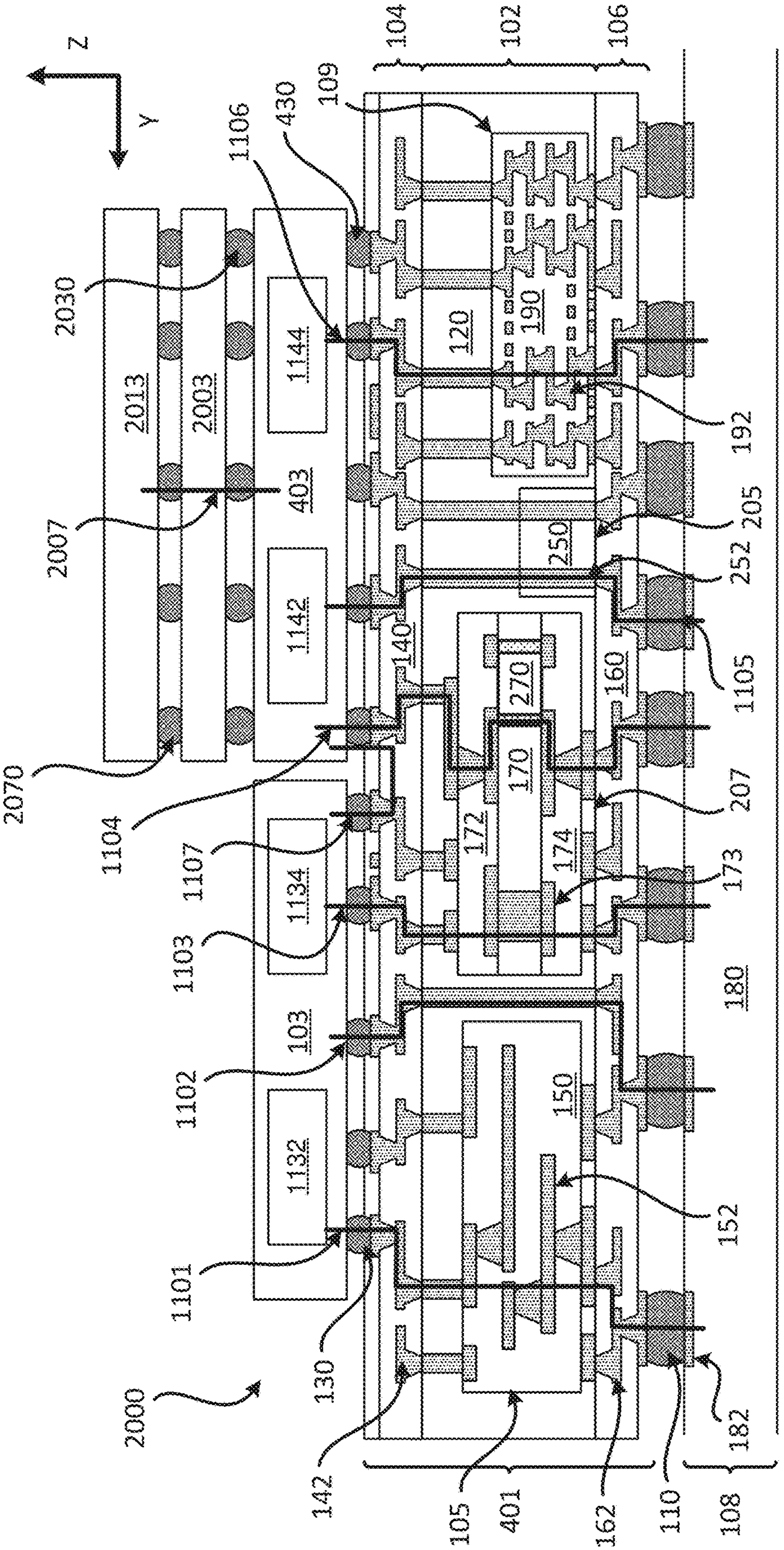
FIG. 20 illustrates a cross sectional profile view of another exemplary package comprising a package substrate with an encapsulated portion with several interconnection portion blocks.

Exemplary Package Comprising a Package Substrate that Includes an Encapsulated Portion with Interconnection Portion Blocks FIG. 20 illustrates exemplary electrical paths for the package 2000 that includes a package substrate with an encapsulation portion with interconnection portion blocks. The package 2000 is similar to the package 1100 of FIG. 11. The package 2000 includes the integrated device 103, the integrated device 403, the integrated device 2003 and the integrated device 2013. The package 2000 also includes the package substrate 401, as described in at least FIGS. 4 and 11.

The integrated device 2003 is coupled to the integrated device 403 through a plurality of solder interconnects 2030. The integrated device 2013 is coupled to the integrated device 2003 through a plurality of solder interconnects 2070. In some implementations, the front side of the integrated device 2003 faces the back side of the integrated device 403. In some implementations, the back side of the integrated device 2003 faces the back side of the integrated device 403. In some implementations, the front side of the integrated device 2013 faces the back side of the integrated device 2013. In some implementations, the back side of the integrated device 2013 faces the back side of the integrated device 2013. In some implementations, the front side of the integrated device 2013 faces the front side of the integrated device 2013. In some implementations, the back side of the integrated device 2013 faces the front side of the integrated device 2013. FIG. 20 illustrates stacked integrated devices that may be defined by the integrated device 403, the integrated device 2003 and/or the integrated device 2013.

FIG. 20 illustrates an electrical path 1101, an electrical path 1102, an electrical path 1103, an electrical path 1104, an electrical path 1105, an electrical path 1106, an electrical path 1107 and an electrical path 2007. The electrical path 1101, the electrical path 1102, the electrical path 1103, the electrical path 1104, the electrical path 1105, the electrical path 1106, and the electrical path 1107 may be similar to the electrical paths illustrated and described in FIG. 11.

The electrical path 2007 may be an electrical path between the integrated device 403 and the integrated device 2013. The electrical path 2007 between the integrated device 403 and the integrated device 2013 may include (i) a solder interconnect from the plurality of solder interconnects 2030, (ii) interconnects from the integrated device 2003, and (iii) a solder interconnect from the plurality of solder interconnects 2070. Depending on how the integrated device 2003 is coupled to the integrated device 403 and/or how the integrated device 2013 is coupled to the integrated device 2003, the electrical path 2007 may extend through the back side of an integrated device and/or the front side of another integrated device. For example, the electrical path 2007 may extend through the back side of the integrated device 403, through a solder interconnect from the plurality of solder interconnects 2030, through the front side of the integrated device 2003, through the back side of the integrated device 2003, through a solder interconnect from the plurality of solder interconnects 2070 and through the front side of the integrated device 2013. The electrical path 2007 may be configured to be electrically coupled to the electrical path 1104, the electrical path 1105, the electrical path 1106 and/or the electrical path 1107.

Figure 21:
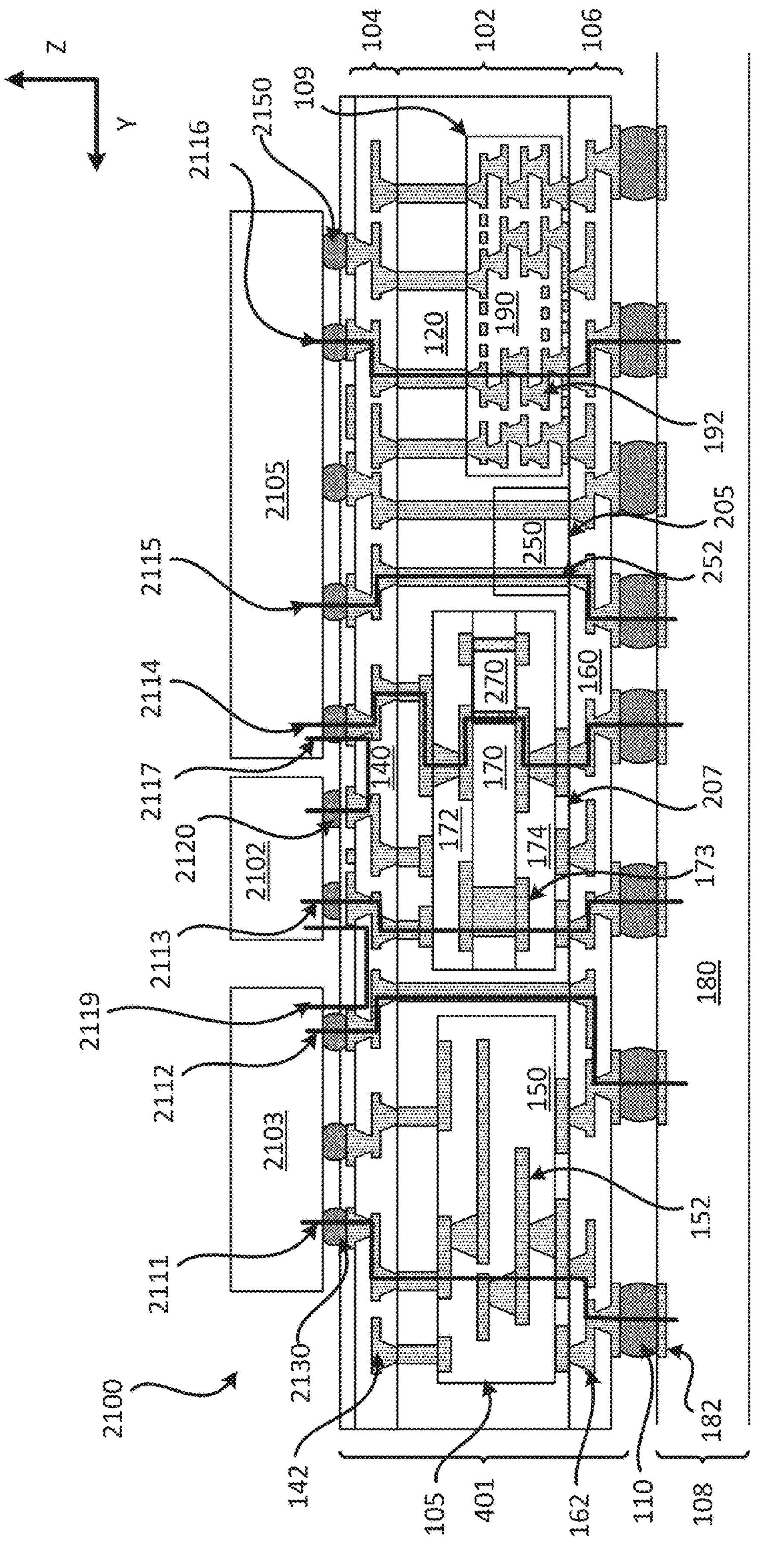
FIG. 21 illustrates a cross sectional profile view of another exemplary package comprising a package substrate with an encapsulated portion with several interconnection portion blocks.

FIG. 21 illustrates exemplary electrical paths for the package 2100 that includes a package substrate with an encapsulation portion with interconnection portion blocks. The package 2100 is similar to the package 1100 of FIG. 11. The package 2100 includes the integrated device 2102, the integrated device 2103 and the integrated device 2105. The package 2100 also includes the package substrate 401, as described in at least FIGS. 4 and 11.

The integrated device 2102 is coupled to the package substrate 401 through a plurality of solder interconnects 2120. The integrated device 2103 is coupled to the package substrate 401 through a plurality of solder interconnects 2130. The integrated device 2105 is coupled to the package substrate 401 through a plurality of solder interconnects 2150. The integrated device 2102, the integrated device 2103 and the integrated device 2105 are coupled to the metallization portion 104 of the package substrate 401.

As an example, in some implementations, the integrated device 2102 may be a first chiplet and the integrated device 2105 may be a second chiplet. The integrated device 2103 may include memory, such as a SRAM. In some implementations, an electrical path to the integrated device 2103 may include a cored substrate block and/or a coreless substrate block. In some implementations, the integrated device 2102 may include a relaxed technology node chiplet. In some implementations, an electrical path to the integrated device 2102 may include an embedded trace substrate block and/or a cored substrate block. In some implementations, the integrated device 2105 may include an advanced technology node chiplet. In some implementations, an electrical path to the integrated device 2105 may include a metallization portion block (e.g., redistribution portion block).

FIG. 21 illustrates an electrical path 2111, an electrical path 2112, an electrical path 2113, an electrical path 2114, an electrical path 2115, an electrical path 2116, an electrical path 2117 and an electrical path 2119.

The electrical path 2111 may include an electrical path between the integrated device 2103 and the board 108. However, it is noted that the electrical path 2111 may extend to other components beyond the board 108. The electrical path 2111 between the integrated device 2103 and the board 108 may include (i) a solder interconnect from the plurality of solder interconnects 2130, (ii) metallization interconnects from the plurality of metallization interconnects 142 of the metallization portion 104, (iii) a pillar interconnect from the plurality of pillar interconnects 122, (iv) interconnects from the plurality of interconnects 152 of the interconnection portion block 105, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 2112 may include an electrical path between the integrated device 2103 and the board 108. However, it is noted that the electrical path 2112 may extend to other components beyond the board 108. The electrical path 2112 between the integrated device 2103 and the board 108 may include (i) a solder interconnect from the plurality of solder interconnects 2130, (ii) metallization interconnects from the plurality of metallization interconnects 142 of the metallization portion 104, (iii) a pillar interconnect from the plurality of pillar interconnects 122, (iv) metallization interconnects from the plurality of metallization interconnects 162 of the metallization portion 106, (v) a solder interconnect from the plurality of solder interconnects 110, and (vi) a board interconnect from the plurality of board interconnects 182.

The electrical path 2113 may include an electrical path between the integrated device 2102 and the board 108. However, it is noted that the electrical path 2113 may extend to other components beyond the board 108. The electrical path 2113 between the integrated device 2102 and the board 108 may include (i) a solder interconnect from the plurality of solder interconnects 2120, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 2114 may include an electrical path between the integrated device 2105 and the board 108. However, it is noted that the electrical path 2114 may extend to other components beyond the board 108. The electrical path 2114 between the integrated device 2105 and the board 108 may include (i) a solder interconnect from the plurality of solder interconnects 2150, (ii) metallization interconnects from the plurality of metallization interconnects 142 of the metallization portion 104, (iii) a pillar interconnect from the plurality of pillar interconnects 122, (iv) interconnects from the plurality of interconnects 173 of the interconnection portion block 207, (v) the passive device 270, (vi) more interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 2115 may include an electrical path between the integrated device 2105 and the board 108. However, it is noted that the electrical path 2115 may extend to other components beyond the board 108. The electrical path 2115 between the integrated device 2105 and the board 108 may include (i) a solder interconnect from the plurality of solder interconnects 2150, (ii) metallization interconnects from the plurality of metallization interconnects 142 of the metallization portion 104, (iii) a pillar interconnect from the plurality of pillar interconnects 122, (iv) an interconnect from the plurality of interconnects 252 of the interconnection portion block 205, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 2116 may include an electrical path between the integrated device 2105 and the board 108. However, it is noted that the electrical path 2116 may extend to other components beyond the board 108. The electrical path 2116 between the integrated device 2105 and the board 108 may include (i) a solder interconnect from the plurality of solder interconnects 2150, (ii) metallization interconnects from the plurality of metallization interconnects 142 of the metallization portion 104, (iii) a pillar interconnect from the plurality of pillar interconnects 122, (iv) interconnects from the plurality of interconnects 192 of the interconnection portion block 109, (v) metallization interconnects from the plurality of metallization interconnects 162 of the metallization portion 106, (vi) a solder interconnect from the plurality of solder interconnects 110, and (vii) a board interconnect from the plurality of board interconnects 182.

The electrical path 2117 may include an electrical path between the integrated device 2102 and the integrated device 2105. The electrical path 2117 between the integrated device 2102 and the integrated device 2105 may include (i) a solder interconnect from the plurality of solder interconnects 2120, (ii) metallization interconnects from the plurality of metallization interconnects 142 of the metallization portion 104, and (iii) a solder interconnect from the plurality of solder interconnects 2150.

The electrical path 2119 may include an electrical path between the integrated device 2102 and the integrated device 2103. The electrical path 2119 between the integrated device 2102 and the integrated device 2103 may include (i) a solder interconnect from the plurality of solder interconnects 2120, (ii) metallization interconnects from the plurality of metallization interconnects 142 of the metallization portion 104, and (iii) a solder interconnect from the plurality of solder interconnects 2130.

Figure 22:
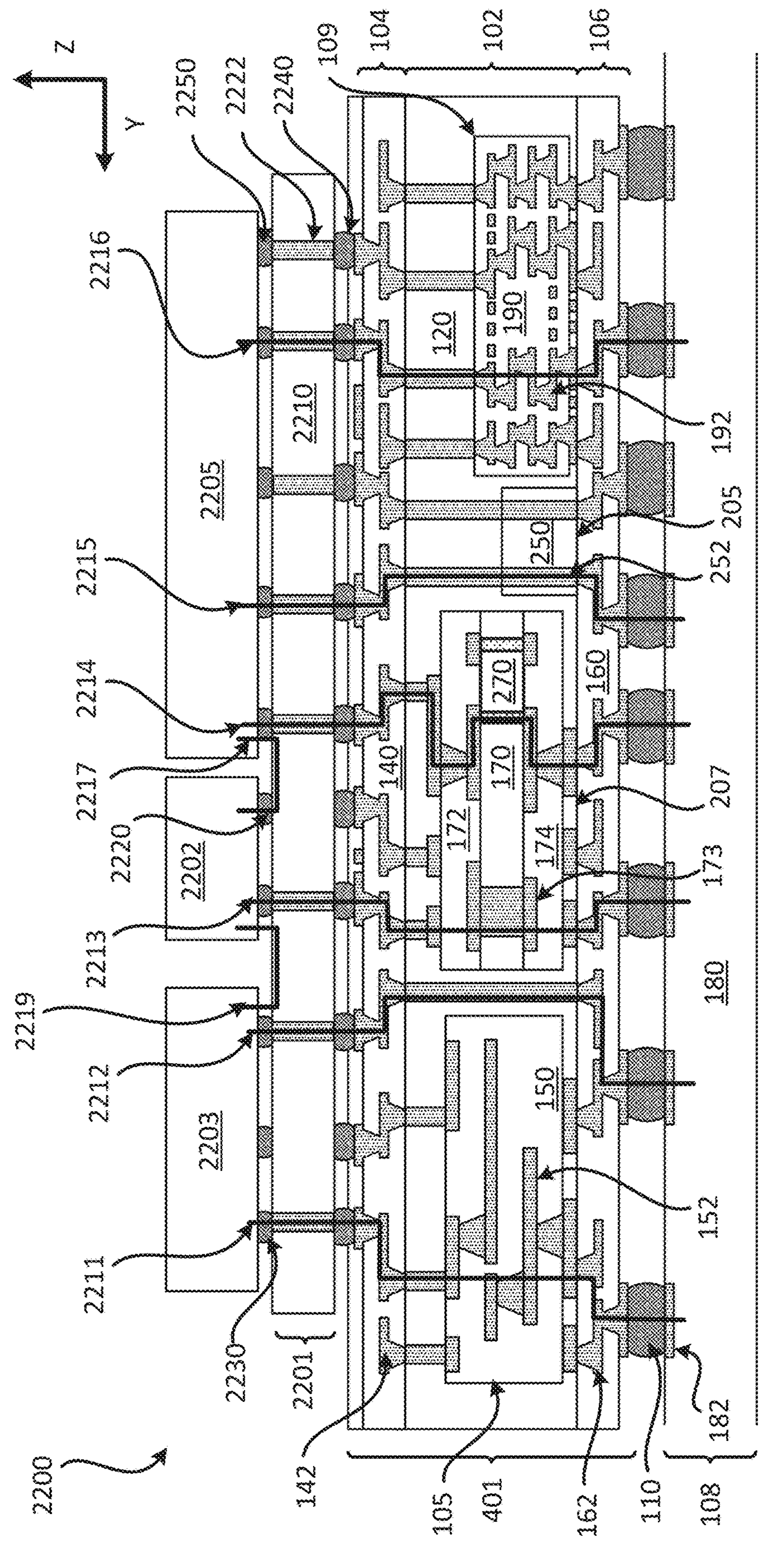
FIG. 22 illustrates a cross sectional profile view of another exemplary package comprising a package substrate with an encapsulated portion with several interconnection portion blocks.

FIG. 22 illustrates exemplary electrical paths for the package 2200 that includes a package substrate with an encapsulation portion with interconnection portion blocks. The package 2200 is similar to the package 2100 of FIG. 21. The package 2200 also includes an interposer 2201, an integrated device 2202, an integrated device 2203 and an integrated device 2205. The package 2200 also includes the package substrate 401, as described in at least FIGS. 4 and 11.

The interposer 2201 is located between the package substrate 401 and the integrated devices (e.g., 2202, 2203, 2205). The interposer 2201 may include interposer substrate 2210 (e.g., silicon substrate, silicon interposer substrate) and a plurality of interconnects 2222 (e.g., plurality of interposer interconnects). The plurality of interconnects 2222 may include via interconnects. In some implementations, the plurality of interconnects 2222 may also include trace interconnects and pad interconnects. The interposer 2201 is coupled to the package substrate 401 through a plurality of solder interconnects 2240. The interposer 2201 may be coupled to the metallization portion 104 of the package substrate 401.

The integrated device 2202 is coupled to the interposer 2201 through a plurality of solder interconnects 2220. The integrated device 2203 is coupled to the interposer 2201 through a plurality of solder interconnects 2230. The integrated device 2205 is coupled to the interposer 2201 through a plurality of solder interconnects 2250.

FIG. 22 illustrates an electrical path 2211, an electrical path 2212, an electrical path 2213, an electrical path 2214, an electrical path 2215, an electrical path 2216, an electrical path 2217 and an electrical path 2219.

The electrical path 2211 may include an electrical path between the integrated device 2203 and the board 108. However, it is noted that the electrical path 2211 may extend to other components beyond the board 108. The electrical path 2211 between the integrated device 2203 and the board 108 may include (i) a solder interconnect from the plurality of solder interconnects 2230, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) interconnects from the plurality of interconnects 152 of the interconnection portion block 105, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 2212 may include an electrical path between the integrated device 2203 and the board 108. However, it is noted that the electrical path 2212 may extend to other components beyond the board 108. The electrical path 2212 between the integrated device 2203 and the board 108 may include (i) a solder interconnect from the plurality of solder interconnects 2230, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) metallization interconnects from the plurality of metallization interconnects 162 of the metallization portion 106, (vii) a solder interconnect from the plurality of solder interconnects 110, and (viii) a board interconnect from the plurality of board interconnects 182.

The electrical path 2213 may include an electrical path between the integrated device 2202 and the board 108. However, it is noted that the electrical path 2213 may extend to other components beyond the board 108. The electrical path 2213 between the integrated device 2202 and the board 108 may include (i) a solder interconnect from the plurality of solder interconnects 2220, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 2214 may include an electrical path between the integrated device 2205 and the board 108. However, it is noted that the electrical path 2214 may extend to other components beyond the board 108. The electrical path 2214 between the integrated device 2205 and the board 108 may include (i) a solder interconnect from the plurality of solder interconnects 2250, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) interconnects from the plurality of interconnects 173 of the interconnection portion block 207, (vii) the passive device 270, (viii) more interconnects from the plurality of interconnects 173 of the interconnection portion block 207, (ix) metallization interconnects from the plurality of metallization interconnects 162 of the metallization portion 106, (x) a solder interconnect from the plurality of solder interconnects 110, and (xi) a board interconnect from the plurality of board interconnects 182.

The electrical path 2215 may include an electrical path between the integrated device 2205 and the board 108. However, it is noted that the electrical path 2215 may extend to other components beyond the board 108. The electrical path 2215 between the integrated device 2205 and the board 108 may include (i) a solder interconnect from the plurality of solder interconnects 2250, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) an interconnect from the plurality of interconnects 252 of the interconnection portion block 205, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 2216 may include an electrical path between the integrated device 2205 and the board 108. However, it is noted that the electrical path 2216 may extend to other components beyond the board 108. The electrical path 2216 between the integrated device 2205 and the board 108 may include (i) a solder interconnect from the plurality of solder interconnects 2250, (ii) at least one interconnect from the plurality of interconnects 2222, (iii) a solder interconnect from the plurality of solder interconnects 2240, (iv) metallization interconnects from the plurality of metallization interconnects 142 of the metallization portion 104, (v) a pillar interconnect from the plurality of pillar interconnects 122, (vi) interconnects from the plurality of interconnects 192 of the interconnection portion block 109, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

The electrical path 2217 may include an electrical path between the integrated device 2202 and the integrated device 2205. The electrical path 2217 between the integrated device 2202 and the integrated device 2205 may include (i) a solder interconnect from the plurality of solder interconnects 2220, (ii) at least one interconnect from the plurality of interconnects 2222, and (iii) a solder interconnect from the plurality of solder interconnects 2250.

The electrical path 2219 may include an electrical path between the integrated device 2202 and the integrated device 2203. The electrical path 2219 between the integrated device 2202 and the integrated device 2203 may include (i) a solder interconnect from the plurality of solder interconnects 2220, (ii) at least one interconnect from the plurality of interconnects 2222, and (iii) a solder interconnect from the plurality of solder interconnects 2230.

It is noted that the use of the interposer 2201 is noted limited to the package 2200. The interposer 2201 may be implemented in other packages, including other packages described and illustrated in the disclosure, in a similar manner.

It is noted that in some implementations, an integrated device may be coupled to another components, such as a package substrate or another integrated device through a plurality of pillar interconnects and a plurality of solder interconnects. Thus, when an integrated device is shown and described as being coupled to another component through a plurality of solder interconnects, that integrated device may be coupled to another component through a plurality of pillar interconnects and a plurality of solder interconnects.

It is noted that the electrical paths shown are exemplary. Different implementations may have different electrical paths. Different implementations may have a different number of electrical paths. In some implementations, an electrical path may represent one electrical path from the many electrical paths between two or more components.

Figure 23:
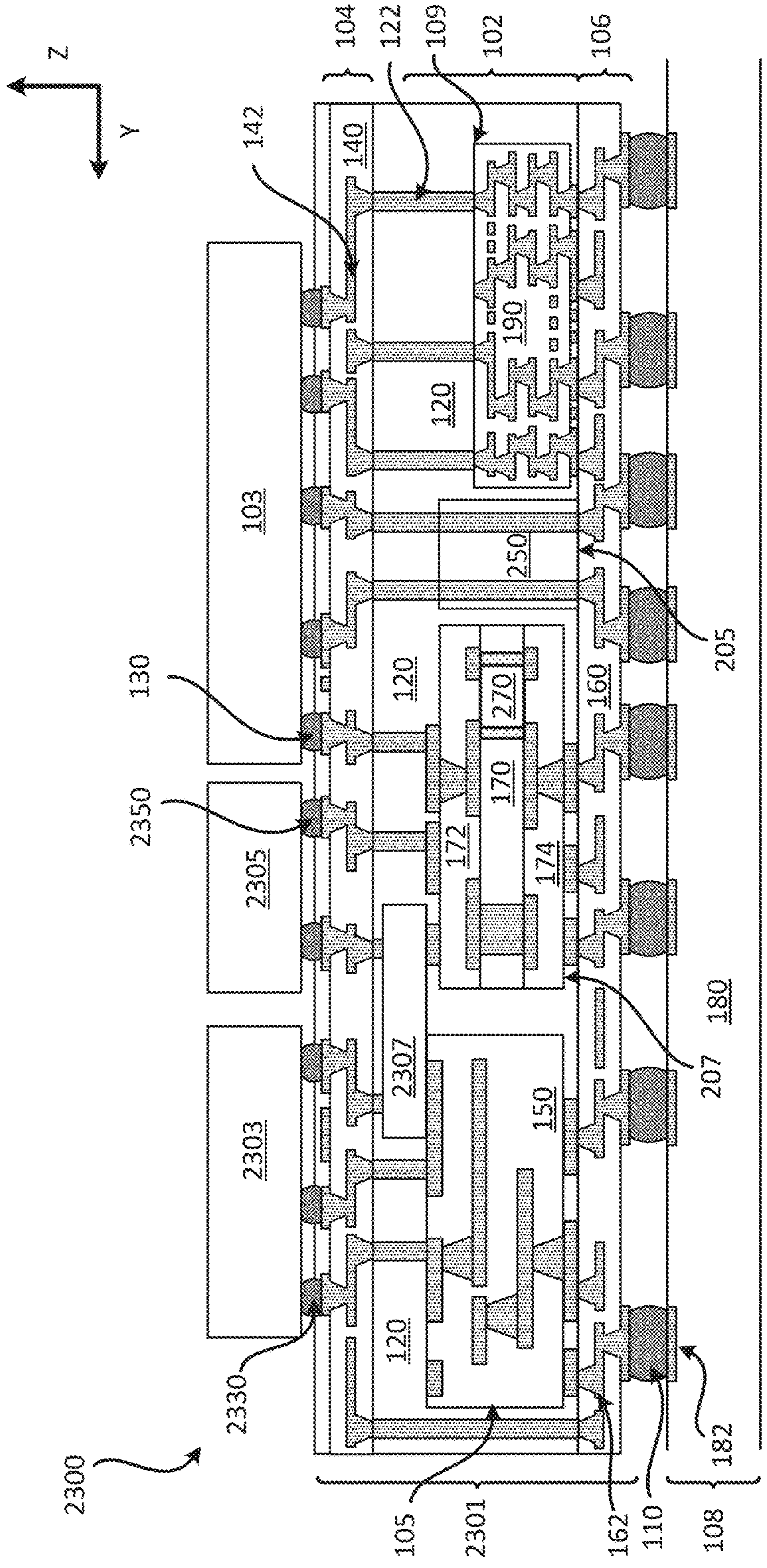
FIG. 23 illustrates a cross sectional profile view of an exemplary package comprising a package substrate with encapsulated portion with several interconnection portion blocks and a bridge.

FIG. 23 illustrates a cross sectional profile view of a package 2300 that includes a package substrate with an encapsulated portion comprising several interconnection portion blocks. The package 2300 is similar to at least the package 400 of FIG. 4, and includes similar components. The package 2300 is coupled to the board 108 through a plurality of solder interconnects 110. The package 2300 includes a package substrate 2301, an integrated device 103, an integrated device 2303 and an integrated device 2305. The integrated device 103 is coupled to the package substrate 2301 through a plurality of solder interconnects 130. There may be a plurality of pillar interconnects (not shown) between the integrated device 103 and the plurality of solder interconnects 130. In some implementations, the plurality of pillar interconnects (not shown) coupled to the integrated device 103 and the plurality of solder interconnects 130, are considered part of the integrated device 103.

The integrated device 2303 is coupled to the package substrate 2301 through a plurality of solder interconnects 2330. There may be a plurality of pillar interconnects (not shown) between the integrated device 2303 and the plurality of solder interconnects 2330. In some implementations, the plurality of pillar interconnects (not shown) coupled to the integrated device 2303 and the plurality of solder interconnects 2330, are considered part of the integrated device 2303.

The integrated device 2305 is coupled to the package substrate 2301 through a plurality of solder interconnects 2350. There may be a plurality of pillar interconnects (not shown) between the integrated device 2305 and the plurality of solder interconnects 2350. In some implementations, the plurality of pillar interconnects (not shown) coupled to the integrated device 2305 and the plurality of solder interconnects 2350, are considered part of the integrated device 2305.

The package substrate 2301 is similar to the package substrate 401, as described in at least FIG. 4. As such, the package substrate 2301 includes the same and/or similar components as described for at least the package substrate 401. In addition, the package substrate 2301 includes a bridge 2307. The bridge 2307 may be a silicon bridge. The bridge 2307 may include a plurality of bridge interconnects (not shown) and a bridge substrate. The bridge 2307 may be located in at least the encapsulation layer 120. Thus, the bridge 2307 may be at least partially encapsulated by the encapsulation layer 120. For example, the bridge 2307 may be at least partially embedded in the encapsulation layer 120. The bridge 2307 may be touching one or more of the interconnection portion blocks. For example, the bridge 2307 may be touching the interconnection portion block 105 and the interconnection portion block 207. In some implementations, an adhesive may be used to couple the back side of the bridge 2307 to the interconnection portion block 105 and the interconnection portion block 207.

In some implementations, the bridge 2307 is configured to provide an electrical path between the integrated device 2303 and the integrated device 2305. For example, an electrical path between the integrated device 2303 and the integrated device 2305 may include (i) at least one solder interconnect from the plurality of solder interconnects 2330, (ii) at least one metallization interconnect from the plurality of metallization interconnects 142, (iii) at least one pillar interconnect from the plurality of pillar interconnects 122, (iv) the bridge 2307 (e.g., bridge interconnects), (v) at least one pillar interconnect from the plurality of pillar interconnects 122, (vi) at least one metallization interconnect from the plurality of metallization interconnects 142, and (vii) at least one solder interconnect from the plurality of solder interconnects 2350.

It is noted that the bridge 2307 of FIG. 23 may be located anywhere in the encapsulation layer 120. Moreover, the bridge 2307 may be configured to provide electrical paths for any combination of integrated devices. Other electrical paths between different components in the package 2300 may be similar and/or the same as the electrical paths described in at least FIGS. 4, 10 and 11.

Figure 24:
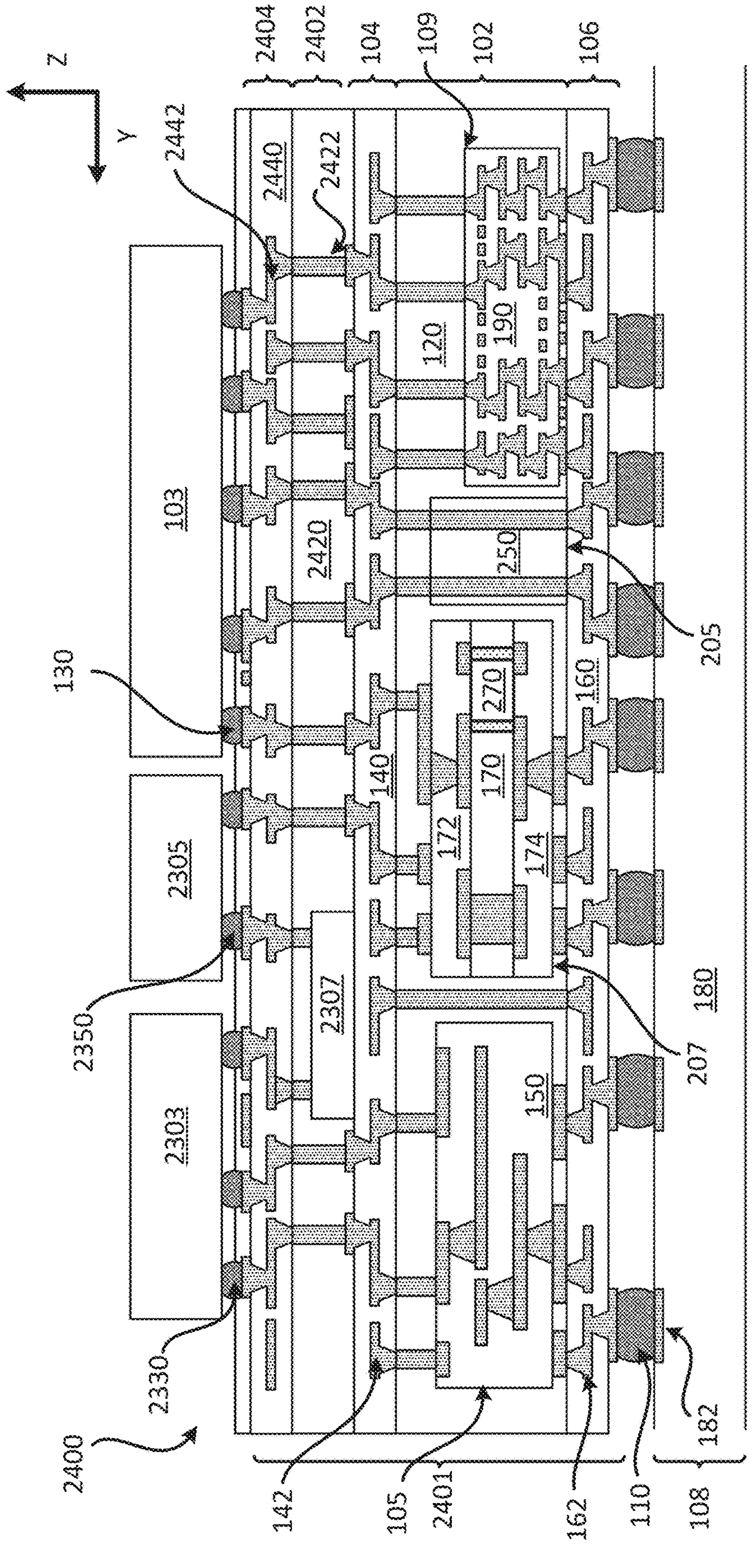
FIG. 24 illustrates a cross sectional profile view of another exemplary package comprising a package substrate with an encapsulated portion with several interconnection portion blocks and a bridge.

FIG. 24 illustrates a cross sectional profile view of a package 2400 that includes a package substrate with an encapsulated portion comprising several interconnection portion blocks. The package 2400 is similar to at least the package 2300 of FIG. 23, and includes similar components. The package 2400 is coupled to the board 108 through a plurality of solder interconnects 110. The package 2400 includes a package substrate 2401, an integrated device 103, an integrated device 2303 and an integrated device 2305. The package substrate 2401 is similar to the package substrate 2301. However, the package substrate 2401 may also include a metallization portion 2404 and an encapsulated portion 2402.

The package substrate 2401 includes a metallization portion 104, a metallization portion 106, a metallization portion 2404, an encapsulated portion 102 and an encapsulated portion 2402. The metallization portion 106, the encapsulated portion 102 and the metallization portion 104 may be similar and/or the same as described above in at least FIGS. 1 and 4. The encapsulated portion 2402 is coupled to the metallization portion 104. The metallization portion 2404 is coupled to the encapsulated portion 2402. The encapsulated portion 2402 includes an encapsulation layer 2420 and a plurality of pillar interconnects 2422. The metallization portion 2404 includes at least one dielectric layer 2440 and a plurality of metallization interconnects 2442.

The plurality of pillar interconnects 2422 are coupled to the plurality of metallization interconnects 142 of the metallization portion 104 and the plurality of metallization interconnects 2442 of the metallization portion 2404. The plurality of pillar interconnects 2422 may be located at least partially in the encapsulation layer 2420.

The integrated device 103 is coupled to the package substrate 2401 through a plurality of solder interconnects 130. The integrated device 103 may be coupled to the metallization portion 2404 of the package substrate 2401 through a plurality of solder interconnects 2330. The integrated device 2303 is coupled to the package substrate 2401 through a plurality of solder interconnects 2330. The integrated device 2303 may be coupled to the metallization portion 2404 of the package substrate 2401 through a plurality of solder interconnects 2330. The integrated device 2305 is coupled to the package substrate 2401 through a plurality of solder interconnects 2350. The integrated device 2305 may be coupled to the metallization portion 2404 of the package substrate 2401 through a plurality of solder interconnects 2350.

The bridge 2307 may located and/or embedded at least partially in the encapsulated portion 2402. The bridge 2307 may located and/or embedded at least partially in the encapsulation layer 2420. The encapsulation layer 2420 may be similar or the same as the encapsulation layer 120. Some pillar interconnects from the plurality of pillar interconnects 2422 may be coupled to the bridge 2307. A back side of the bridge 2307 may face and/or be coupled to the metallization portion 104.

In some implementations, the bridge 2307 is configured to provide an electrical path between the integrated device 2303 and the integrated device 2305. For example, an electrical path between the integrated device 2303 and the integrated device 2305 may include (i) at least one solder interconnect from the plurality of solder interconnects 2330, (ii) at least one metallization interconnect from the plurality of metallization interconnects 2442, (iii) at least one pillar interconnect from the plurality of pillar interconnects 2422, (iv) the bridge 2307 (e.g., bridge interconnects), (v) at least one pillar interconnect from the plurality of pillar interconnects 2422, (vi) at least one metallization interconnect from the plurality of metallization interconnects 2442, and (vii) at least one solder interconnect from the plurality of solder interconnects 2350.

It is noted that the bridge 2307 of FIG. 24 may be located anywhere in the encapsulation layer 120. Moreover, the bridge 2307 may be configured to provide electrical paths for any combination of integrated devices. Other electrical paths between different components in the package 2400 may be similar and/or the same as the electrical paths described in at least FIGS. 4, 10 and 11. However, the electrical paths for these different components may also include metallization interconnects from the plurality of metallization interconnects 2442 and/or pillar interconnects from the plurality of pillar interconnects 2422.

An electrical path between the integrated device 2303 and the board 108 may include (i) a solder interconnect from the plurality of solder interconnects 2330, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 152 of the interconnection portion block 105, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 2303 and the board 108 may include (i) a solder interconnect from the plurality of solder interconnects 2330, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) metallization interconnects from the plurality of metallization interconnects 162 of the metallization portion 106, (vii) a solder interconnect from the plurality of solder interconnects 110, and (viii) a board interconnect from the plurality of board interconnects 182.

An electrical path between the integrated device 2305 and the board 108 may include (i) a solder interconnect from the plurality of solder interconnects 2350, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 173 of the interconnection portion block 207, (vii) the passive device 270, (viii) more interconnects from the plurality of interconnects 173 of the interconnection portion block 207, (ix) metallization interconnects from the plurality of metallization interconnects 162 of the metallization portion 106, (x) a solder interconnect from the plurality of solder interconnects 110, and (xi) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) an interconnect from the plurality of interconnects 252 of the interconnection portion block 205, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 192 of the interconnection portion block 109, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

It is noted that a package may include more than one bridge (e.g., 2307) in the package substrate 2301 and/or the package substrate 2401. For example, another bridge that is similar to the bridge 2307 may be configured to provide at least one electrical path between the integrated device 103 and the integrated device 2305.

Figure 25:
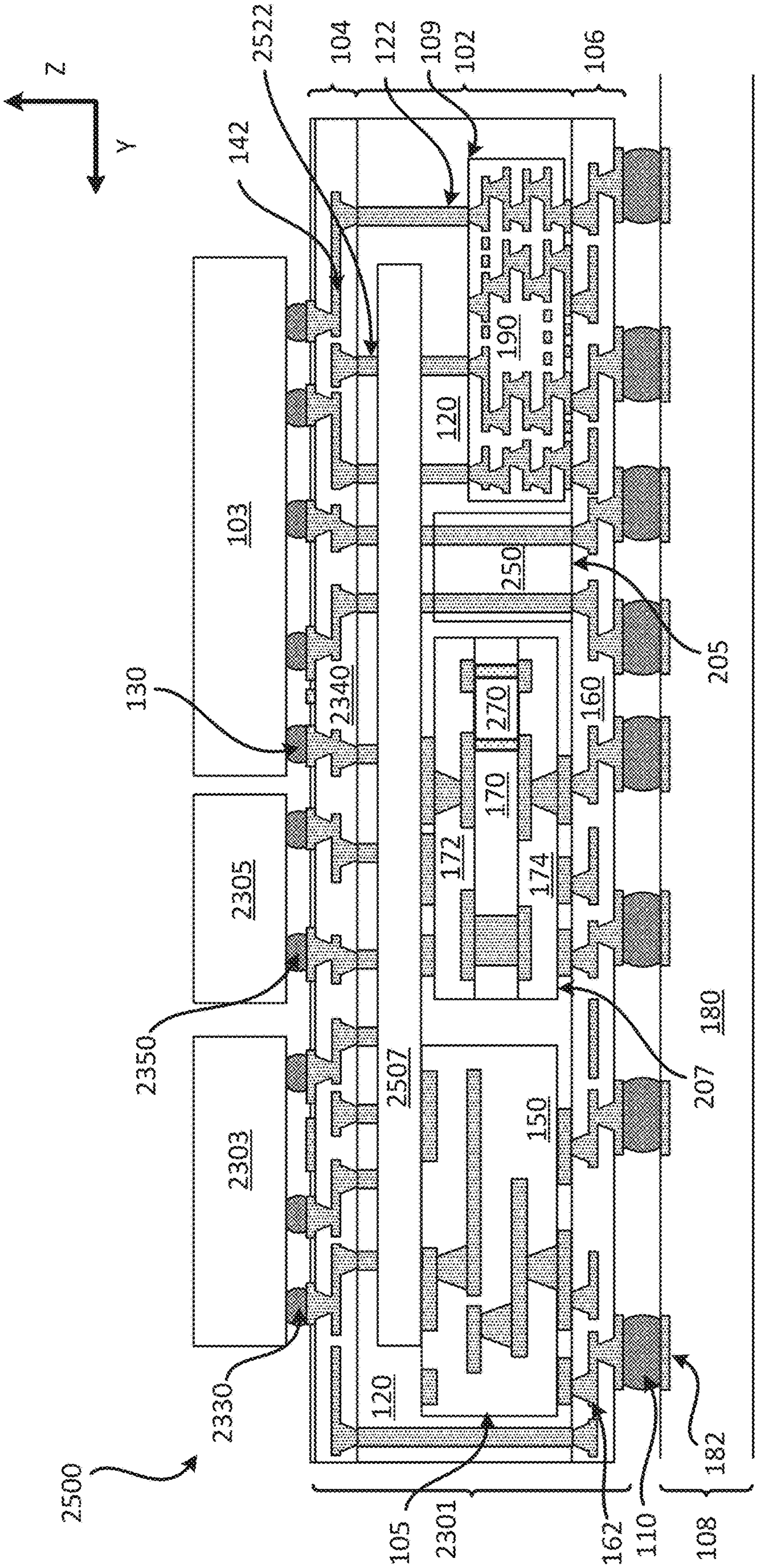
FIG. 25 illustrates a cross sectional profile view of an exemplary package comprising a package substrate with encapsulated portion with several interconnection portion blocks and an interposer.

FIG. 25 illustrates a cross sectional profile view of a package 2500 that includes a package substrate with an encapsulated portion comprising several interconnection portion blocks. The package 2500 is similar to at least the package 2300 of FIG. 23 and/or the package 400 of FIG. 4, and includes similar components. The package 2500 is coupled to the board 108 through a plurality of solder interconnects 110. The package 2500 may be arranged and/or configured in a similar manner as described for the package shown in at least FIG. 4 and/or FIG. 23.

The package 2500 includes an interposer 2507. The interposer 2507 may include at least one dielectric layer and a plurality of interposer interconnects (not shown). The interposer 2507 may be substrate that includes a dielectric layer and a plurality of interconnects. The interposer 2507 is located and/or embedded at least partially in the encapsulated portion 102. For example, the interposer 2507 may be located and/or embedded at least partially in the encapsulation layer 120. The encapsulation layer 120 may be considered as one encapsulation layer or may represent several encapsulation layers. In some implementations, the interposer 2507 may be coupled to one or more interconnection portion blocks (e.g., 105, 207) through a plurality of solder interconnects (not shown). Thus, solder interconnects may be located between interconnects of the interposer 2507 and interconnects from the interconnection portion blocks. In some implementations, interconnects from the interposer 2507 may be coupled to interconnects from the interconnection portion blocks may be coupled through hybrid bonding (e.g., metal to metal bonding).

In some implementations, one or more electrical paths to and/or from the integrated device 2303, the integrated device 2305 and/or the integrated device 103 may include interconnects from the interposer 2507. In some implementations, one or more electrical paths to and/or from the integrated device 2303, the integrated device 2305 and/or the integrated device 103 may bypass the interposer 2507.

An electrical path between the integrated device 2303 and the board 108 may include (i) a solder interconnect from the plurality of solder interconnects 2330, (ii) metallization interconnects from the plurality of metallization interconnects 142 of the metallization portion 104, (iii) a pillar interconnect from the plurality of pillar interconnects 2522, (iv) interconnects from the interposer 2507, (v) a pillar interconnect from the plurality of pillar interconnects 122, (vi) interconnects from the plurality of interconnects 152 of the interconnection portion block 105, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 2303 and the board 108 may include (i) a solder interconnect from the plurality of solder interconnects 2330, (ii) metallization interconnects from the plurality of metallization interconnects 142 of the metallization portion 104, (iii) a pillar interconnect from the plurality of pillar interconnects 2522, (iv) interconnects from the interposer 2507, (v) a pillar interconnect from the plurality of pillar interconnects 122, (vi) metallization interconnects from the plurality of metallization interconnects 162 of the metallization portion 106, (vii) a solder interconnect from the plurality of solder interconnects 110, and (viii) a board interconnect from the plurality of board interconnects 182.

An electrical path between the integrated device 2305 and the board 108 may include (i) a solder interconnect from the plurality of solder interconnects 2350, (ii) metallization interconnects from the plurality of metallization interconnects 142 of the metallization portion 104, (iii) a pillar interconnect from the plurality of pillar interconnects 2522, (iv) interconnects from the interposer 2507, (v) a pillar interconnect from the plurality of pillar interconnects 122, (vi) interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 2522, (iv) interconnects from the interposer 2507, (v) a pillar interconnect from the plurality of pillar interconnects 122, (vi) an interconnect from the plurality of interconnects 252 of the interconnection portion block 205, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 142 of the metallization portion 104, (iii) a pillar interconnect from the plurality of pillar interconnects 2522, (iv) interconnects from the interposer 2507, (v) a pillar interconnect from the plurality of pillar interconnects 122, (v) interconnects from the plurality of interconnects 192 of the interconnection portion block 109, (vi) metallization interconnects from the plurality of metallization interconnects 162 of the metallization portion 106, (viii) a solder interconnect from the plurality of solder interconnects 110, and (ix) a board interconnect from the plurality of board interconnects 182.

Figure 26:
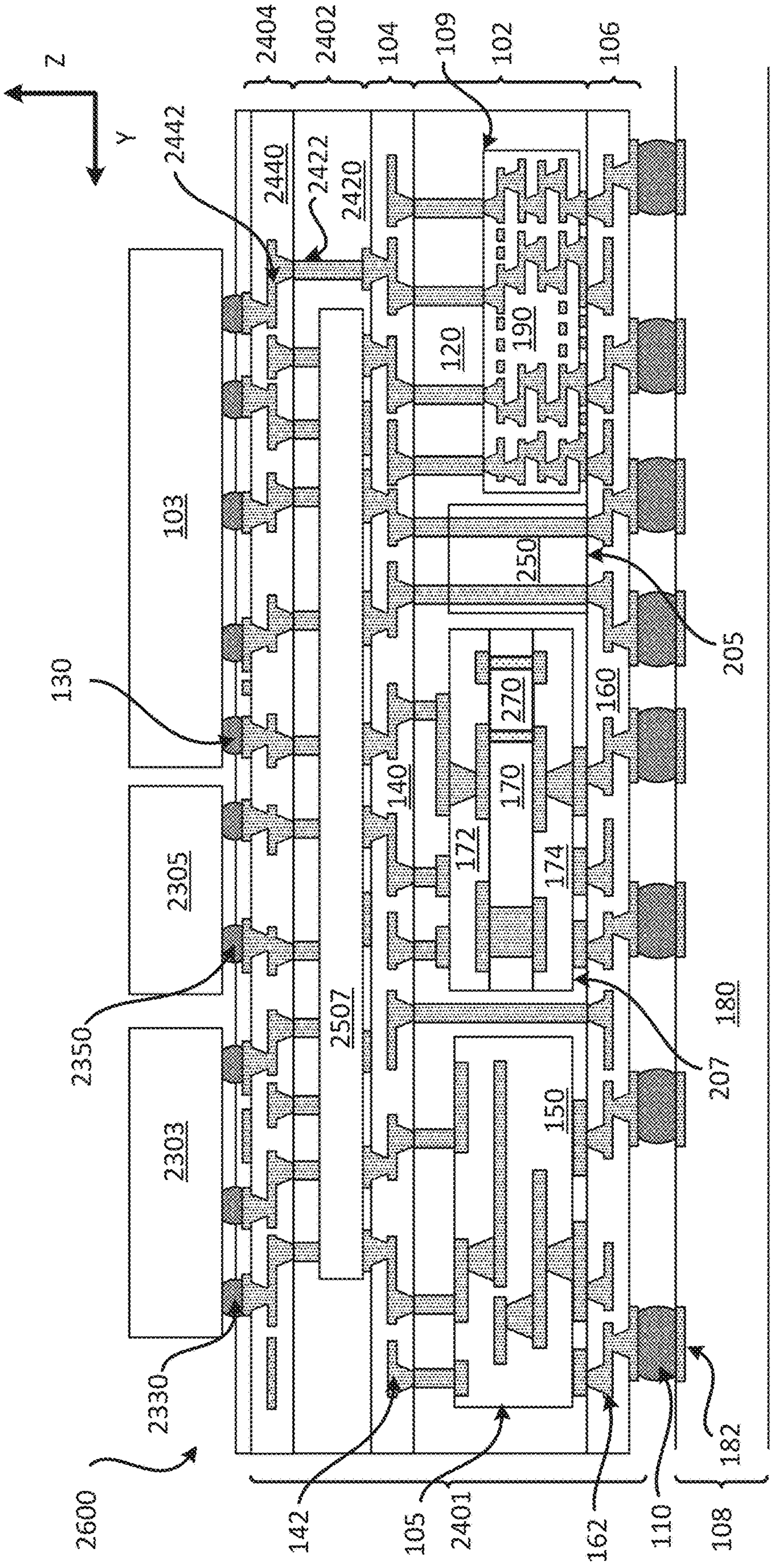
FIG. 26 illustrates a cross sectional profile view of another exemplary package comprising a package substrate with an encapsulated portion with several interconnection portion blocks and an interposer.

FIG. 26 illustrates a cross sectional profile view of a package 2600 that includes a package substrate with an encapsulated portion comprising several interconnection portion blocks. The package 2600 is similar to at least the package 2500 of FIG. 25, the package 2400 of FIG. 24 and/or the package 400 of FIG. 4, and includes similar components. The package 2600 is coupled to the board 108 through a plurality of solder interconnects 110. The package 2500 may be arranged and/or configured in a similar manner as described for the packages shown in at least FIG. 4, FIG. 23, FIG. 24 and/or FIG. 25.

The package 2600 includes a package substrate 2401, an integrated device 103, an integrated device 2303 and an integrated device 2305. The package substrate 2401 includes a metallization portion 104, a metallization portion 106, a metallization portion 2404, an encapsulated portion 102 and an encapsulated portion 2402. The encapsulated portion 2402 is coupled to the metallization portion 104. The metallization portion 2404 is coupled to the encapsulated portion 2402. The encapsulated portion 2402 includes an encapsulation layer 2420 and a plurality of pillar interconnects 2422. The metallization portion 2404 includes at least one dielectric layer 2440 and a plurality of metallization interconnects 2442.

The package 2600 includes an interposer 2507. The interposer 2507 may include at least one dielectric layer and a plurality of interposer interconnects (not shown). The interposer 2507 may be substrate that includes a dielectric layer and a plurality of interconnects. The interposer 2507 is located and/or embedded at least partially in the encapsulated portion 2402 of the package substrate 2401. For example, the interposer 2507 may be located and/or embedded at least partially in the encapsulation layer 2420.

In some implementations, the interposer 2507 may be coupled to the metallization portion 104 through a plurality of solder interconnects (not shown). Thus, solder interconnects may be located between interconnects of the interposer 2507 and metallization interconnects from the metallization portion 104. In some implementations, interconnects from the interposer 2507 may be coupled to interconnects from the metallization portion 104 through hybrid bonding (e.g., metal to metal bonding).

In some implementations, one or more electrical paths to and/or from the integrated device 2303, the integrated device 2305 and/or the integrated device 103 may include interconnects from the interposer 2507. In some implementations, one or more electrical paths to and/or from the integrated device 2303, the integrated device 2305 and/or the integrated device 103 may bypass the interposer 2507.

An electrical path between the integrated device 2303 and the board 108 may include (i) a solder interconnect from the plurality of solder interconnects 2330, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 152 of the interconnection portion block 105, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 2303 and the board 108 may include (i) a solder interconnect from the plurality of solder interconnects 2330, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) metallization interconnects from the plurality of metallization interconnects 162 of the metallization portion 106, (vii) a solder interconnect from the plurality of solder interconnects 110, and (viii) a board interconnect from the plurality of board interconnects 182.

An electrical path between the integrated device 2305 and the board 108 may include (i) a solder interconnect from the plurality of solder interconnects 2350, (ii) metallization interconnects from the plurality of metallization interconnects 2442 of the metallization portion 2404, (iii) pillar interconnects from the plurality of pillar interconnects 2422 of the encapsulated portion 2402, (iv) metallization interconnects from the plurality of metallization interconnects 142 of the metallization portion 104, (v) a pillar interconnect from the plurality of pillar interconnects 122, (vi) interconnects from the plurality of interconnects 173 of the interconnection portion block 207, (vii) metallization interconnects from the plurality of metallization interconnects 162 of the metallization portion 106, (viii) a solder interconnect from the plurality of solder interconnects 110, and (ix) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) interconnects from the interposer 2507, (v) metallization interconnects from the plurality of metallization interconnects 142 of the metallization portion 104, (vi) a pillar interconnect from the plurality of pillar interconnects 122, (vii) interconnects from the plurality of interconnects 173 of the interconnection portion block 207, (viii) the passive device 270, (ix) more interconnects from the plurality of interconnects 173 of the interconnection portion block 207, (x) metallization interconnects from the plurality of metallization interconnects 162 of the metallization portion 106, (xi) a solder interconnect from the plurality of solder interconnects 110, and (xii) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) interconnects from the interposer 2507, (v) metallization interconnects from the plurality of metallization interconnects 142 of the metallization portion 104, (vi) a pillar interconnect from the plurality of pillar interconnects 122, (vii) an interconnect from the plurality of interconnects 252 of the interconnection portion block 205, (viii) metallization interconnects from the plurality of metallization interconnects 162 of the metallization portion 106, (ix) a solder interconnect from the plurality of solder interconnects 110, and (x) a board interconnect from the plurality of board interconnects 182.

An electrical path between the integrated device 103 and the board 108 may include (i) a solder interconnect from the plurality of solder interconnects 130, (ii) metallization interconnects from the plurality of metallization interconnects 2442 of the metallization portion 2404, (iii) pillar interconnects from the plurality of pillar interconnects 2422 of the encapsulated portion 2402, (iv) interconnects from the interposer 2507, (v) metallization interconnects from the plurality of metallization interconnects 142 of the metallization portion 104, (vi) a pillar interconnect from the plurality of pillar interconnects 122, (vii) interconnects from the plurality of interconnects 192 of the interconnection portion block 109, (viii) metallization interconnects from the plurality of metallization interconnects 162 of the metallization portion 106, (ix) a solder interconnect from the plurality of solder interconnects 110, and (x) a board interconnect from the plurality of board interconnects 182.

Table 3 below illustrates how different chiplets may be paired and/or configured with blocks, bridge and/or interposers of a package substrate. It is noted that Table 3 is merely an example of possible chiplets and pairing with blocks, bridge and/or interposers of a package substrate, and that other implementations may have different pairings, use different chiplets and/or use different combinations of chiplets.

TABLE 3

Chiplet Configurations and Pairing with Blocks, Bridge and/or Interposer

| CHIPLET 1 | CHIPLET 2 | BRIDGE/ INTERPOSER | BLOCK TYPE CHIPLET1 | BLOCK TYPE CHIPLET 2 | MOTIVATION |
|---|---|---|---|---|---|
| Graphical Processing Unit (GPU), Neural Processing Unit (NPU), Neural Secure Processor (NSP) | Medium or Low Power Consumption (DDR_SS, Multimedia) | Interposer and/or Bridge | Coreless substrate block, RDL block | Cored substrate block, RDL block | To share logic and memory power connections. PDN benefit. IO connections in small space with SI benefit. RDL can go 2/2 um, Bridge/interposer much less than 2/2 um |
| High Speed I/O (DDR_PHY, USB, Universal Flash Storage (UFS), PCIE, Modem Interface) | Low Speed I/O | Interposer and/or Bridge | Coreless substrate block, RDL block | Coreless substrate block, cored substrate block | HSIO SI benefit due to fine design features of interposer and bridge |

TABLE 3-continued

Chiplet Configurations and Pairing with Blocks, Bridge and/or Interposer

| CHIPLET 1 | CHIPLET 2 | BRIDGE/ INTERPOSER | BLOCK TYPE CHIPLET1 | BLOCK TYPE CHIPLET 2 | MOTIVATION |
|---|---|---|---|---|---|
| Most critical high power and High Speed I/O | I/O Hub | 2.5 D, Bridge | Coreless substrate block, RDL block | Coreless substrate block, cored substrate block | HSIO SI benefit due to fine design features of interposer and bridge IO hub connections in small space with SI benefit. |
| 2-7 nanometers technology nodes (Advanced Technology node) | 10 or greater nanometers technology nodes (Relaxed technology node) | Interposer and/or Bridge | Coreless substrate block, RDL block | Coreless substrate block, cored substrate block | To share logic and memory power connections. PDN benefit. IO connections in small space with SI benefit. |
| Active integrated device (Active System on Chip) | Active integrated device and/or passive integrated device (Passive Silicon with entangling interconnects) | Interposer and/or Bridge | Coreless substrate block, cored substrate block, RDL block | Coreless substrate block, cored substrate block, RDL block | To share logic and memory power connections. PDN benefit. |
| Top die | Bottom Die | Interposer, Bridge | RDL block, silicon block | RDL block, silicon block | To share logic and memory power connections. PDN benefit. HSIO SI benefit due to fine design features of interposer and bridge IO connections in small space with SI benefit. RDL can go 2/2 um, Bridge/interposer much less than 2/2 um. |
| Die to Die PHY + SOC | Die to Die PHY + SOC | Bridge | Coreless substrate block, RDL block, silicon block | Coreless substrate block, RDL block, silicon block | HSIO SI benefit due to fine design features of interposer and bridge IO D2D interface connections in small space with SI benefit. |

Table 3 illustrates examples of how different chiplets and/or different pairs of chiplets may be paired with different blocks, bridge and/or interposer of a package substrate and motivation as to why such pairing may be desirable and/or ideal. Table 3 illustrates how different technology nodes for integrated devices and/or chiplets may be implemented with different technology nodes for package substrates, bridges, interposers and/or blocks, to reduce costs, improve and/or optimize the performance of the package that includes integrated devices and/or chiplets.

It is noted that any of the packages described in the disclosure may combine any of the features and/or components described in the disclosure. For example, any of the packages may include one or more bridges. Any of the packages may include one or more interposers. Any of the packages may include a combination of one or more bridges and one or more interposers. The bridges and/or the interposers may be located in any of the encapsulated portions of the packages. For example, one or more bridges and/or one or more interposers may be located in a first encapsulated portion, and one or more bridges and/or one or more interposers may be located in a second encapsulated portion.

Exemplary Sequence for Fabricating a Package Comprising a Package Substrate with an Encapsulated Portion Comprising Interconnection Portion Blocks FIGS. 27A-27E illustrate an exemplary sequence for providing or fabricating a package that includes a package substrate with an encapsulated portion with several interconnection portion blocks. In some implementations, the sequence of FIGS. 27A-27E may be used to provide or fabricate the package 2400 of FIG. 24, or any of the packages described in the disclosure.

It should be noted that the sequence of FIGS. 27A-27E may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 27A-27E may be used to fabricate one package or several packages at a time (as part of a wafer).

Figure 27A:
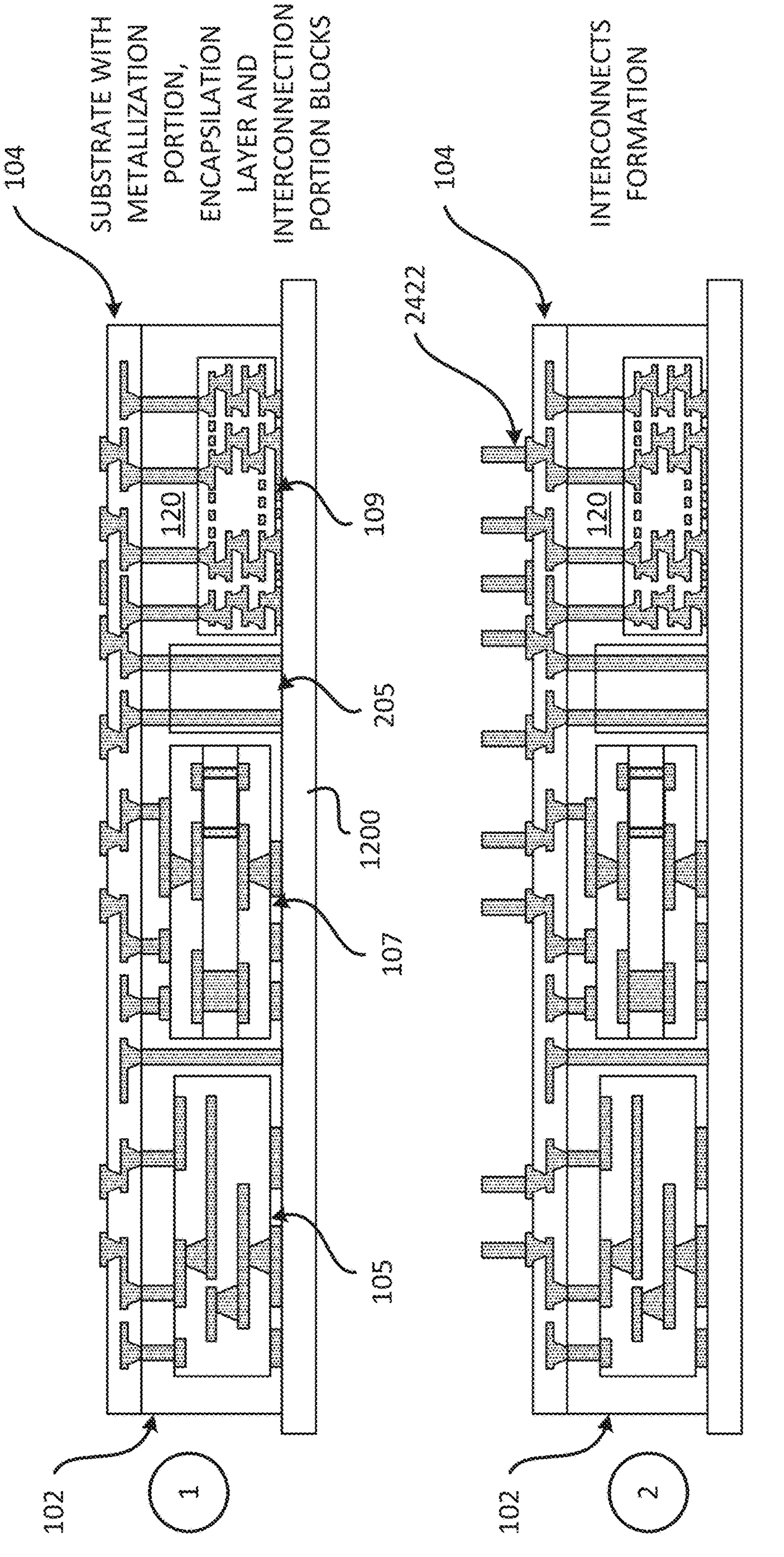
FIGS. 27A-27E illustrate an exemplary sequence for fabricating a package comprising a package substrate with an encapsulated portion with several interconnection portion blocks.

Stage 1, as shown in FIG. 27A, illustrates a state after several interconnection portion blocks (e.g., 105, 107, 109, 205) are provided, an encapsulation layer 120 is formed and a metallization portion 104 is formed. Stage 1 of FIG. 12A through Stage 6 of FIG. 12B illustrate and describe an example of a sequence for fabricating a portion of a package substrate that includes several interconnection portion blocks, an encapsulation layer and a metallization portion.

Stage 2 illustrates a state after a plurality of pillar interconnects 2422 are formed and coupled to the metallization portion 104. A plating process may be used to form the plurality of pillar interconnects 2422.

Stage 3 illustrates a state after a bridge 2307 is coupled to the metallization portion 104. A pick and place process may be used to couple the bridge 2307 to the metallization portion 104. In some implementations, an adhesive may be used to couple the bridge 2307 may be the metallization portion 104. In some implementations, instead of the bridge 2307 or in addition to the bridge 2307, an interposer 2507 may be coupled to the metallization portion 104. The bridge 2307 may include pillar interconnects similar to the plurality of pillar interconnects 2422. In some implementations, a plurality of pillar interconnects may be formed and coupled to the bridge 2307 after the placement of the bridge 2307.

Stage 4 illustrates a state after an encapsulation layer 2420 is formed over the metallization portion 104, the bridge 2307 and the plurality of pillar interconnects 2422. The encapsulation layer 2420 may at least partially encapsulate the bridge 2307 and the plurality of pillar interconnects 2422. The encapsulation layer 2420 may include a mold, a resin and/or an epoxy. The encapsulation layer 2420 may be a means for encapsulation. The encapsulation layer 2420 may be provided by using a compression and transfer molding process, a sheet molding process, or a liquid molding process.

Figure 27B:
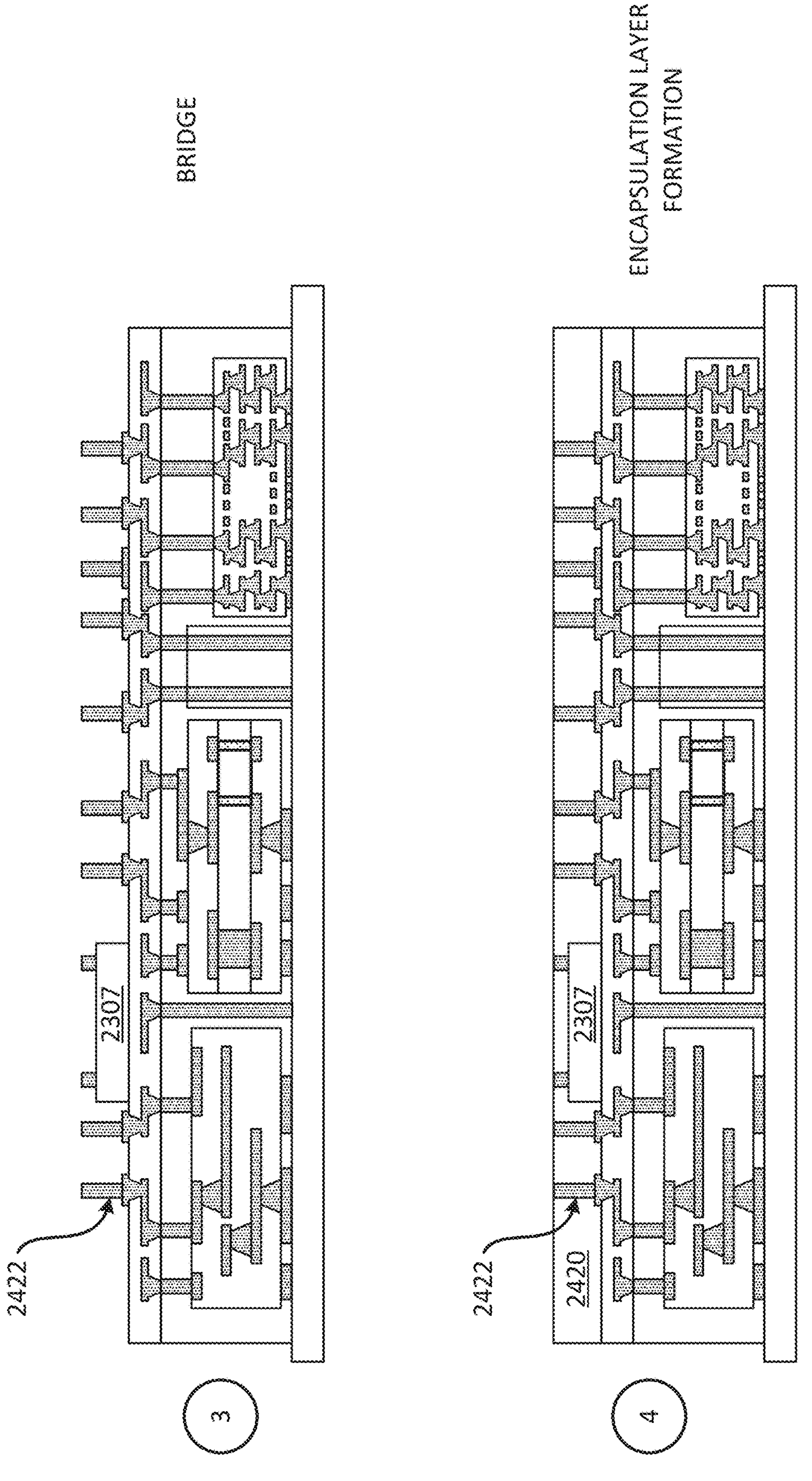
Figure 27C:
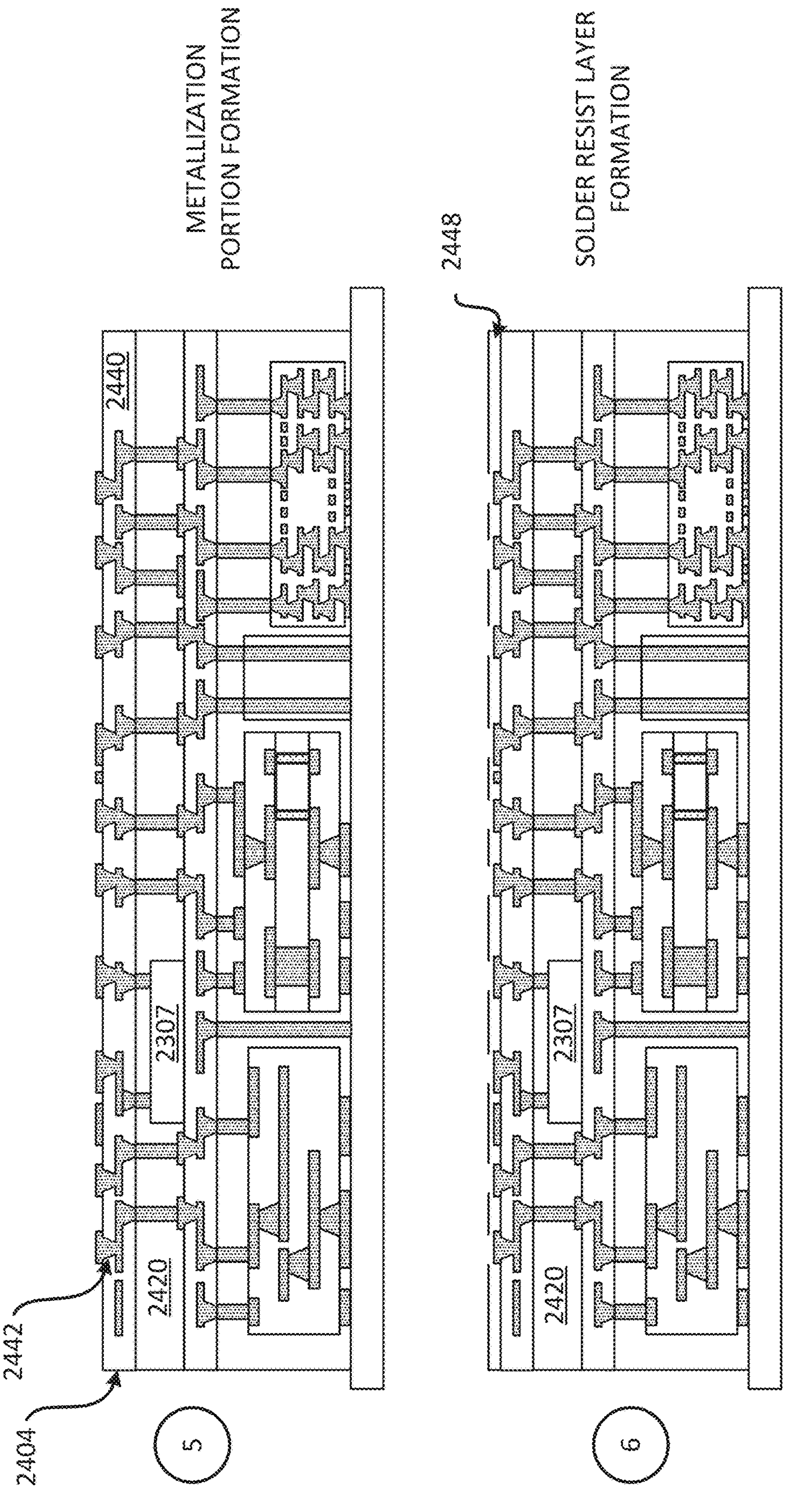

Stage 5, as shown in FIG. 27C, illustrates a state after the metallization portion 2404 is formed and coupled to the encapsulation layer 2420 and the plurality of pillar interconnects 2422. The metallization portion 2404 is coupled to the encapsulated portion 2402. The metallization portion 2404 includes at least one dielectric layer 2440 and a plurality of metallization interconnects 2442. The plurality of metallization interconnects 2442 may include a plurality of redistribution interconnects. The plurality of metallization interconnects 2442 may be coupled to the plurality of pillar interconnects 2422. In some implementations, the metallization portion 2404 may be formed using the sequence shown in at least FIGS. 18A-18B. The metallization portion 2404 may have different numbers of metal layers. For example, in some implementations, the metallization portion 2404 may have one or two metal layers. In some implementations, the metallization portion 2404 may have properties that are the same or similar as described in Table 1 for the redistribution layer.

Stage 6 illustrates a state after a solder resist layer 2448 is formed over the metallization portion 2404. A deposition and/or lamination process may be used to form the solder resist layer 2448.

Figure 27D:
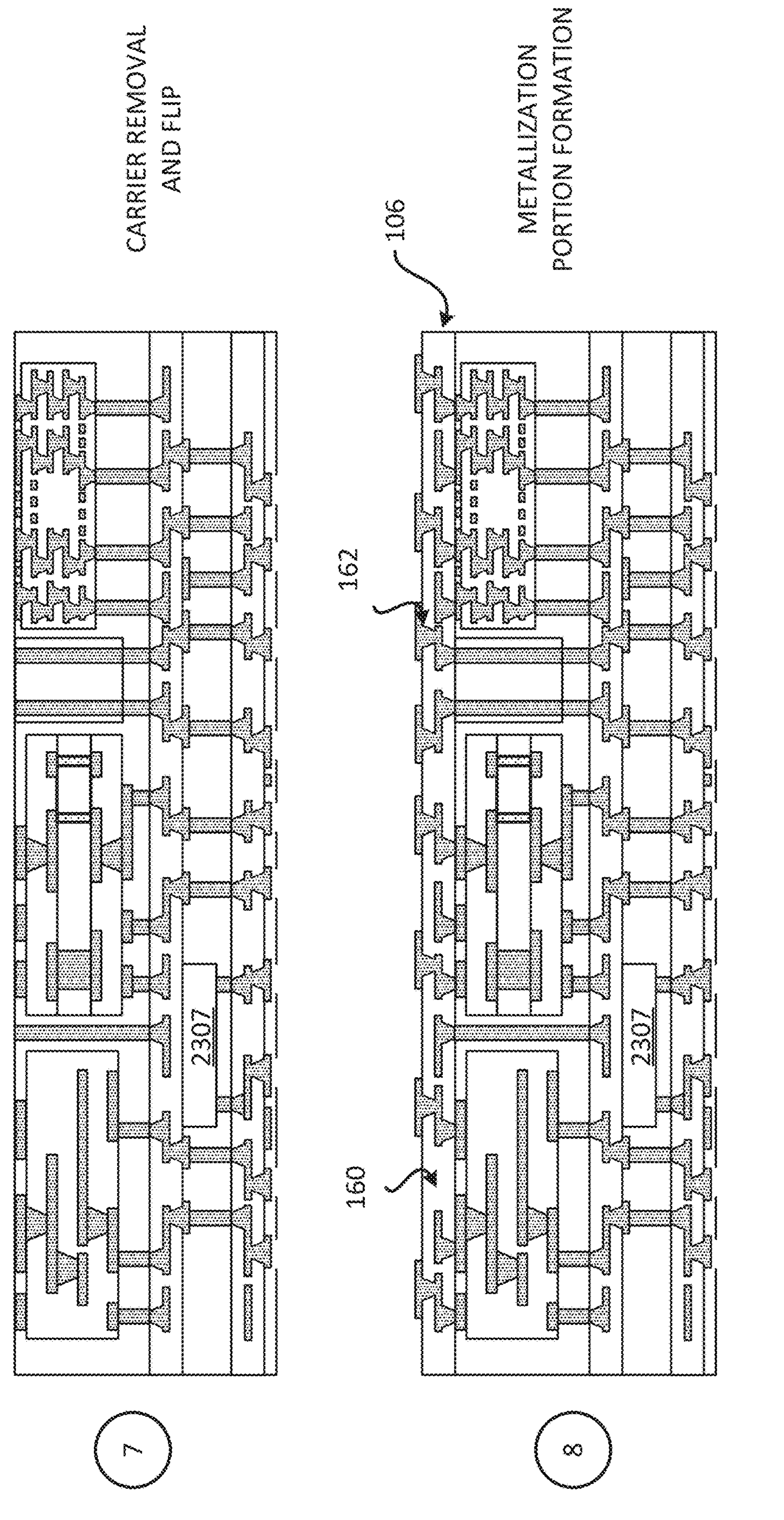

Stage 7, as shown in FIG. 27D, illustrates a state after the carrier 2700 is decoupled from the encapsulated portion 102. The carrier 2700 may be removed and/or detached from the encapsulated portion 102. In some implementations, the encapsulated portion 102, the metallization portion 104, the encapsulated portion 2402 and the metallization portion 2404 are placed on a carrier. In some implementations, an adhesive may be used to place the encapsulated portion 102, the metallization portion 104, the encapsulated portion 2402 and the metallization portion 2404 on the carrier.

Stage 8 illustrates a state after the metallization portion 106 is formed and coupled to the encapsulation layer 120, the plurality of pillar interconnects 122 and the interconnection portion blocks (e.g., 105, 107, 109). The metallization portion 106 is coupled to the encapsulated portion 102 such that the encapsulated portion 102 is located between the metallization portion 104 and the metallization portion 106. The metallization portion 106 includes at least one dielectric layer 160 and a plurality of metallization interconnects 162. The plurality of metallization interconnects 162 may include a plurality of redistribution interconnects. The plurality of metallization interconnects 162 may be coupled to the plurality of pillar interconnects 122 and interconnects from the interconnection portion blocks (e.g., 105, 107, 109). In some implementations, the metallization portion 106 may be formed using the sequence shown in at least FIGS. 18A-18B. The metallization portion 106 may have different numbers of metal layers. For example, in some implementations, the metallization portion 106 may have one or two metal layers. In some implementations, the metallization portion 106 may have properties that are the same or similar as described in Table 1 for the redistribution layer.

Figure 27E:
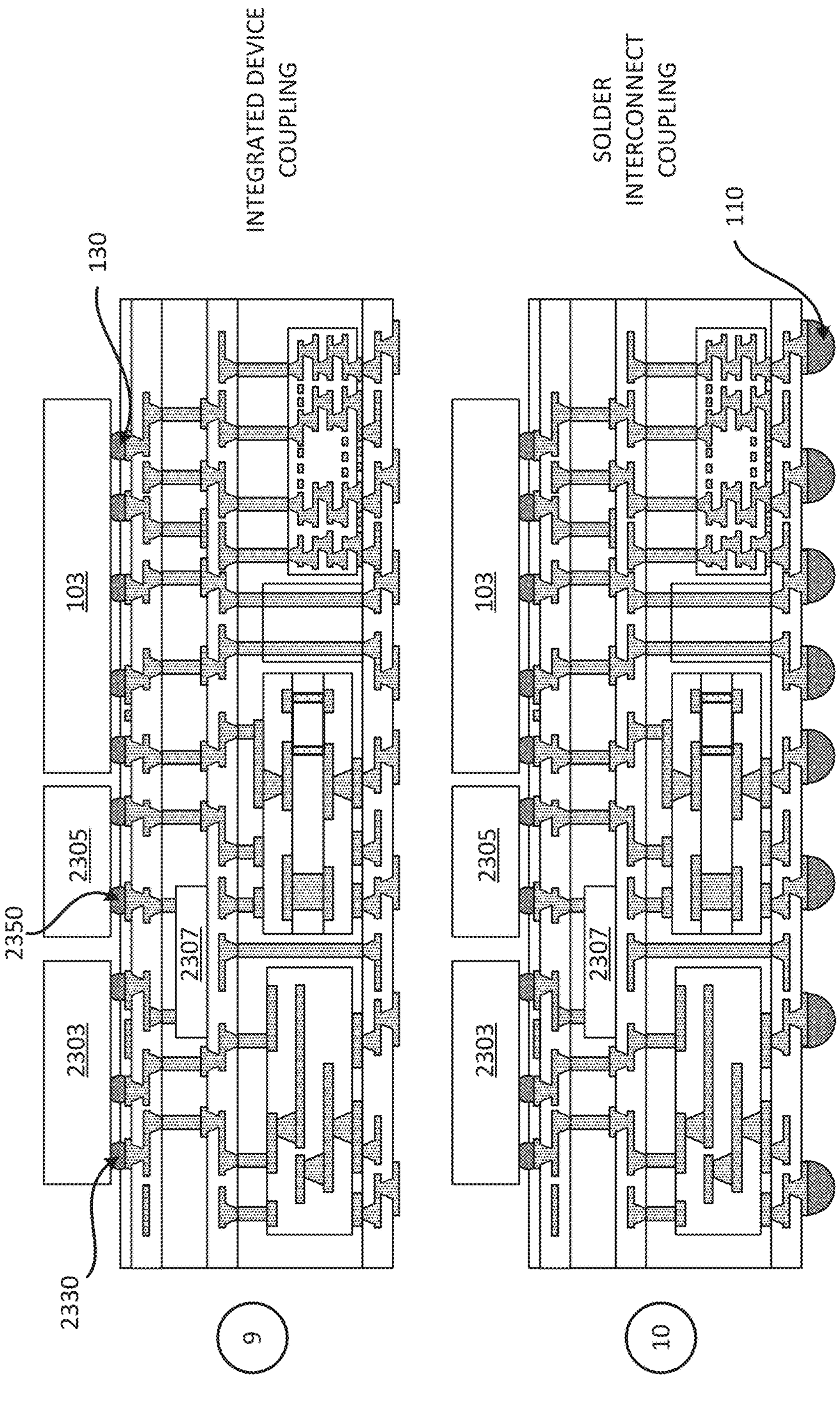

Stage 9, as shown in FIG. 27E, illustrates a state after an integrated device 103, an integrated device 2303 and an integrated device 2305 are coupled to the metallization portion 2404 through a plurality of solder interconnects (e.g., 130, 2303, 2305). A solder reflow process may be used to couple the plurality of solder interconnects to the metallization interconnects of the metallization portion 2404.

Stage 10 illustrates a state after a plurality of solder interconnects 110 are coupled to the package substrate 2401. A solder reflow process may be used to couple the plurality of solder interconnects 110 to the plurality of metallization interconnects 162 of the metallization portion 106. Stage 10 may illustrate a package 2400 that includes an integrated device 103 and a package substrate 2401 that includes an encapsulated portion 102 with several interconnection portion blocks.

Figure 28A:
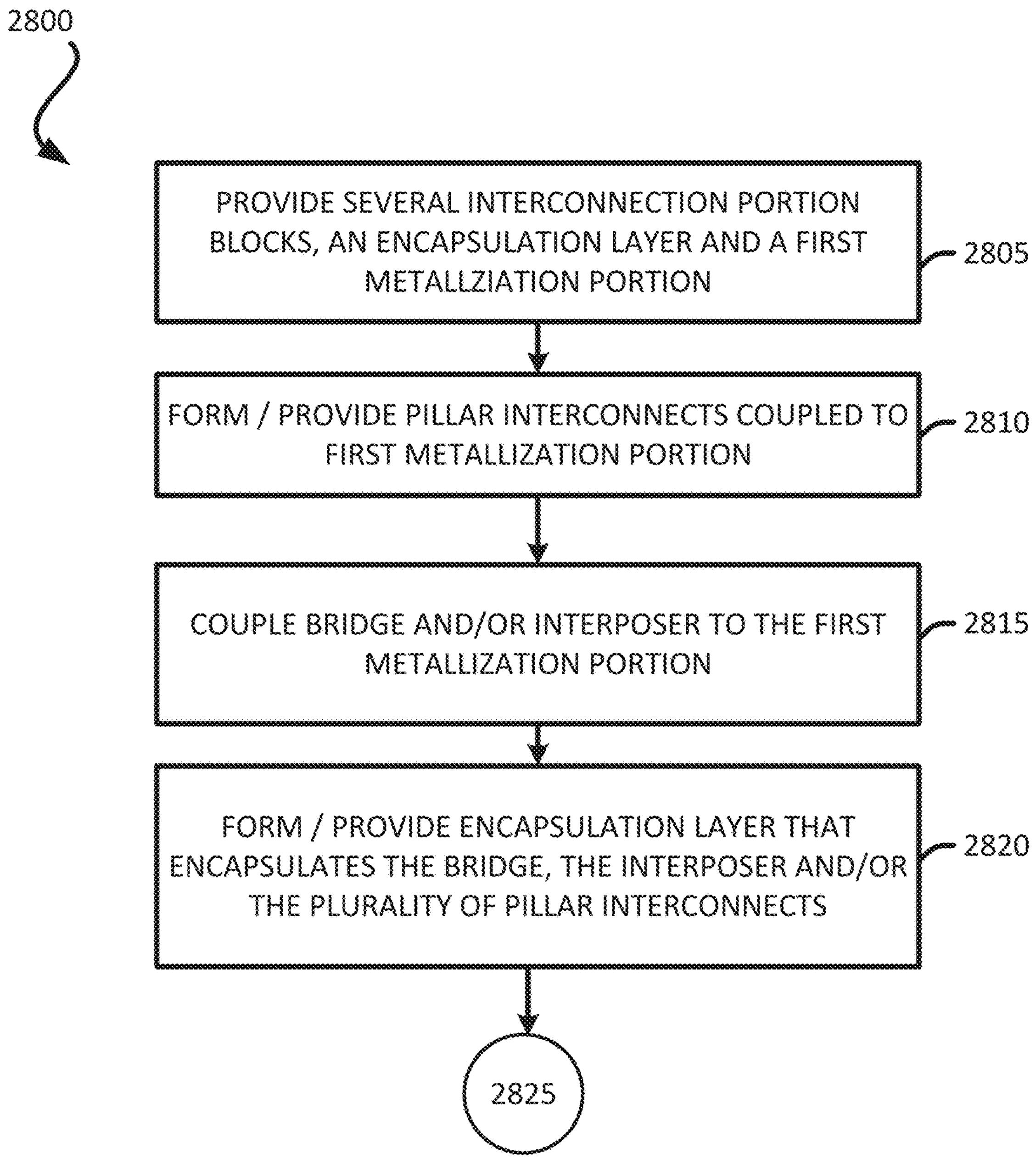
FIGS. 28A-28B illustrate an exemplary flow diagram of a method for fabricating a package comprising a package substrate with an encapsulated portion with several interconnection portion blocks.
Figure 28B:
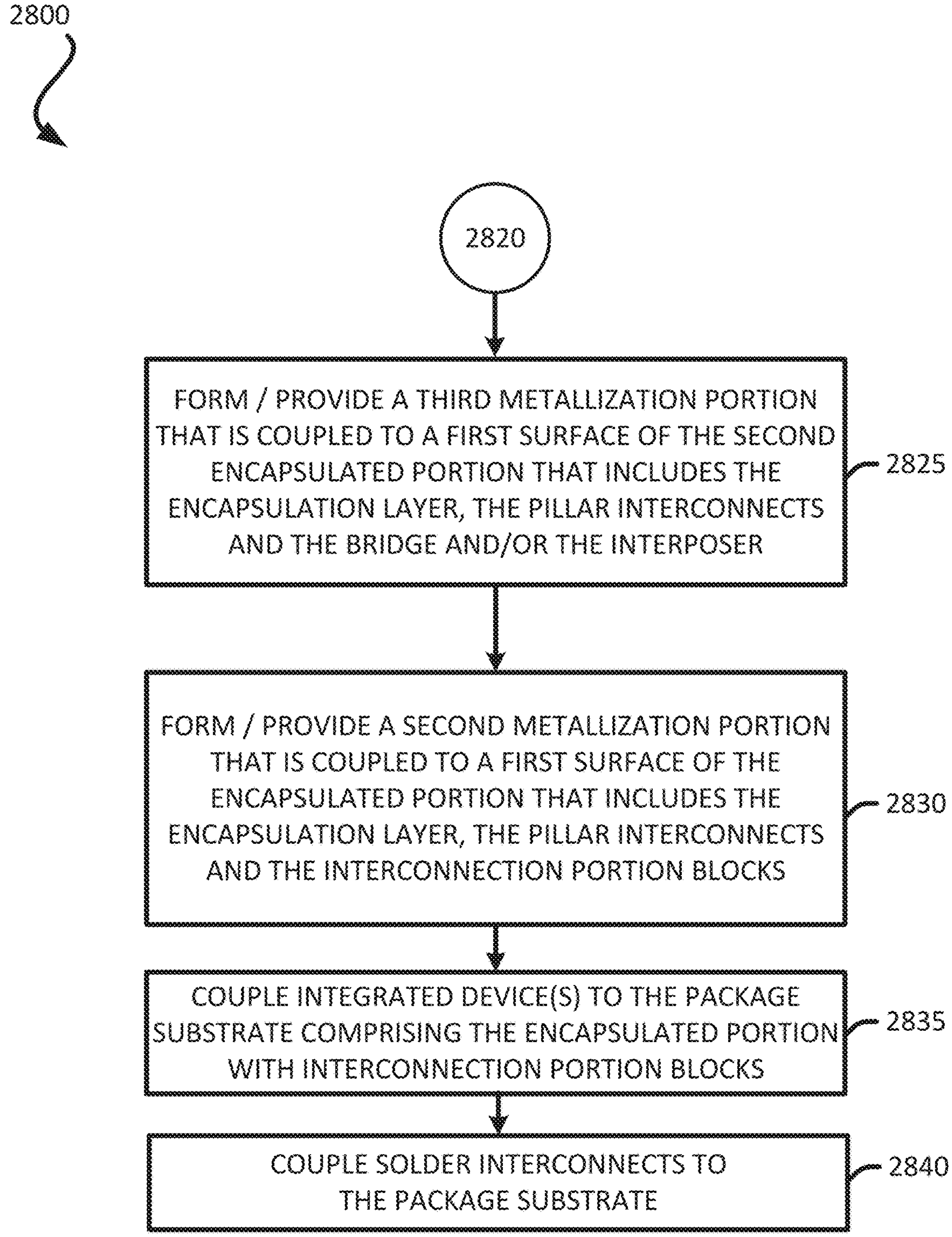

Exemplary Flow Diagram of a Method for Fabricating a Package Comprising a Package Substrate with an Encapsulated Portion Comprising Interconnection Portion Blocks In some implementations, fabricating a package includes several processes. FIGS. 28A-28B illustrate an exemplary flow diagram of a method 2800 for providing or fabricating a package. In some implementations, the method 2800 of FIGS. 28A-28B may be used to provide or fabricate any of the packages of the disclosure. For example, the method 2800 of FIGS. 28A-28B may be used to fabricate the package 2400.

It should be noted that the method 2800 of FIG. 28 may combine one or more processes in order to simplify and/or clarify the method for providing or fabricating a package. In some implementations, the order of the processes may be changed or modified. In some implementations, one or more of processes may be replaced or substituted without departing from the scope of the disclosure. The method 2800 of FIG. 28 may be used to fabricate one package or several packages at a time (as part of a wafer).

The method provides (at 2805) several interconnection portion blocks, an encapsulation layer and a metallization portion. Stage 1 of FIG. 27A, illustrates and describes an example of a state after several interconnection portion blocks (e.g., 105, 107, 109, 205) are provided, an encapsulation layer 120 is formed and a metallization portion 104 is formed. Stage 1 of FIG. 12A through Stage 6 of FIG. 12B illustrates an example of a sequence for fabricating a portion of a package substrate that includes several interconnection portion blocks, an encapsulation layer and a metallization portion.

The method forms (at 2810) a plurality of pillar interconnects 2422. Stage 2 of FIG. 27A, illustrates and describes an example of a state after a plurality of pillar interconnects 2422 are formed and coupled to the metallization portion 104. A plating process may be used to form the plurality of pillar interconnects 2422.

The method provides (at 2815) a bridge 2307 and/or an interposer 2507 that is coupled to the metallization portion 104.

Stage 3 of FIG. 27B, illustrates a state after a bridge 2307 is coupled to the metallization portion 104. A pick and place process may be used to couple the bridge 2307 to the metallization portion 104. In some implementations, an adhesive may be used to couple the bridge 2307 may be the metallization portion 104. In some implementations, instead of the bridge 2307 or in addition to the bridge 2307, an interposer 2507 may be coupled to the metallization portion 104. The bridge 2307 may include pillar interconnects similar to the plurality of pillar interconnects 2422. In some implementations, a plurality of pillar interconnects may be formed and coupled to the bridge 2307 after the placement of the bridge 2307.

The method forms (at 2820) an encapsulation layer 2420. Stage 4 of FIG. 27B, illustrates and describes an example of a state after an encapsulation layer 2420 is formed over the metallization portion 104, the bridge 2307 and the plurality of pillar interconnects 2422. The encapsulation layer 2420 may at least partially encapsulate the bridge 2307 and the plurality of pillar interconnects 2422. The encapsulation layer 2420 may include a mold, a resin and/or an epoxy. The encapsulation layer 2420 may be a means for encapsulation. The encapsulation layer 2420 may be provided by using a compression and transfer molding process, a sheet molding process, or a liquid molding process.

The method forms (at 2825) a metallization portion 2404. Stage 5 of FIG. 27C, illustrates and describes an example of a state after the metallization portion 2404 is formed and coupled to the encapsulation layer 2420 and the plurality of pillar interconnects 2422. The metallization portion 2404 is coupled to the encapsulated portion 2402. The metallization portion 2404 includes at least one dielectric layer 2440 and a plurality of metallization interconnects 2442. The plurality of metallization interconnects 2442 may include a plurality of redistribution interconnects. The plurality of metallization interconnects 2442 may be coupled to the plurality of pillar interconnects 2422. In some implementations, the metallization portion 2404 may be formed using the sequence shown in at least FIGS. 18A-18B. The metallization portion 2404 may have different numbers of metal layers. For example, in some implementations, the metallization portion 2404 may have one or two metal layers. In some implementations, the metallization portion 2404 may have properties that are the same or similar as described in Table 1 for the redistribution layer.

The method forms (at 2830) a solder resist layer. Stage 6 of FIG. 27C, illustrates and describes an example of a state after a solder resist layer 2448 is formed over the metallization portion 2404. A deposition and/or lamination process may be used to form the solder resist layer 2448.

The method removes (at 2825) a carrier. Stage 7 of FIG. 27D, illustrates and describes an example of a state after the carrier 2700 is decoupled from the encapsulated portion 102. The carrier 2700 may be removed and/or detached from the encapsulated portion 102. In some implementations, the encapsulated portion 102, the metallization portion 104, the encapsulated portion 2402 and the metallization portion 2404 are placed on a carrier. In some implementations, an adhesive may be used to place the encapsulated portion 102, the metallization portion 104, the encapsulated portion 2402 and the metallization portion 2404 on the carrier.

The method forms (at 2830) a metallization portion 106. Stage 8 of FIG. 27D, illustrates and describes an example of a state after the metallization portion 106 is formed and coupled to the encapsulation layer 120, the plurality of pillar interconnects 122 and the interconnection portion blocks (e.g., 105, 107, 109). The metallization portion 106 is coupled to the encapsulated portion 102 such that the encapsulated portion 102 is located between the metallization portion 104 and the metallization portion 106. The metallization portion 106 includes at least one dielectric layer 160 and a plurality of metallization interconnects 162. The plurality of metallization interconnects 162 may include a plurality of redistribution interconnects. The plurality of metallization interconnects 162 may be coupled to the plurality of pillar interconnects 122 and interconnects from the interconnection portion blocks (e.g., 105, 107, 109). In some implementations, the metallization portion 106 may be formed using the sequence shown in at least FIGS. 18A-18B. The metallization portion 106 may have different numbers of metal layers. For example, in some implementations, the metallization portion 106 may have one or two metal layers. In some implementations, the metallization portion 106 may have properties that are the same or similar as described in Table 1 for the redistribution layer.

The method couples (at 2835) integrated devices to the package substrate. Stage 9 of FIG. 27E, illustrates and describes an example of a state after an integrated device 103, an integrated device 2303 and an integrated device 2305 are coupled to the metallization portion 2404 through a plurality of solder interconnects (e.g., 130, 2303, 2305). A solder reflow process may be used to couple the plurality of solder interconnects to the metallization interconnects of the metallization portion 2404.

The method couples (at 2840) a plurality of solder interconnects to the package substrate 2401. Stage 10 of FIG. 27E, illustrates and describes an example of a state after a plurality of solder interconnects 110 are coupled to the package substrate 2401. A solder reflow process may be used to couple the plurality of solder interconnects 110 to the plurality of metallization interconnects 162 of the metallization portion 106. Stage 10 may illustrate a package 2400 that includes an integrated device 103 and a package substrate 2401 that includes an encapsulated portion 102 with several interconnection portion blocks.

Exemplary Electronic Devices

Figure 29:
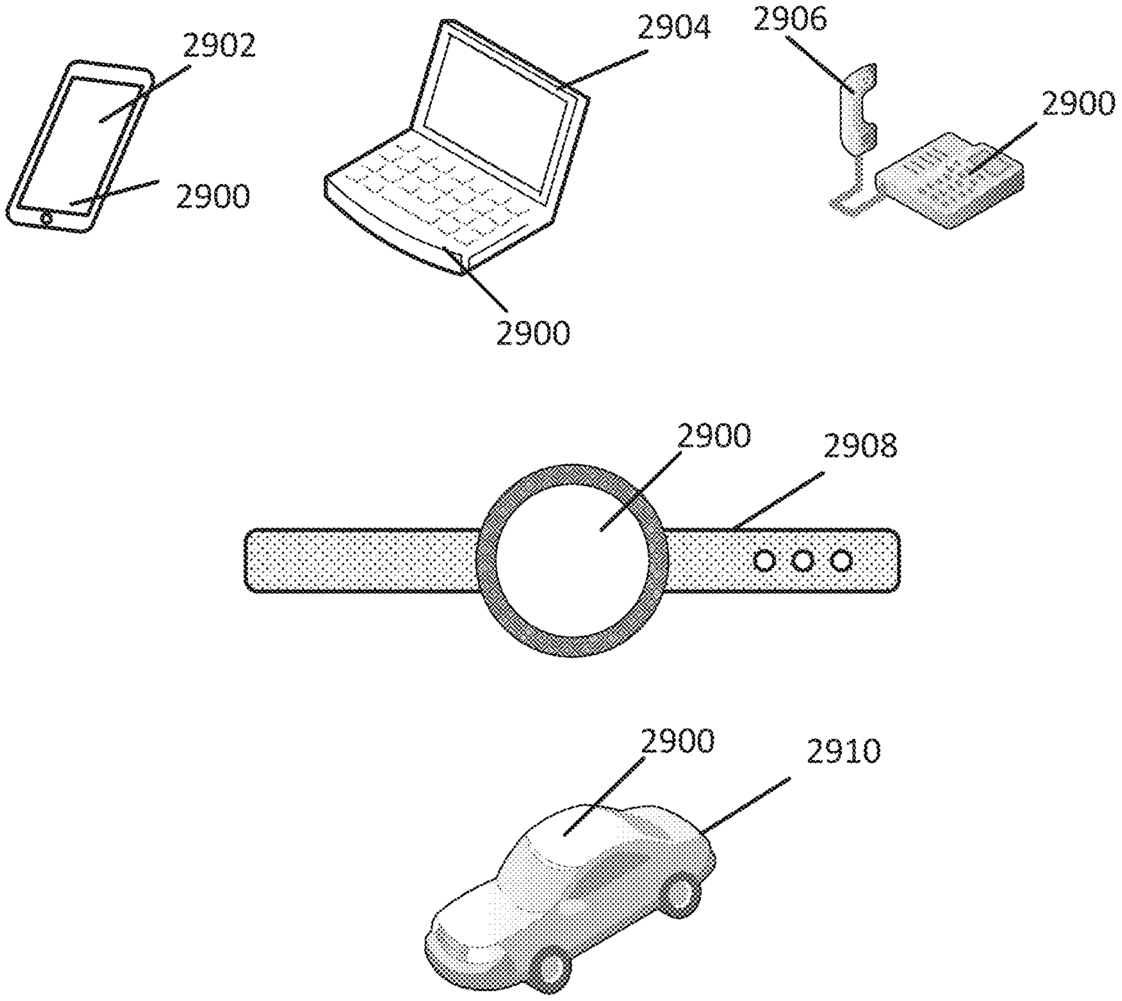
FIG. 29 illustrates various electronic devices that may integrate a die, an electronic circuit, an integrated device, an integrated passive device (IPD), a passive component, a package, and/or a device package described herein.

FIG. 29 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2902, a laptop computer device 2904, a fixed location terminal device 2906, a wearable device 2908, or automotive vehicle 2910 may include a device 2900 as described herein. The device 2900 may be, for example, any of the devices and/or integrated circuit (IC) packages described herein. The devices 2902, 2904, 2906 and 2908 and the vehicle 2910 illustrated in FIG. 29 are merely exemplary. Other electronic devices may also feature the device 2900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-11, 12A-12F, 13, 14A-14C, 15, 16A-16B, 17, 18A-18B, 19-26, 27A-27E, 28A-28B and/or 29 may be rearranged and/or combined into a single component, process, feature or function or embodied in several components, processes, or functions. Additional elements, components, processes, and/or functions may also be added without departing from the disclosure. It should also be noted FIGS. 1-11, 12A-12F, 13, 14A-14C, 15, 16A-16B, 17, 18A-18B, 19-26, 27A-27E, 28A-28B and/or 29 and its corresponding description in the present disclosure is not limited to dies and/or ICs. In some implementations, FIGS. 1-11, 12A-12F, 13, 14A-14C, 15, 16A-16B, 17, 18A-18B, 19-26, 27A-27E, 28A-28B and/or 29 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit.

Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a package substrate and a first integrated device coupled to the package substrate through a first plurality of solder interconnects. The package substrate comprises (i) an encapsulated portion comprising: a first interconnection portion block; a second interconnection portion block, wherein the second interconnection portion block is a different type of interconnection portion block from the first interconnection portion block; a plurality of pillar interconnects, wherein the plurality of pillar interconnects comprises: a first plurality of pillar interconnects coupled to the first interconnection portion block; and a second plurality of pillar interconnects coupled to the second interconnection portion block; and an encapsulation layer encapsulating the first interconnection portion block, the second interconnection portion block, and the plurality of pillar interconnects; (ii) a first metallization portion coupled to a first surface of the encapsulated portion; (iii) a second metallization portion coupled to a second surface of the encapsulated portion; and (iv) a bridge and/or an interposer.

Aspect 2: The package of aspect 1, wherein the first interconnection portion block includes a coreless substrate block, a cored substrate block, an embedded passive substrate block, a metallization portion block or a die block comprising through substrate vias.

Aspect 3: The package of aspects 1 through 2, wherein the second interconnection portion block includes a coreless substrate block, a cored substrate block, an embedded passive substrate block, a metallization portion block or a die block comprising through substrate vias.

Aspect 4: The package of aspects 1 through 3, wherein the bridge and/or the interposer are located in the encapsulated portion.

Aspect 5: The package of aspects 1 through 4, wherein the first integrated device is coupled to the first metallization portion of the package substrate through the first plurality of solder interconnects.

Aspect 6: The package of aspect 5, wherein the first integrated device includes a first core and a second core, wherein a first electrical path for a first signal to the first core of the first integrated device comprises the first interconnection portion block, and wherein a second electrical path for a second signal to the second core of the first integrated device comprises the second interconnection portion block.

Aspect 7: The package of aspects 5 through 6, further comprising a second integrated device coupled to the first metallization portion of the package substrate through a second plurality of solder interconnects.

Aspect 8: The package of aspect 7, wherein a first electrical path for a first signal to the first integrated device comprises the first interconnection portion block, and wherein a second electrical path for a second signal to the second integrated device comprises the second interconnection portion block.

Aspect 9: The package of aspect 7, wherein a first electrical path for a first signal between the second metallization portion and the first integrated device comprises interconnects from the first interconnection portion block, an interconnect from the interposer, a pillar interconnect from the first plurality of pillar interconnects, metallization interconnects from the first metallization portion, and a first solder interconnect from the first plurality of solder interconnects, and wherein a second electrical path for a second electrical signal between the second metallization portion and the second integrated device comprises interconnects from the second interconnection portion block, another interconnect from the interposer, a pillar interconnect from the second plurality of pillar interconnects, other metallization interconnects from the first metallization portion, and a second solder interconnect from the second plurality of solder interconnects.

Aspect 10: The package of aspects 1 through 9, further comprising a third interconnection portion block located in the encapsulated portion, wherein the plurality of pillar interconnects comprises a third plurality of pillar interconnects coupled to the third interconnection portion block.

Aspect 11: The package of aspect 10, wherein the first interconnection portion block includes a coreless substrate block, wherein the second interconnection portion block includes a cored substrate block, and wherein the third interconnection portion block includes a metallization portion block.

Aspect 12: The package of aspects 10 through 11, wherein a first electrical path for a first electrical signal between the second metallization portion and the first integrated device comprises interconnects from the first interconnection portion block, an interconnect from the interposer, a pillar interconnect from the first plurality of pillar interconnects, first metallization interconnects from the first metallization portion, and a first solder interconnect from the first plurality of solder interconnects, wherein a second electrical path for a second electrical signal between the second metallization portion and the first integrated device comprises interconnects from the second interconnection portion block, another interconnect from the interposer, a pillar interconnect from the second plurality of pillar interconnects, second metallization interconnects from the first metallization portion, and a second solder interconnect from the first plurality of solder interconnects, and wherein a third electrical path for a third electrical signal between the second metallization portion and the first integrated device comprises interconnects from the third interconnection portion block, another interconnect from the interposer, a pillar interconnect from the third plurality of pillar interconnects, third metallization interconnects from the first metallization portion, and a third solder interconnect from the first plurality of solder interconnects.

Aspect 13: The package of aspects 10 through 12, wherein interconnects from the metallization portion block are thinner than (i) interconnects from the coreless substrate block, and (ii) interconnects from the cored substrate block.

Aspect 14: The package of aspects 1 through 7 and 10 through 11, wherein a first electrical path for a first electrical signal between the second metallization portion and the first integrated device comprises interconnects from the first interconnection portion block, an interconnect from the interposer, a pillar interconnect from the first plurality of pillar interconnects, metallization interconnects from the first metallization portion, and a first solder interconnect from the first plurality of solder interconnects, and wherein a second electrical path for a second electrical signal between the second metallization portion and the first integrated device comprises interconnects from the second interconnection portion block, another interconnect from the interposer, a pillar interconnect from the second plurality of pillar interconnects, other metallization interconnects from the first metallization portion, and a second solder interconnect from the first plurality of solder interconnects.

Aspect 15: The package of aspects 1 through 7 and 10 through 11, wherein a first electrical path for a first electrical signal between the second metallization portion and the first integrated device comprises interconnects from the first interconnection portion block, an interconnect from the interposer, a pillar interconnect from the first plurality of pillar interconnects, metallization interconnects from the first metallization portion, and a first solder interconnect from the first plurality of solder interconnects, and wherein a second electrical path for power between the second metallization portion and the first integrated device comprises interconnects from the second interconnection portion block, another interconnect from the interposer, a pillar interconnect from the second plurality of pillar interconnects, other metallization interconnects from the first metallization portion, and a second solder interconnect from the first plurality of solder interconnects.

Aspect 16: The package of aspects 1 through 15, further comprising a second integrated device coupled to the package through a second plurality of solder interconnects.

Aspect 17: The package of aspect 16, wherein the first integrated device is a first chiplet comprising a first technology node, and wherein the second integrated device is a second chiplet comprising a second technology node.

Aspect 18: The package of aspects 1 through 17, wherein the bridge includes a silicon bridge and bridge interconnects.

Aspect 19: The package of aspects 1 through 18, further comprising: a second encapsulated portion coupled to the first metallization portion; and a third metallization portion coupled to the second encapsulated portion.

Aspect 20: The package of aspect 19, wherein the bridge and/or the interposer is located at least partially in the second encapsulated portion.

Aspect 21: The package of aspects 19 through 20, further comprising a second integrated device coupled to the package substrate through a second plurality of solder interconnects.

Aspect 22: The package of aspect 21, wherein an electrical path between the first integrated device and the second integrated device includes the bridge.

Aspect 23: The package of aspect 21, wherein a first electrical path between the first integrated device and the second metallization portion includes the interposer and the first interconnection portion block, and wherein a second electrical path between the second integrated device and the second metallization portion includes the interposer and the second interconnection portion block.

Aspect 24: The package of aspects 19 through 23, wherein the bridge and/or the interposer touches the third metallization portion.

Aspect 25: The package of aspects 1 through 24, wherein the package is implemented in a device is that is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:

a package substrate comprising:

(A) an encapsulated portion comprising:

a first interconnection portion block comprising:

one or more first dielectric layers; and a first plurality of interconnects;

a second interconnection portion block comprising:

one or more second dielectric layers; and a second plurality of interconnects, wherein the second interconnection portion block is a different type of interconnection portion block from the first interconnection portion block;

a plurality of pillar interconnects, wherein the plurality of pillar interconnects comprises:

a first plurality of pillar interconnects coupled to the first interconnection portion block; and a second plurality of pillar interconnects coupled to the second interconnection portion block;

a bridge; and an encapsulation layer at least partially encapsulating the bridge, the first interconnection portion block, the second interconnection portion block, and the plurality of pillar interconnects, wherein the encapsulation layer is a separate material from (i) the one or more first dielectric layers and (ii) the one or more second dielectric layers, and wherein the encapsulation layer touches (i) the one or more first dielectric layers and (ii) the one or more second dielectric layers;

(B) a first metallization portion coupled to a first surface of the encapsulated portion, wherein the first metallization portion is further coupled to and touching (i) the first plurality of pillar interconnects and (ii) the second plurality of pillar interconnects, and wherein the bridge is located vertically between the first metallization portion and the first interconnection portion block;

(C) a second metallization portion coupled to a second surface of the encapsulated portion, wherein the second metallization portion is further coupled to and touching (i) the first plurality of interconnects of the first interconnection portion block and (ii) the second plurality of interconnects of the second interconnection portion block; and a first integrated device coupled to the package substrate through a first plurality of solder interconnects, and a second integrated device coupled to the package substrate through a second plurality of solder interconnects.

2. The package of claim 1, wherein the first interconnection portion block includes a coreless substrate block, a cored substrate block, an embedded passive substrate block, a metallization portion block or a die block comprising through substrate vias.

3. The package of claim 1, wherein the second interconnection portion block includes a coreless substrate block, a cored substrate block, an embedded passive substrate block, a metallization portion block or a die block comprising through substrate vias.

4. The package of claim 1, wherein a first electrical path for a first electrical signal between the second metallization portion and the first integrated device comprises interconnects from the first interconnection portion block, a pillar interconnect from the first plurality of pillar interconnects, metallization interconnects from the first metallization portion, and a first solder interconnect from the first plurality of solder interconnects, and wherein a second electrical path for a second electrical signal between the second metallization portion and the first integrated device comprises interconnects from the second interconnection portion block, a pillar interconnect from the second plurality of pillar interconnects, other metallization interconnects from the first metallization portion, and a second solder interconnect from the first plurality of solder interconnects.

5. The package of claim 1, wherein a first electrical path for a first electrical signal between the second metallization portion and the first integrated device comprises interconnects from the first interconnection portion block, a pillar interconnect from the first plurality of pillar interconnects, metallization interconnects from the first metallization portion, and a first solder interconnect from the first plurality of solder interconnects, and wherein a second electrical path for power between the second metallization portion and the first integrated device comprises interconnects from the second interconnection portion block, a pillar interconnect from the second plurality of pillar interconnects, other metallization interconnects from the first metallization portion, and a second solder interconnect from the first plurality of solder interconnects.

6. The package of claim 1, wherein the bridge is further located vertically between the first metallization portion and the second interconnection portion block.

7. The package of claim 1, wherein the first integrated device is a first chiplet comprising a first technology node, and wherein the second integrated device is a second chiplet comprising a second technology node.

8. The package of claim 1, wherein the bridge includes a silicon bridge substrate and a plurality of bridge interconnects.

9. The package of claim 1, wherein the package is implemented in a device that is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

10. A package comprising:

a package substrate comprising:

(A) an encapsulated portion comprising:

a first interconnection portion block comprising:

one or more first dielectric layers; and a first plurality of interconnects;

a second interconnection portion block comprising:

one or more second dielectric layers; and a second plurality of interconnects, wherein the second interconnection portion block is a different type of interconnection portion block from the first interconnection portion block;

an interposer;

a plurality of pillar interconnects, wherein the plurality of pillar interconnects comprises:

a first plurality of pillar interconnects coupled to the interposer; and a second plurality of pillar interconnects coupled to at least the interposer and/or the second interconnection portion block; and an encapsulation layer at least partially encapsulating the interposer, the first interconnection portion block, the second interconnection portion block, and the plurality of pillar interconnects, wherein the encapsulation layer is a separate material from (i) the one or more first dielectric layers and (ii) the one or more second dielectric layers, and wherein the encapsulation layer touches (i) the one or more first dielectric layers and (ii) the one or more second dielectric layers;

(B) a first metallization portion coupled to a first surface of the encapsulated portion, wherein the first metallization portion is further coupled to and touching (i) the first plurality of pillar interconnects and (ii) the second plurality of pillar interconnects, and wherein the interposer is located vertically between the first metallization portion and the first interconnection portion block;

(C) a second metallization portion coupled to a second surface of the encapsulated portion, wherein the second metallization portion is further coupled to and touching (i) the first plurality of interconnects of the first interconnection portion block and (ii) the second plurality of interconnects from the second interconnection portion block; and a first integrated device coupled to the package substrate through a first plurality of solder interconnects.

11. The package of claim 10, wherein the first integrated device is coupled to the first metallization portion of the package substrate through the first plurality of solder interconnects.

12. The package of claim 11, wherein the first integrated device includes a first core and a second core, wherein a first electrical path for a first signal to the first core of the first integrated device comprises the first interconnection portion block, and wherein a second electrical path for a second signal to the second core of the first integrated device comprises the second interconnection portion block.

13. The package of claim 11, further comprising a second integrated device coupled to the first metallization portion of the package substrate through a second plurality of solder interconnects.

14. The package of claim 13, wherein a first electrical path for a first signal to the first integrated device comprises the first interconnection portion block, and wherein a second electrical path for a second signal to the second integrated device comprises the second interconnection portion block.

15. The package of claim 13, wherein a first electrical path for a first electrical signal between the second metallization portion and the first integrated device comprises interconnects from the first interconnection portion block, an interconnect from the interposer, a pillar interconnect from the first plurality of pillar interconnects, metallization interconnects from the first metallization portion, and a first solder interconnect from the first plurality of solder interconnects, and wherein a second electrical path for a second electrical signal between the second metallization portion and the second integrated device comprises interconnects from the second interconnection portion block, another interconnect from the interposer, a pillar interconnect from the second plurality of pillar interconnects, other metallization interconnects from the first metallization portion, and a second solder interconnect from the second plurality of solder interconnects.

16. The package of claim 10, further comprising a third interconnection portion block located in the encapsulated portion, wherein the plurality of pillar interconnects comprises a third plurality of pillar interconnects coupled to the third interconnection portion block.

17. The package of claim 16, wherein the first interconnection portion block includes a coreless substrate block, wherein the second interconnection portion block includes a cored substrate block, and wherein the third interconnection portion block includes a metallization portion block.

18. The package of claim 17, wherein interconnects from the metallization portion block are thinner than (i) interconnects from the coreless substrate block, and (ii) interconnects from the cored substrate block.

19. The package of claim 16, wherein a first electrical path for a first electrical signal between the second metallization portion and the first integrated device comprises interconnects from the first interconnection portion block, an interconnect from the interposer, a pillar interconnect from the first plurality of pillar interconnects, first metallization interconnects from the first metallization portion, and a first solder interconnect from the first plurality of solder interconnects, wherein a second electrical path for a second electrical signal between the second metallization portion and the first integrated device comprises interconnects from the second interconnection portion block, another interconnect from the interposer, a pillar interconnect from the second plurality of pillar interconnects, second metallization interconnects from the first metallization portion, and a second solder interconnect from the first plurality of solder interconnects, and wherein a third electrical path for a third electrical signal between the second metallization portion and the first integrated device comprises interconnects from the third interconnection portion block, another interconnect from the interposer, a pillar interconnect from the third plurality of pillar interconnects, third metallization interconnects from the first metallization portion, and a third solder interconnect from the first plurality of solder interconnects.

20. A package comprising:

a package substrate comprising:

(A) an encapsulated portion comprising:

a first interconnection portion block comprising:

one or more first dielectric layers; and a first plurality of interconnects;

a second interconnection portion block comprising:

one or more second dielectric layers; and a second plurality of interconnects, wherein the second interconnection portion block is a different type of interconnection portion block from the first interconnection portion block;

a plurality of pillar interconnects, wherein the plurality of pillar interconnects comprises:

a first plurality of pillar interconnects coupled to and touching the first interconnection portion block; and a second plurality of pillar interconnects coupled to and touching the second interconnection portion block; and an encapsulation layer at least partially encapsulating the first interconnection portion block, the second interconnection portion block, and the plurality of pillar interconnects, wherein the encapsulation layer is a separate material from (i) the one or more first dielectric layers and (ii) the one or more second dielectric layers, and wherein the encapsulation layer touches (i) the one or more first dielectric layers and (ii) the one or more second dielectric layers;

(B) a first metallization portion coupled to a first surface of the encapsulated portion, wherein the first metallization portion is further coupled to and touching (i) the first plurality of pillar interconnects and (ii) the second plurality of pillar interconnects;

(C) a second metallization portion coupled to a second surface of the encapsulated portion, wherein the second metallization portion is further coupled to and touching (i) the first plurality of interconnects of the first interconnection portion block and (ii) the second plurality of interconnects of the second interconnection portion block; and (D) a second encapsulated portion coupled to the first metallization portion, wherein the second encapsulated portion comprises:

a bridge and/or an interposer; and another encapsulation layer; and (E) a third metallization portion coupled to the second encapsulated portion; and a first integrated device coupled to the package substrate through a first plurality of solder interconnects.

21. The package of claim 20, wherein at least one of the bridge and/or the interposer is located between the first metallization portion and the third metallization portion.

22. The package of claim 20, further comprising a second integrated device coupled to the package substrate through a second plurality of solder interconnects.

23. The package of claim 22, wherein an electrical path between the first integrated device and the second integrated device includes the bridge.

24. The package of claim 22, wherein a first electrical path between the first integrated device and the second metallization portion includes the interposer and the first interconnection portion block, and wherein a second electrical path between the second integrated device and the second metallization portion includes the interposer and the second interconnection portion block.

25. The package of claim 20, wherein the bridge and/or the interposer touches the third metallization portion.

* * * * *